(12) United States Patent
Kim et al.

(10) Patent No.: US 11,063,220 B2
(45) Date of Patent: Jul. 13, 2021

(54) ORGANIC LIGHT-EMITTING DEVICE

(71) Applicant: SAMSUNG DISPLAY CO., LTD., Yongin-si (KR)

(72) Inventors: Seul-Ong Kim, Yongin-si (KR); Dong-Woo Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 62 days.

(21) Appl. No.: 16/113,999

(22) Filed: Aug. 27, 2018

(65) Prior Publication Data
US 2018/0366651 A1 Dec. 20, 2018

Related U.S. Application Data

(62) Division of application No. 14/150,734, filed on Jan. 8, 2014, now Pat. No. 10,062,848.

(30) Foreign Application Priority Data

Jun. 18, 2013 (KR) .................. 10-2013-0069953

(51) Int. Cl.
*H01L 51/00* (2006.01)
*C09B 57/00* (2006.01)
(Continued)

(52) U.S. Cl.
CPC ............ *H01L 51/0052* (2013.01); *C09B 1/00* (2013.01); *C09B 57/00* (2013.01); *C09B 57/001* (2013.01);
(Continued)

(58) Field of Classification Search
CPC ............ H01L 51/0051; H01L 51/0052; H01L 51/0054
See application file for complete search history.

(56) References Cited

U.S. PATENT DOCUMENTS

| 5,792,567 | A | | 8/1998 | Kido et al. |
| 5,834,130 | A | * | 11/1998 | Kido .................... C09K 11/06 428/690 |
| 7,732,598 | B2 | | 6/2010 | Shin et al. |
| 7,989,644 | B2 | | 8/2011 | Tanabe et al. |
| 8,431,251 | B2 | * | 4/2013 | Lim .................... C07D 403/12 428/690 |

(Continued)

FOREIGN PATENT DOCUMENTS

| KR | 10-0254592 B1 | 5/2000 |
| KR | 10-2006-0115372 | 11/2006 |

(Continued)

*Primary Examiner* — Austin Murata
(74) *Attorney, Agent, or Firm* — Lewis Roca Rothgerber Christie LLP

(57) ABSTRACT

An organic light-emitting device includes an emission layer and an electron transport layer. The emission layer includes at least one compound represented one of Formula 1, Formula 2 and/or Formula 3. The electron transport layer includes at least one compound represented by Formula 4 and/or Formula 5. An organic light-emitting device including the emission layer and the electron transport layer has high emission efficiency and an improved lifetime.

Formula 1

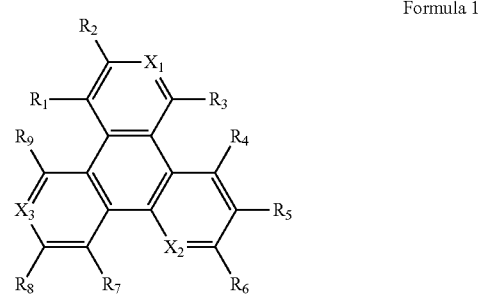

Formula 2

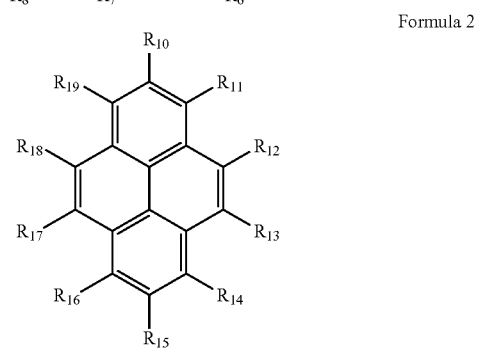

Formula 3

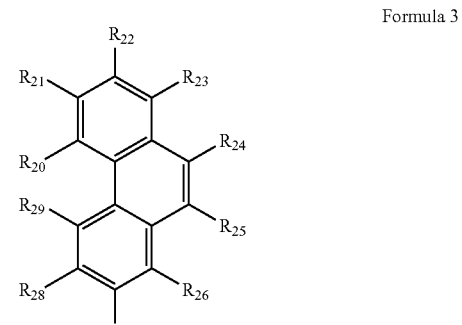

Formula 4

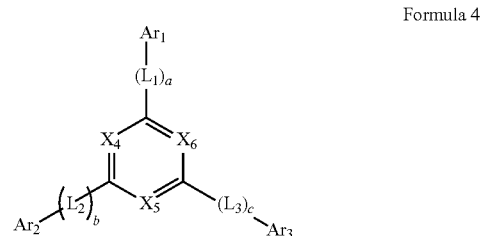

Formula 5

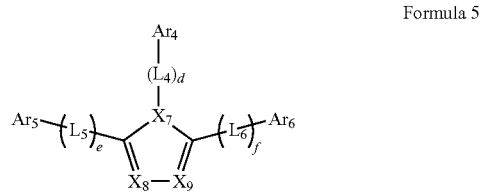

18 Claims, 1 Drawing Sheet

(51) Int. Cl.
  *C09B 1/00* (2006.01)
  *C09K 11/06* (2006.01)
  *H01L 51/50* (2006.01)

(52) U.S. Cl.
  CPC ............ *C09B 57/008* (2013.01); *C09K 11/06* (2013.01); *H01L 51/0054* (2013.01); *H01L 51/0067* (2013.01); *H01L 51/0072* (2013.01); *H01L 51/0074* (2013.01); *C09K 2211/1007* (2013.01); *C09K 2211/1011* (2013.01); *C09K 2211/1029* (2013.01); *C09K 2211/1033* (2013.01); *C09K 2211/1037* (2013.01); *C09K 2211/1044* (2013.01); *C09K 2211/1059* (2013.01); *C09K 2211/1088* (2013.01); *C09K 2211/1092* (2013.01); *H01L 51/0085* (2013.01); *H01L 51/5016* (2013.01); *H01L 51/5072* (2013.01)

(56) References Cited

U.S. PATENT DOCUMENTS

| | | |
|---|---|---|
| 8,652,652 B2 | 2/2014 | Brooks et al. |
| 10,505,116 B2 | 12/2019 | Watanabe et al. |
| 2007/0051944 A1 | 3/2007 | Vestweber et al. |
| 2007/0063638 A1 | 3/2007 | Tokairin et al. |
| 2009/0066245 A1* | 3/2009 | Sugimoto ........... H01L 51/0054 313/540 |
| 2010/0289406 A1 | 11/2010 | Ma et al. |
| 2011/0095282 A1 | 4/2011 | Pflumm et al. |
| 2012/0138911 A1 | 6/2012 | Inoue et al. |
| 2013/0001538 A1 | 1/2013 | Kwong et al. |
| 2013/0082589 A1* | 4/2013 | So ......................... H01L 27/322 313/504 |
| 2013/0175510 A1 | 7/2013 | Ma et al. |
| 2014/0197384 A1* | 7/2014 | Kim .................... H01L 51/0067 257/40 |
| 2014/0197401 A1 | 7/2014 | Kroeber et al. |
| 2014/0339519 A1* | 11/2014 | Takada ................ H01L 51/0054 257/40 |

FOREIGN PATENT DOCUMENTS

| | | |
|---|---|---|
| KR | 10-0730140 B1 | 6/2007 |
| KR | 10-2008-0013934 | 2/2008 |
| KR | 10-2008-0018218 A | 2/2008 |
| KR | 10-2010-0063713 A | 6/2010 |
| KR | 10-2010-0108924 | 10/2010 |
| KR | 10-2012-0023780 | 3/2012 |
| KR | 10-2012-0033711 A | 4/2012 |
| KR | 10-2012-0034648 | 4/2012 |
| KR | 10-2013-0007161 | 1/2013 |
| KR | 10-2013-0007951 A | 1/2013 |
| KR | 10-2013-0043674 A | 4/2013 |
| WO | WO2006/130598 A2 | 12/2006 |
| WO | WO 2010/114264 A2 | 10/2010 |
| WO | WO 2012/088192 A1 | 6/2012 |
| WO | 2012/176675 A1 | 12/2012 |
| WO | WO 2013/026515 A1 | 2/2013 |

\* cited by examiner

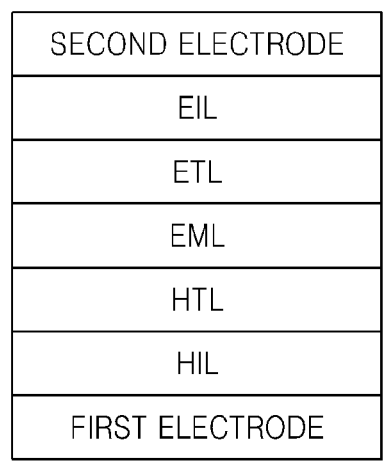

ORGANIC LIGHT-EMITTING DEVICE

CROSS-REFERENCE TO RELATED APPLICATION

This application is a divisional application of, and claims priority to and the benefit of U.S. patent application Ser. No. 14/150,734, filed Jan. 8, 2014, titled ORGANIC LIGHT-EMITTING DEVICE, which claims priority to and the benefit of Korean Patent Application No. 10-2013-0069953, filed on Jun. 18, 2013 in the Korean Intellectual Property Office, the entire contents of all of which are incorporated herein by reference.

BACKGROUND

1. Technical Field

One or more embodiments of the present invention relate to an organic light-emitting device including an aromatic compound.

2. Description of the Related Art

Organic light-emitting devices (OLEDs) are self-emitting devices that have advantages such as wide viewing angles, good contrast, fast response speeds, high brightness, and good driving voltage characteristics. Also, OLEDs can provide multicolored images.

A typical OLED has a structure including a substrate, and an anode, a hole transport layer (HTL), an emission layer (EML), an electron transport layer (ETL), and a cathode sequentially stacked on the substrate. In this regard, the HTL, the EML, and the ETL are organic thin films formed of organic compounds.

An operating principle of an OLED having the above-described structure may be as follows. When a voltage is applied between the anode and the cathode, holes injected from the anode move to the EML via the HTL and electrons injected from the cathode move to the EML via the ETL. The holes and electrons recombine in the EML to generate excitons. When the excitons drop from an excited state to a ground state, light is emitted.

SUMMARY

According to aspects of embodiments of the present invention, an organic light-emitting device has high-efficiency and an improved lifetime. According to an embodiment of the present invention, the organic light-emitting device includes a host material suitable to confine (or substantially confine) excited energy to an emission layer.

In an embodiment, an organic light-emitting device includes a first electrode; a second electrode; and an organic layer between the first electrode and the second electrode. The organic layer includes an emission layer, the emission layer including a compound represented by one of Formulae 1 to 3:

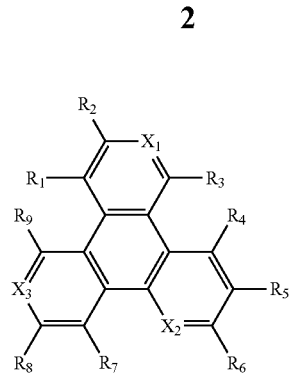

Formula 1

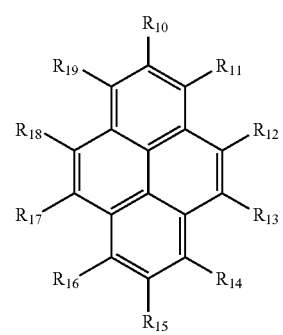

Formula 2

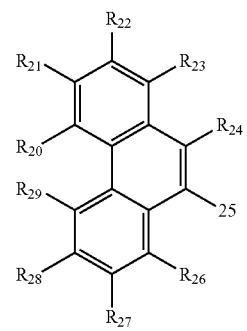

Formula 3

In one embodiment, in Formulae 1 to 3, $X_1$, $X_2$, and $X_3$ are each independently $CR_{81}$, $CR_{82}$, $CR_{83}$, or N; $R_1$ to $R_{29}$, and $R_{81}$ to $R_{83}$ are each independently a hydrogen atom; a deuterium atom; a cyano group; a C1-C60 alkyl group; a substituted or unsubstituted C2-C60 alkenyl group; a substituted or unsubstituted C2-C60 alkynyl group; a substituted or unsubstituted C3-C60 cycloalkyl group; a substituted or unsubstituted C3-C60 cycloalkenyl group; a substituted or unsubstituted C6-C60 aryl group; a substituted or unsubstituted C1-C60 heteroaryl group; a substituted or unsubstituted C6-C60 aryloxy group; a substituted or unsubstituted C6-C60 arylthio group; a substituted or unsubstituted C6-C60 condensed polycyclic group; an amino group substituted with a substituted C6-C60 aryl group; an amino group substituted with a unsubstituted C6-C60 aryl group; an amino group substituted with a substituted C1-C60 heteroaryl group; or an amino group substituted with an unsubstituted C1-C60 heteroaryl group. Adjacent substituents selected from $R_1$ to $R_{29}$ and $R_{81}$ to $R_{83}$ may optionally combine to form a ring. In one embodiment, the organic layer also includes an electron transport layer.

The electron transport layer includes a compound represented by Formula 4 or Formula 5:

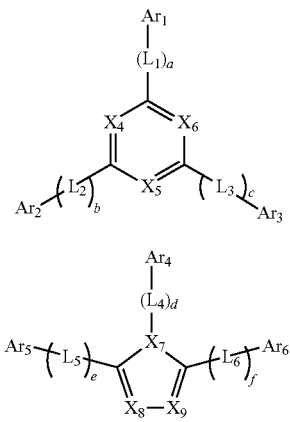

Formula 4

Formula 5

In one embodiment, in Formulae 4 and 5, $X_4$ to $X_9$ are each independently $CR_{91}$, $CR_{92}$, $CR_{93}$, $CR_{94}$, $CR_{95}$, $CR_{96}$, or N, $R_{91}$ to $R_{96}$ and $Ar_1$ to $Ar_6$ are each independently a hydrogen atom; a deuterium atom; a substituted or unsubstituted C6-C60 aryl group; a substituted or unsubstituted C1-C60 heteroaryl group; a substituted or unsubstituted C6-C60 aryloxy group; a substituted or unsubstituted C6-C60 arylthio group; a substituted or unsubstituted C6-C60 condensed polycyclic group; an amino group substituted with a substituted C6-C60 aryl group; an amino group substituted with an unsubstituted C6-C60 aryl group; an amino group substituted with a substituted C1-C60 heteroaryl group; or an amino group substituted with an unsubstituted C1-C60 heteroaryl group, and $L_1$ to $L_6$ are each independently a substituted or unsubstituted C6-C60 arylene group; a substituted or unsubstituted C1-C60 heteroarylene group; or a substituted or unsubstituted divalent C6-C60 condensed polycyclic group Adjacent substituents selected from $R_{61}$, $Ar_1$ to $Ar_6$, and $L_1$ to $L_6$ may optionally combine to form a ring. In one embodiment, a to f are each independently an integer of 0 to 2 and when one or more of a to f is an integer of 2 or more, the two or more corresponding $L_1$s to $L_6$s are the same or different.

According to another embodiment, a flat panel display device includes a thin-film transistor and the organic light-emitting device. The first electrode of the organic light-emitting device is electrically connected to a source electrode or a drain electrode of the thin-film transistor.

BRIEF DESCRIPTION OF THE DRAWING

These and/or other aspects of embodiments of the present invention will become apparent by reference to the following detailed description when considered together with the accompanying drawing, which is a schematic view of a structure of an organic light-emitting device according to an embodiment of the present invention.

DETAILED DESCRIPTION

In the following detailed description, only certain embodiments of the present invention are shown and described, by way of illustration. As those skilled in the art would recognize, the described embodiments may be modified in different ways, and therefore should not be construed as limiting. Embodiments are also described with reference to the accompanying drawing.

As used herein, the term "and/or," used with a list of elements, includes any and all combinations of one or more of the elements on the list. Expressions such as "at least one of," when preceding a list of elements, modify the entire list of elements and do not modify the individual elements of the list. The use of the term "may" when describing embodiments of the present invention refers to "one or more embodiments of the present invention". In the context of the present application, when a first element is referred to as being "on" a second element, it can be directly on the second element or be indirectly on the second element with one or more intervening elements therebetween.

According to an embodiment of the present invention, an organic light-emitting device includes a first electrode, a second electrode, and an organic layer between the first electrode and the second electrode. In one embodiment, the organic layer includes an emission layer and an electron transport layer. In one embodiment, the emission layer includes a compound represented by one of Formulae 1 to 3:

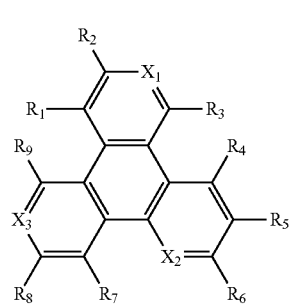

Formula 1

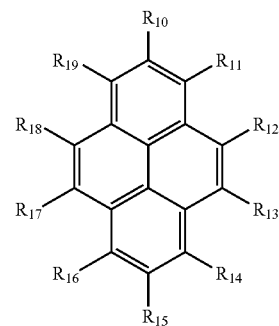

Formula 2

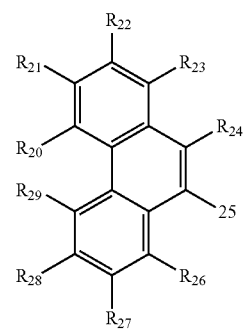

Formula 3

In Formulae 1 to 3, $X_1$, $X_2$, and $X_3$ may each independently be $CR_{81}$, $CR_{82}$, $CR_{83}$, or N. $R_1$ to $R_{29}$ and $R_{81}$ to $R_{83}$ may each independently be a hydrogen atom; a deuterium atom; a cyano group; a C1-C60 alkyl group; a substituted or unsubstituted C2-C60 alkenyl group; a substituted or unsubstituted C2-C60 alkynyl group; a substituted or unsubstituted C3-C60 cycloalkyl group; a substituted or unsubstituted C3-C60 cycloalkenyl group; a substituted or unsubstituted C6-C60 aryl group; a substituted or unsubstituted C1-C60 heteroaryl group; a substituted or unsubstituted C6-C60 aryloxy group; a substituted or unsubstituted C6-C60 arylthio group; a substituted or unsubstituted C6-C60 condensed polycyclic group; an amino group substituted with a substituted C6-C60 aryl group; an amino group substituted with an unsubstituted C6-C60 aryl group; an amino group substituted with a substituted C1-C60 heteroaryl group; or an amino group substituted with an unsubstituted C1-C60 heteroaryl group.

In some embodiments, in Formula 1, Formula 2, or Formula 3, two adjacent substituents among $R_1$ to $R_{29}$ and $R_{81}$ to $R_{83}$ may optionally combine to form a ring. In some embodiments, two or more rings are formed, each by combining two adjacent substituents among $R_1$ to $R_{29}$ and $R_{81}$ to $R_{83}$. For example, $R_1$ and $R_2$ may combine to form a first ring and $R_5$ and $R_6$ may combine to form a second ring. It will be understood that "adjacent" substituents include any two substituents suitably positioned to form a ring. For example, two suitably positioned adjacent substituents may be on atoms which are directly connected (e.g., $R_1$ and $R_2$), that is, the adjacent substituents may be on vicinal atoms. Also, two suitably positioned adjacent substituents may be on atoms that are not directly connected (e.g., $R_3$ and $R_4$).

In one embodiment, the organic layer further includes an electron transport layer. In one embodiment, the electron transport layer includes a compound represented by Formula 4 or Formula 5:

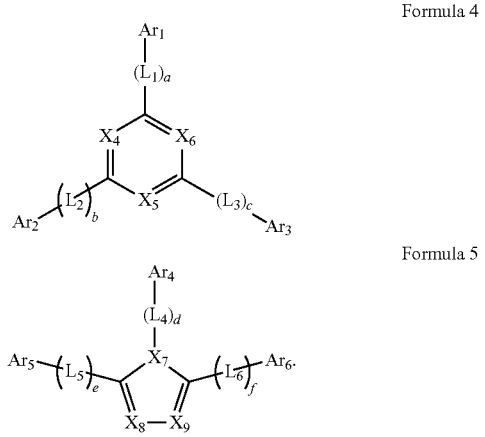

Formula 4

Formula 5

In Formulae 4 and 5, $X_4$ to $X_9$ are each independently $CR_{91}$, $CR_{92}$, $CR_{93}$, $CR_{94}$, $CR_{95}$, $CR_{96}$, or N. $R_{91}$ to $R_{96}$, and $Ar_1$ to $Ar_6$ may each independently be a hydrogen atom; a deuterium atom; a substituted or unsubstituted C6-C60 aryl group; a substituted or unsubstituted C1-C60 heteroaryl group; a substituted or unsubstituted C6-C60 aryloxy group; a substituted or unsubstituted C6-C60 arylthio group; a substituted or unsubstituted C6-C60 condensed polycyclic group; an amino group substituted with a substituted C6-C60 aryl group; an amino group substituted with an unsubstituted C6-C60 aryl group; an amino group substituted with a substituted C1-C60 heteroaryl group; or an amino group substituted with an unsubstituted C1-C60 heteroaryl group. $L_1$ to $L_6$ may each independently be a substituted or unsubstituted C6-C60 arylene group; a substituted or unsubstituted C1-C60 heteroarylene group; or a substituted or unsubstituted divalent C6-C60 condensed polycyclic group.

In some embodiments, in Formula 4 or Formula 5, two adjacent substituents among $R_{91}$ to $R_{96}$, $Ar_1$ to $Ar_6$, and $L_1$ to $L_6$ may optionally combine to form a ring. It will be understood that adjacent substituents include any two substituents suitably positioned to form a ring, and that more than one ring may be formed (e.g., as already described with reference to Formulae 1 to 3).

In one embodiment, in Formulae 4 and 5, a to f are each independently an integer of 0 to 2.

The compound represented by one of Formulae 1 to 3 may be a host material. In some embodiments of the present invention, the host material and the electron transport layer material may be appropriately selected to give the organic light emitting device a charge mobility suitable for high emission efficiency and long-lasting phosphorescence.

The type of emission material may affect the emission efficiency of the organic light-emitting device. High emission efficiency may be obtained by use of excited singlet and triplet states of an organic phosphorescent material in the emission layer of the organic light-emitting device. When electrons and holes recombine in the organic light-emitting device, singlet excitons and triplet excitons may be generated. The singlet and triplet excitons may be generated in a 1:3 ratio due to spin multiplicity. Accordingly, an organic light-emitting device using a phosphorescent material may have improved emission efficiency compared to an organic light-emitting device using a fluorescent material, by up to four times. In order to prevent or reduce quenching of triplet excitons, organic light-emitting devices may include a stack structure in which an anode, a hole transport layer, an organic emission layer, a hole blocking layer, an electron transport layer, and a cathode are sequentially stacked on a substrate.

Thus, an organic light-emitting device including phosphorescent materials may have higher efficiency than organic light-emitting devices including fluorescent materials. However, while certain phosphorescent materials used in emission layers may be advantageous in terms of emission characteristics, these phosphorescent materials may be limited in terms of lifetime, efficiency, and thermal stability.

To transfer intermolecular energy from a phosphorescent host to a phosphorescent dopant in a phosphorescent emission layer doped with a phosphorescent material, the excited triplet energy gap T1 of the phosphorescent host should be larger than the energy gap T1 of the phosphorescent dopant. CBP is a phosphorescent host with a relatively high T1. When CBP is used as a phosphorescent host, a high-efficiency phosphorescent device may be manufactured due to energy transfer from the phosphorescent host to the phosphorescent dopant. However, the phosphorescent device including CBP may have a relatively short lifetime.

Thus, a host material is desirably capable of adjusting charge mobility and defining an emission region within an emission layer (e.g., by confining excited energy to a region within the emission layer) of the phosphorescent device.

Typically, a phosphorescent device is manufactured to further include a hole blocking layer and an electron blocking layer, in addition to the electron transport layer or hole transport layer, in order to confine excited energy to a region within the emission layer. However, such phosphorescent devices may have problems with the charge injection structure, and thus may require increased driving voltages. As a consequence of the increased driving voltage, materials of the phosphorescent devices are more likely to deteriorate, and thus the lifetime of these phosphorescent devices may be decreased.

According to embodiments of the present invention, the emission layer of an organic light-emitting device includes a compound represented by one of Formulae 1 to 3. In some embodiments, $X_1$ to $X_3$ in Formulae 1 to 3 may be CH. In some embodiments, $R_1$ to $R_{29}$, and $R_{81}$ to $R_{83}$ in Formulae 1 to 3 may each independently be a hydrogen atom, a deuterium atom, or a group represented by one of Formulae 2a to 2f:

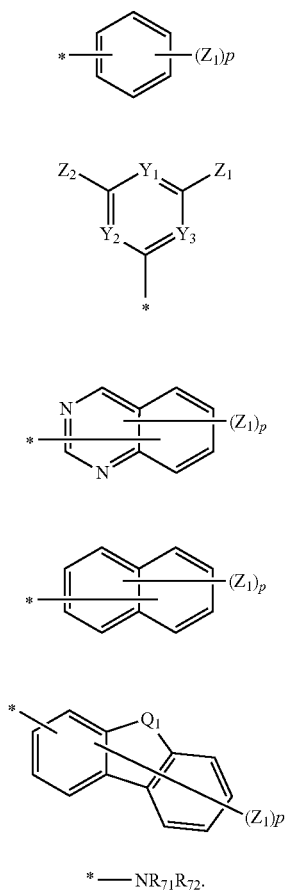

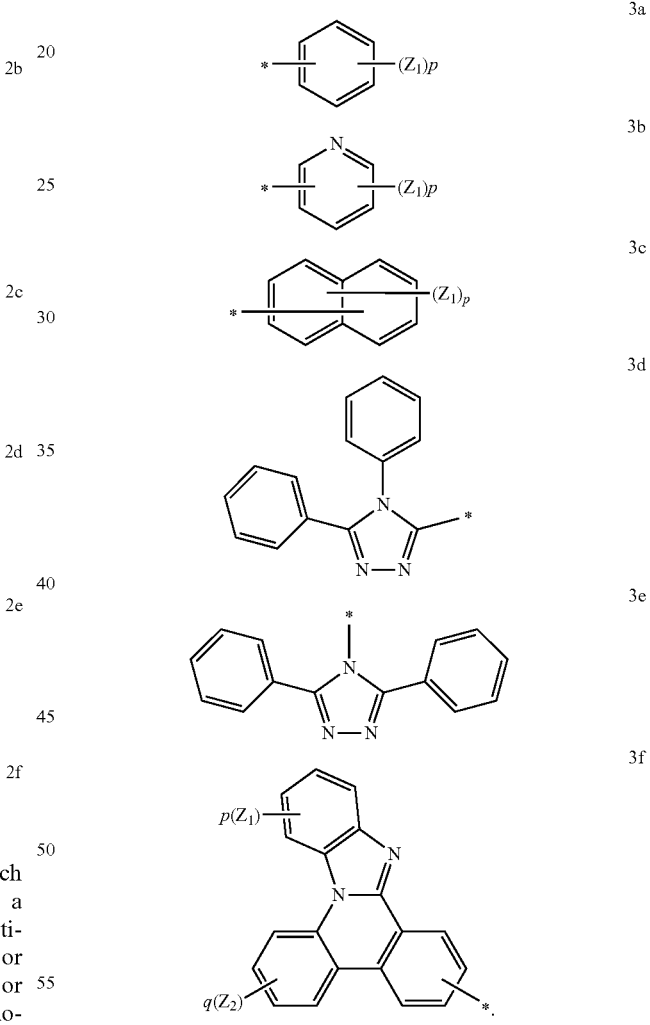

moiety. Here, each * is a binding site to a corresponding atom of Formula 1.

In some embodiments, $Ar_1$ to $Ar_6$ in Formulae 4 and 5 may each independently be a hydrogen atom, a deuterium atom, or a group represented by one of Formulae 3a to 3f:

In Formulae 2a to 2f, $R_{71}$, $R_{72}$, $Z_1$, and $Z_2$ may each independently be a hydrogen atom, a deuterium atom, a substituted or unsubstituted C1-C20 alkyl group, a substituted or unsubstituted C6-C20 aryl group, a substituted or unsubstituted C3-C20 heteroaryl group, a substituted or unsubstituted C6-C20 condensed polycyclic group, a halogen group, a cyano group, a nitro group, a hydroxyl group, or a carboxyl group. $Y_1$ to $Y_3$ may each independently be CH or N. $Q_1$ may be S or O. p may be an integer of 1 to 7, and when p is an integer of 2 or more, the two or more $Z_1$s may be the same or different. * is a binding site to a corresponding atom of Formula 1, Formula 2, or Formula 3, or to a corresponding carbon (C) of $CR_{81}$ to $CR_{83}$.

In some embodiments, at least two adjacent substituents among $R_1$ to $R_{29}$ and $R_{81}$ to $R_{83}$ in Formula 1 may optionally combine to form a In Formulae 3a to 3f, $Z_1$ and $Z_2$ may each independently be a hydrogen atom, a deuterium atom, a substituted or unsubstituted C1-C20 alkyl group, a substituted or unsubstituted C6-C20 aryl group, a substituted or unsubstituted C3-C20 heteroaryl group, a substituted or unsubstituted C6-C20 condensed polycyclic group, a halogen group, a cyano group, a nitro group, a hydroxyl group, or a carboxyl group. p and q may each independently be an integer of 1 to 7. When one or more of p or q is an integer of 2 or more, the two or more corresponding $Z_1$s or $Z_2$s are the same or different. * is a binding site to a corresponding one of $L_1$ to $L_6$ or to a corresponding atom of Formula 4 or Formula 5. For example, the binding site, *, is a binding site to an atom of Formula 4 or Formula 5 when at least one of a to f is 0 (i.e., when at least one of $L_1$ to $L_6$ is absent).

In an embodiment, the group represented by Formula 3f may be a group represented by Formula 4a:

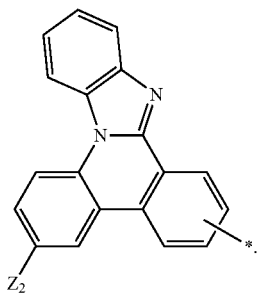

4a

In Formula 4a, $Z_2$ may be a hydrogen atom or a naphthyl group. * is a binding site to a corresponding $L_1$ to $L_6$ or to a corresponding atom of Formula 4 or Formula 5 (e.g., as already described with reference to Formulae 3a to 3f in connection with Formulae 4 to 5).

In some embodiments, $L_1$ to $L_6$ in Formulae 4 and 5 may each independently be a group represented by one of Formulae 5a to 5d:

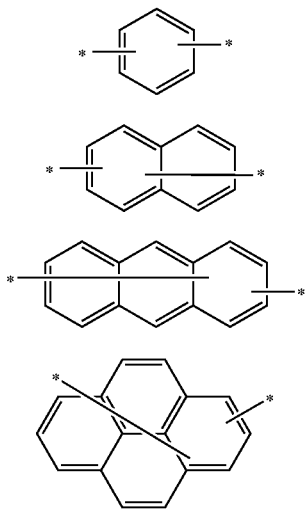

5a

5b

5c

5d

In Formulae 5a to 5d, each * is a binding site to a corresponding $Ar_1$ to $Ar_6$, to a corresponding $L_1$ to $L_6$ (e.g., when one of a to f is an integer of two or more), or to a corresponding atom of Formula 4 or Formula 5. The binding site to a corresponding atom of Formulae 4 to 5 is as already described with reference to Formulae 3a to 3f in connection with Formulae 4 to 5.

Hereinafter, examples of the substituents described above are provided. In this regard, it is understood that the numbers of carbon atoms listed for the substituents are presented only for illustrative purposes and do not limit the characteristics of the substituents. Also, definitions of substituents not provided in the present specification are the same as the general definitions of those substituents as understood by one of ordinary skill in the art.

The unsubstituted C1-C60 alkyl group refers to a linear or branched C1-C60 alkyl group. Non-limiting examples of the alkyl group include a methyl group, an ethyl group, a propyl group, an isobutyl group, a sec-butyl group, a pentyl group, an iso-amyl group, a hexyl group, a heptyl group, an octyl group, a nonyl group, and a dodecyl group. The substituted C1-C60 alkyl group refers to the substitution of at least one hydrogen atom of the unsubstituted C1-C60 alkyl group with a deuterium atom, a halogen atom, a hydroxyl group, a nitro group, a cyano group, an amino group, an amidino group, a hydrazine group, a hydrazone group, a carboxyl group or a salt thereof, a sulfonic acid group or a salt thereof, a phosphoric acid group or a salt thereof, a C1-C10 alkyl group, a C1-C10 alkoxy group, a C2-C10 alkenyl group, a C2-C10 alkynyl group, a C6-C16 aryl group, an alkylsilyl group, an arylsilyl group, or a C1-C16 heteroaryl group.

The unsubstituted C2-C60 alkenyl group refers to an unsaturated alkyl group having at least one carbon-carbon double bond. The carbon-carbon double bond (i.e., an alkene) may be an internal alkene or a terminal alkene. The internal alkene may be in the form of an E isomer, a Z isomer, or a mixture thereof. Non-limiting examples of the alkenyl group include an ethenyl group, a propenyl group, and a butenyl group. The substituted C2-C60 alkenyl group refers to the substitution of at least one hydrogen atom of the unsubstituted C2-C60 alkenyl group with the substituents described above in connection with the substituted C1-C60 alkyl group.

The unsubstituted C2-C60 alkynyl group refers to an alkyl group having at least one carbon-carbon triple bond. The carbon-carbon triple bond (i.e., an alkyne) may be an internal alkyne or a terminal alkyne. Non-limiting examples of the unsubstituted C2-C20 alkynyl group include acetylene, propylene, phenylacetylene, naphthylacetylene, isopropylacetylene, t-butylacetylene, and diphenylacetylene. The substituted C2-C60 alkynyl group refers to substitution of at least one hydrogen atom of the unsubstituted C2-C60 alkynyl group with the substituents described above in connection with the substituted C1-C60 alkyl group.

The unsubstituted C3-C60 cycloalkyl group refers to an unsubstituted C3-C60 alkyl group in which a hydrogen atom on each of two different carbon atoms of the unsubstituted C3-C60 alkyl group are replaced by a carbon-carbon single bond between the two different carbon atoms to form a ring. The C3-C60 cycloalkyl group may include one or more rings. The substituted C3-C60 cycloalkyl group refers to the substitution of at least one hydrogen atom of the unsubstituted C3-C60 cycloalkyl group with the substituents described above in connection with the substituted C1-C60 alkyl group.

The unsubstituted C1-C60 alkoxy group refers to a group represented by—OA, where A is the unsubstituted C1-C60 alkyl group as described above. Non-limiting examples of the unsubstituted C1-C60 alkoxy group include a methoxy group, an ethoxy group, a propoxy group, an isopropyloxy group, a butoxy group, and a pentoxy group. The substituted C1-C60 alkoxy group refers to the substitution of at least one hydrogen atom of the unsubstituted C1-C60 alkoxy group with the substituents described above in connection with the substituted C1-C60 alkyl group.

The unsubstituted C6-C60 aryl group refers to a carbocyclic aromatic system containing at least one ring. When there are two or more rings, the two or more rings may be fused to each other and/or connected by a single bond. The term "aryl," as used herein, refers to an aromatic group, such as a phenyl group, a naphthyl group, or an anthracenyl group. The substituted C6-C60 aryl group refers to the substitution of at least one hydrogen atom of the unsubstituted C6-C60 aryl with the substituents described above in connection with the substituted C1-C60 alkyl group. Non-limiting examples of the substituted and unsubstituted C6-C60 aryl groups include a phenyl group, a C1-C10 alkylphenyl group (for example, an ethylphenyl group), a biphenyl group, a C1-C10 alkyl biphenyl group, a C1-C10 alkoxybiphenyl group, an o-, m-, or p-tolyl group, an o-, m-, or p-cumenyl group, a mesityl group, a phenoxyphenyl group, an (α,α-dimethylbenzene)phenyl group, a (N,N'-dimethyl)aminophenyl group, an (N,N'-diphenyl)aminophenyl group, a pentalenyl group, an indenyl group, a naphthyl group, a C1-C10 alkylnaphthyl group (for example, a methylnaphthyl group), a C1-C10 alkoxynaphthyl group (for example, a methoxynaphthyl group), an anthracenyl group, an azulenyl group, a heptalenyl group, an acenaphthalenyl group, a phenalenyl group, a fluorenyl group, an anthraquinolyl group, a methylanthryl group, a phenanthryl group, a triphenylene group, a pyrenyl group, a chrycenyl group, an ethyl-chrysenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthalenyl group, a heptaphenyl group, a heptacenyl group, a pyranthrenyl group, and an ovalenyl group.

The unsubstituted C1-C60 heteroaryl group refers to an aromatic system containing at least one ring and including one, two, three, or four ring heteroatoms, such as N, O, P and/or S. When there are two or more rings, the two or more rings may be fused to each other and/or connected to each other by a single bond. Non-limiting examples of the unsubstituted C1-C60 heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazoyl group, an indolyl group, a quinolyl group, an isoquinolyl group, and a dibenzothiophenyl group. The substituted C1-C60 heteroaryl group refers to the substitution of at least one hydrogen atom of the unsubstituted C1-C60 heteroaryl group with the substituents described above in connection with the substituted C1-C60 alkyl group.

The unsubstituted C6-C60 aryloxy group refers to a group represented by—OA$_1$, where A$_1$ is the C6-C60 aryl group. A non-limiting example of the C6-C60 aryloxy group is a phenoxy group. The substituted C6-C60 aryloxy group refers to substitution of at least one hydrogen atom in the aryloxy group with the substituents described above in connection with the substituted C1-C60 alkyl group.

The unsubstituted C6-C60 arylthio group refers to a group represented by—SA$_2$, where A$_2$ is the C6-C60 aryl group. Non-limiting examples of the C6-C60 arylthio group include a benzenethio group and a naphthylthio group. The substituted C6-C60 arylthio group refers to the substitution of at least one hydrogen atom in the unsubstituted C6-C60 arylthio group with the substituents described above in connection with the substituted C1-C60 alkyl group.

The unsubstituted C6-C60 condensed polycyclic group refers to a group including at least two rings in which at least one aromatic ring and at least one non-aromatic ring are fused to each other. The non-aromatic ring may have a saturated and/or an unsaturated group. When the non-aromatic ring has an unsaturated group, the unsaturated group is not in conjugation with the aromatic ring. The unsubstituted C6-C60 condensed polycyclic group may be distinguished from the aryl group and the heteroaryl group in that not all of the rings of the fused rings of the polycyclic group are aromatic (i.e., at least one ring is not aromatic).

Referring now to Formulae 1 to 3, non-limiting examples of the compounds represented by Formulae 1 to 3 include Compounds 1 to 116:

1

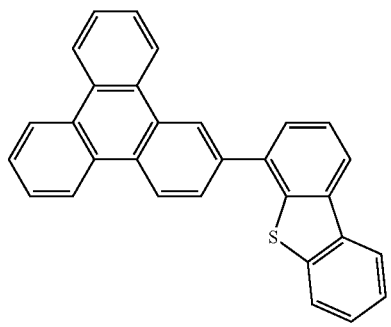

2

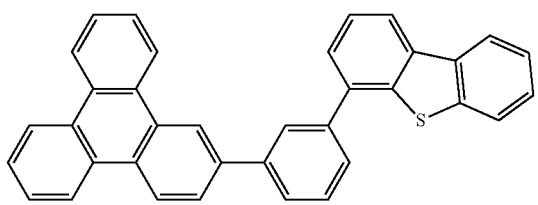

3

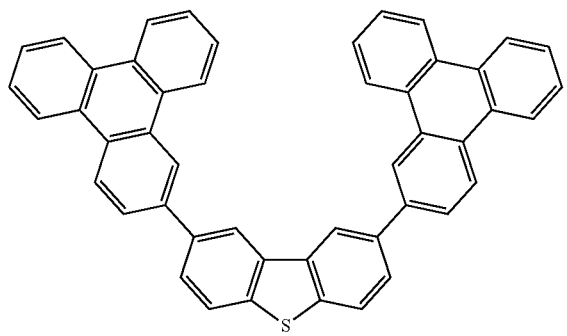

4

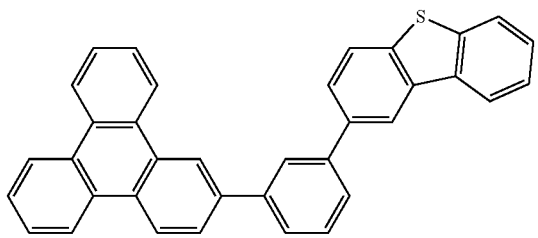

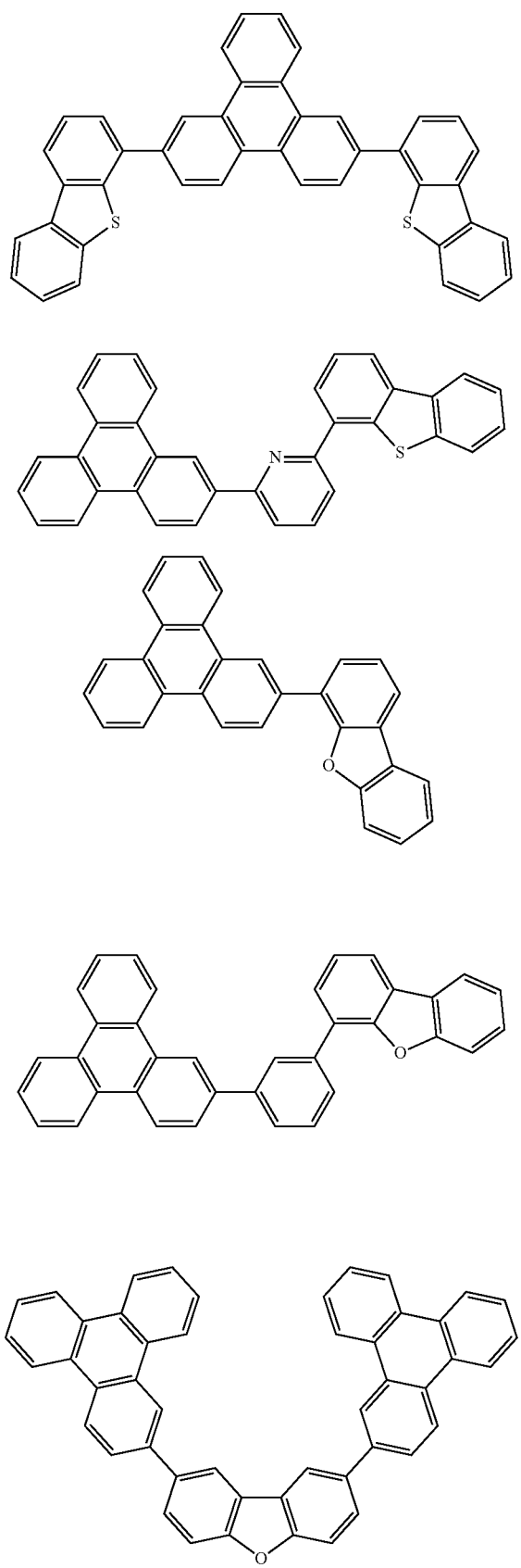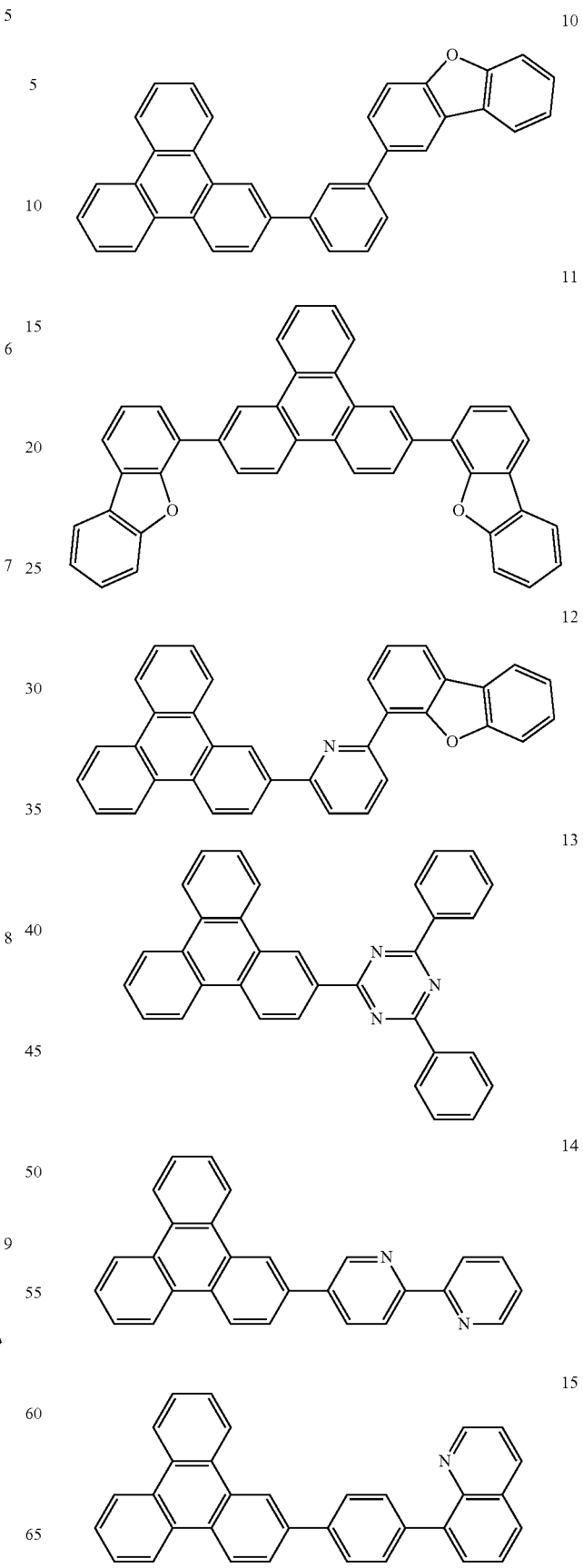

16
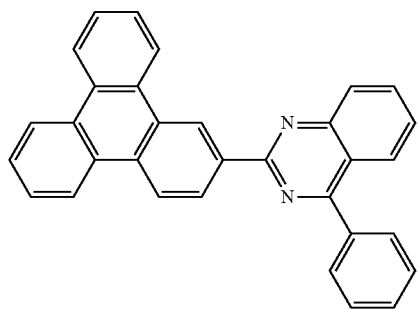
17
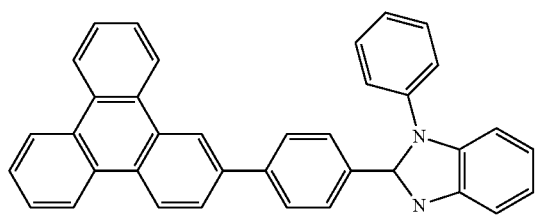
18
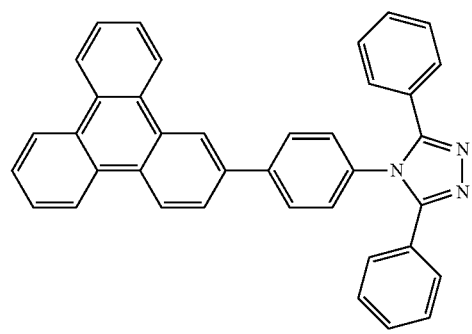
19
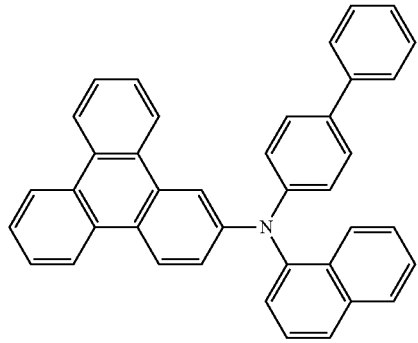
20
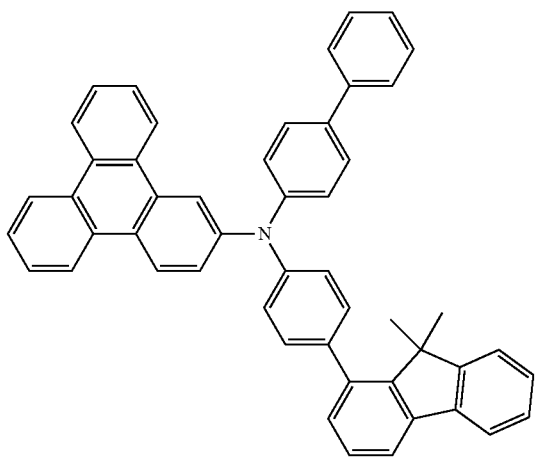
21
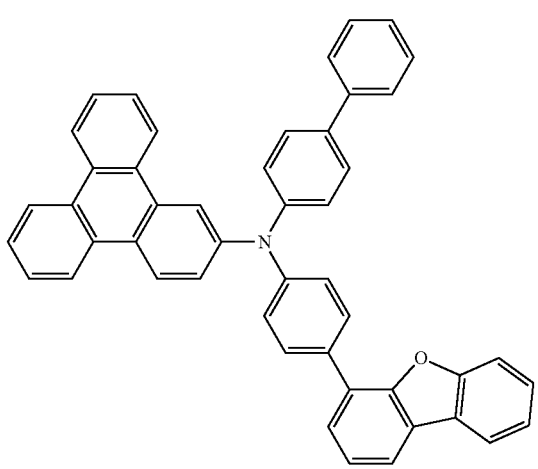
22
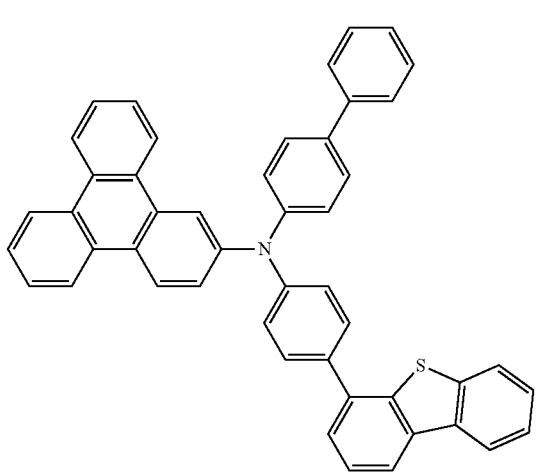

23
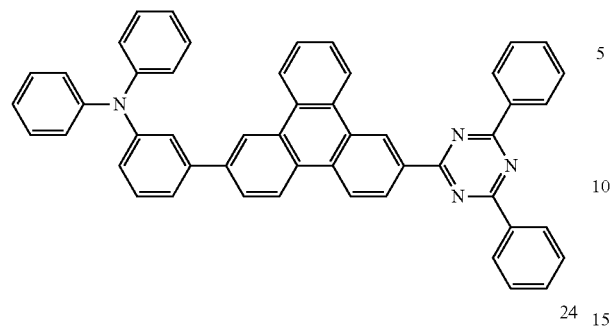
24
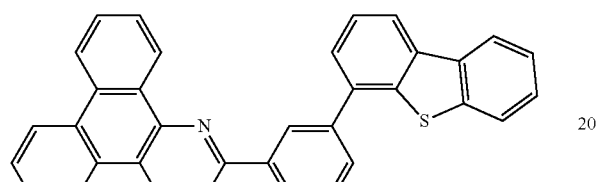
25
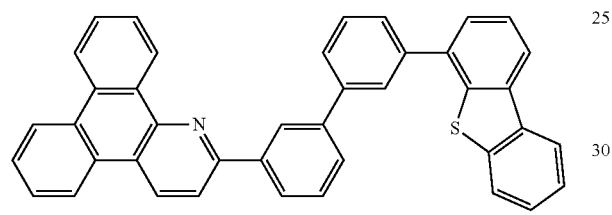
26
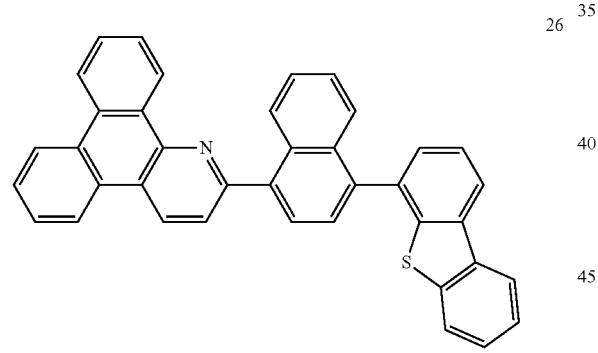
27
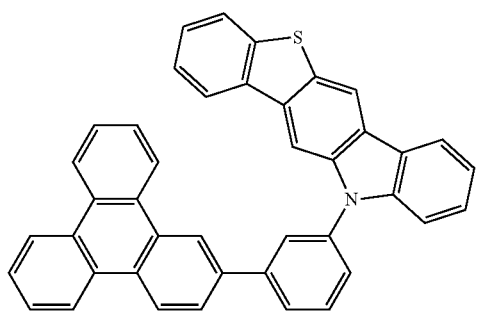
28
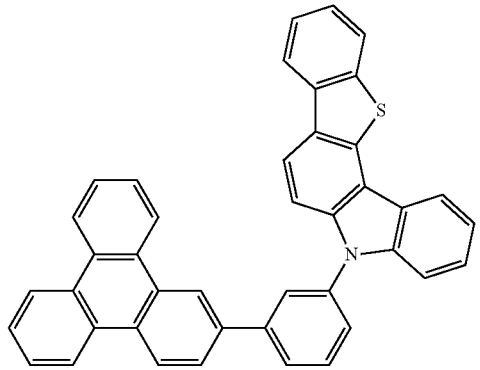
29
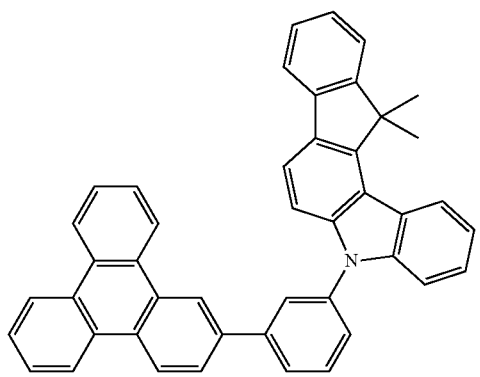
30
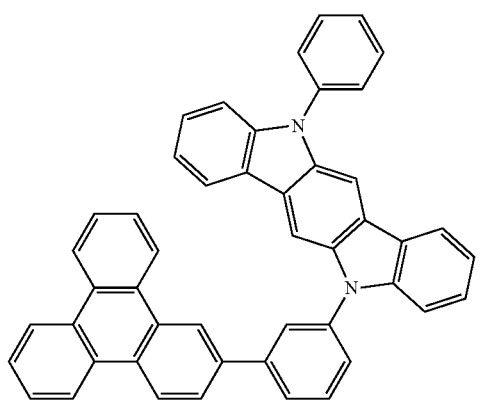
31

32
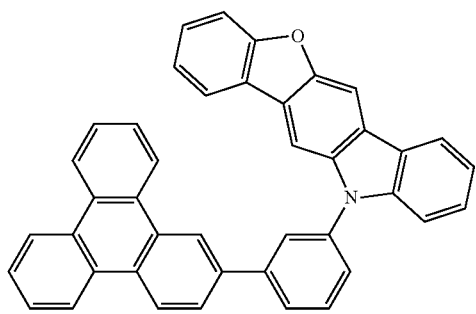
33
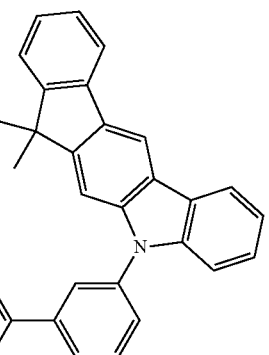
34
35
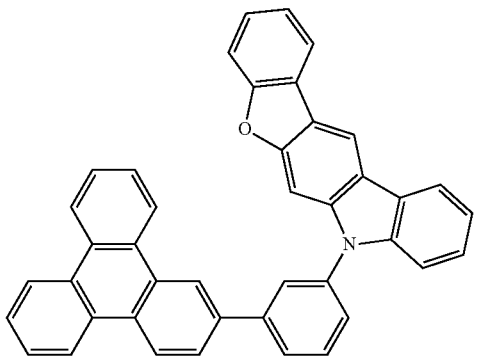
36
37
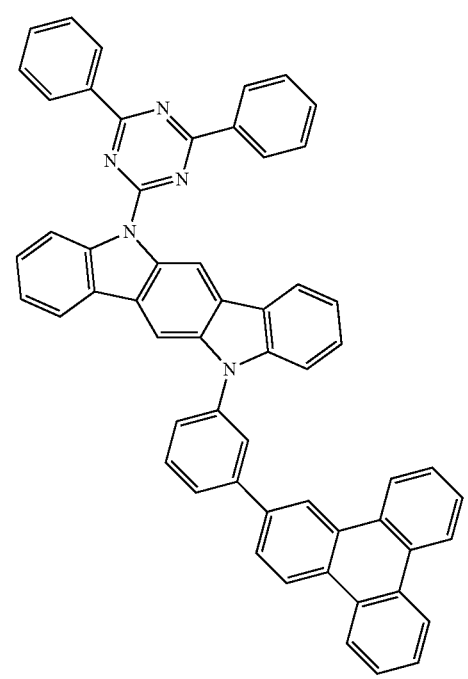

38
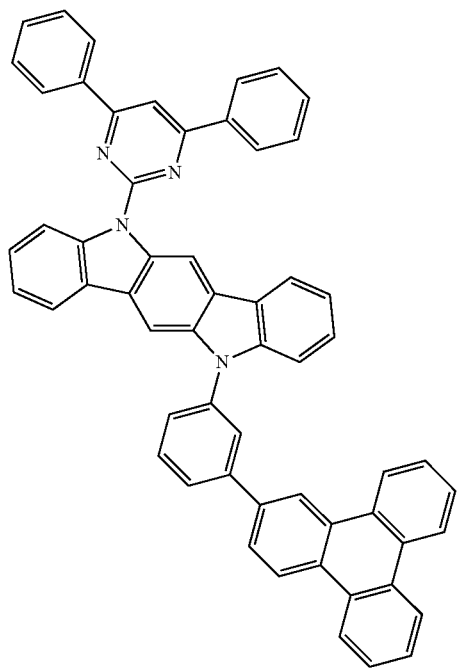
39
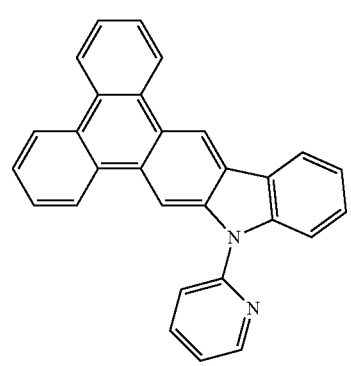
40
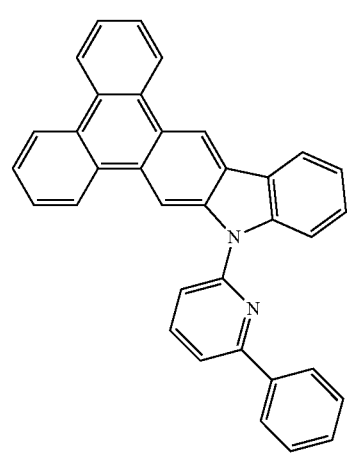
41
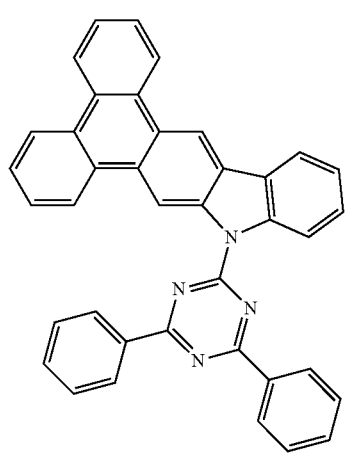
42
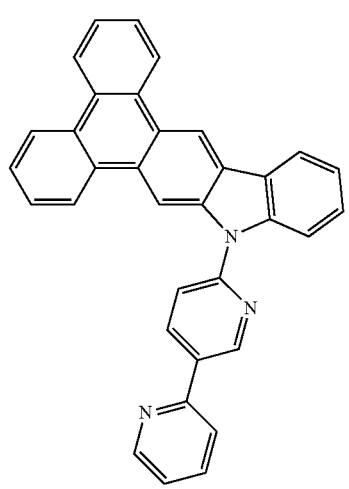
43
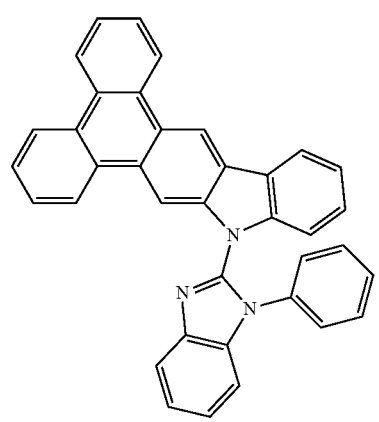

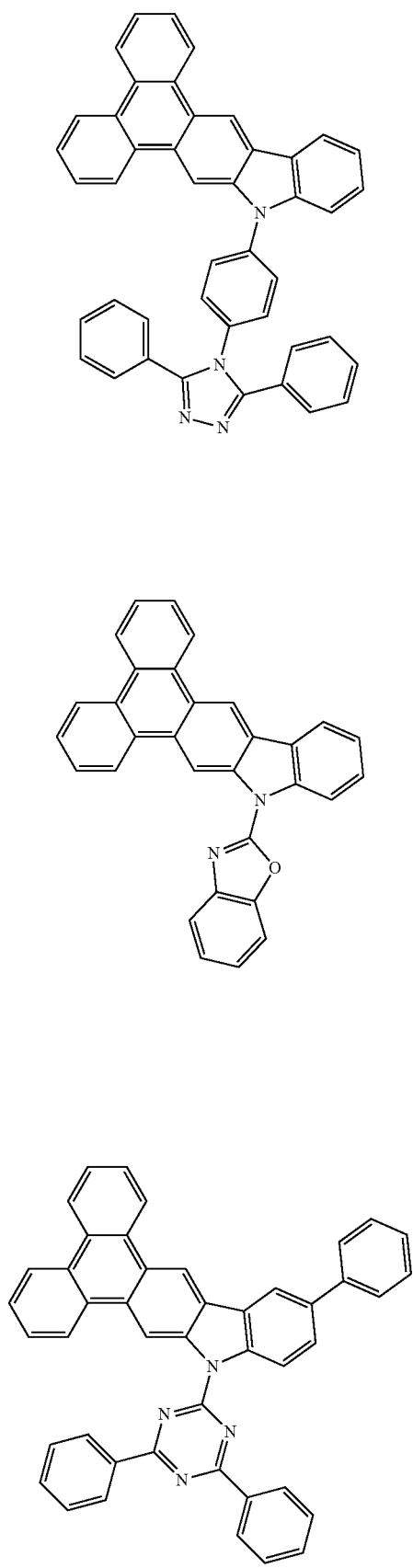
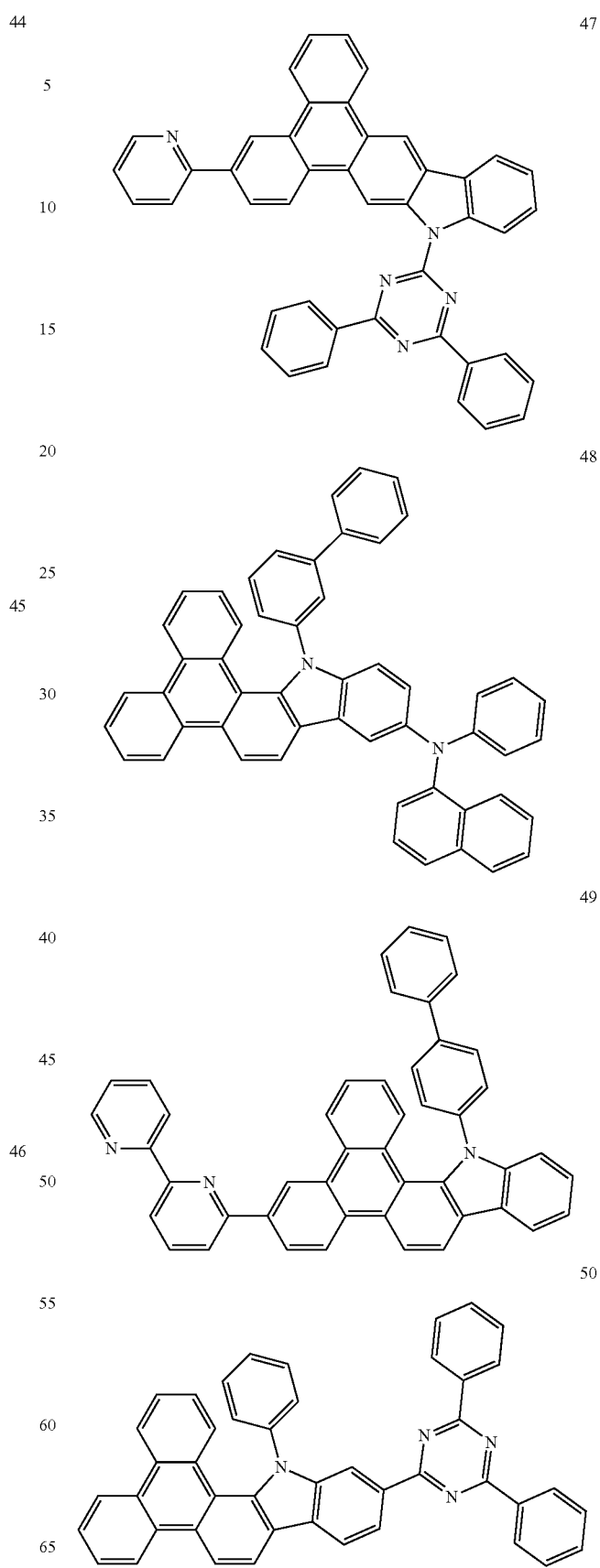

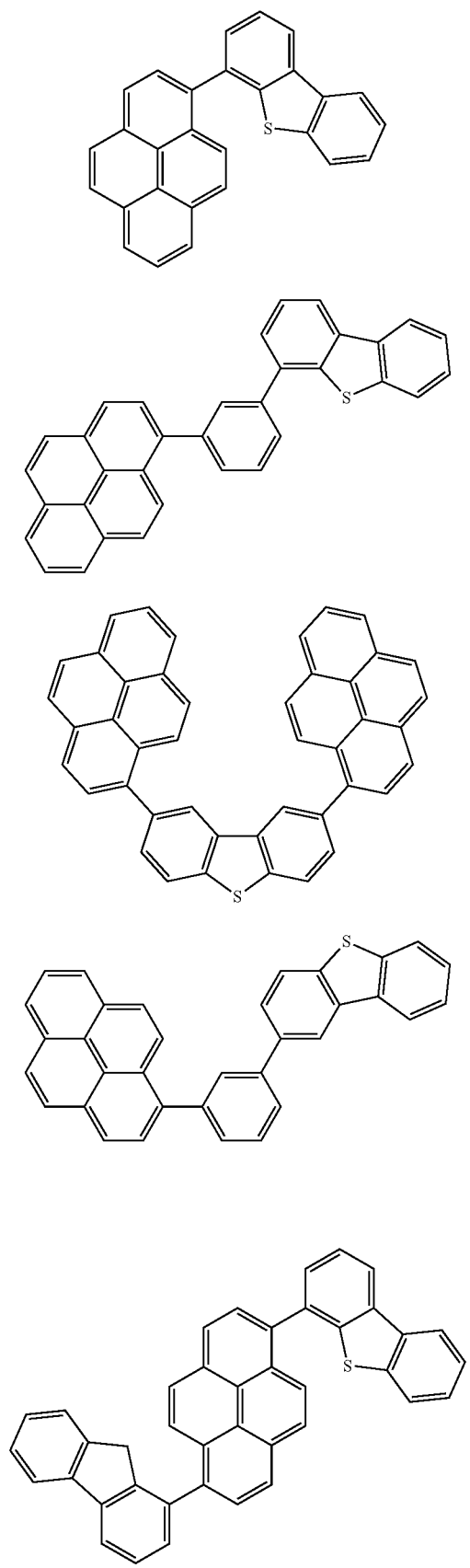
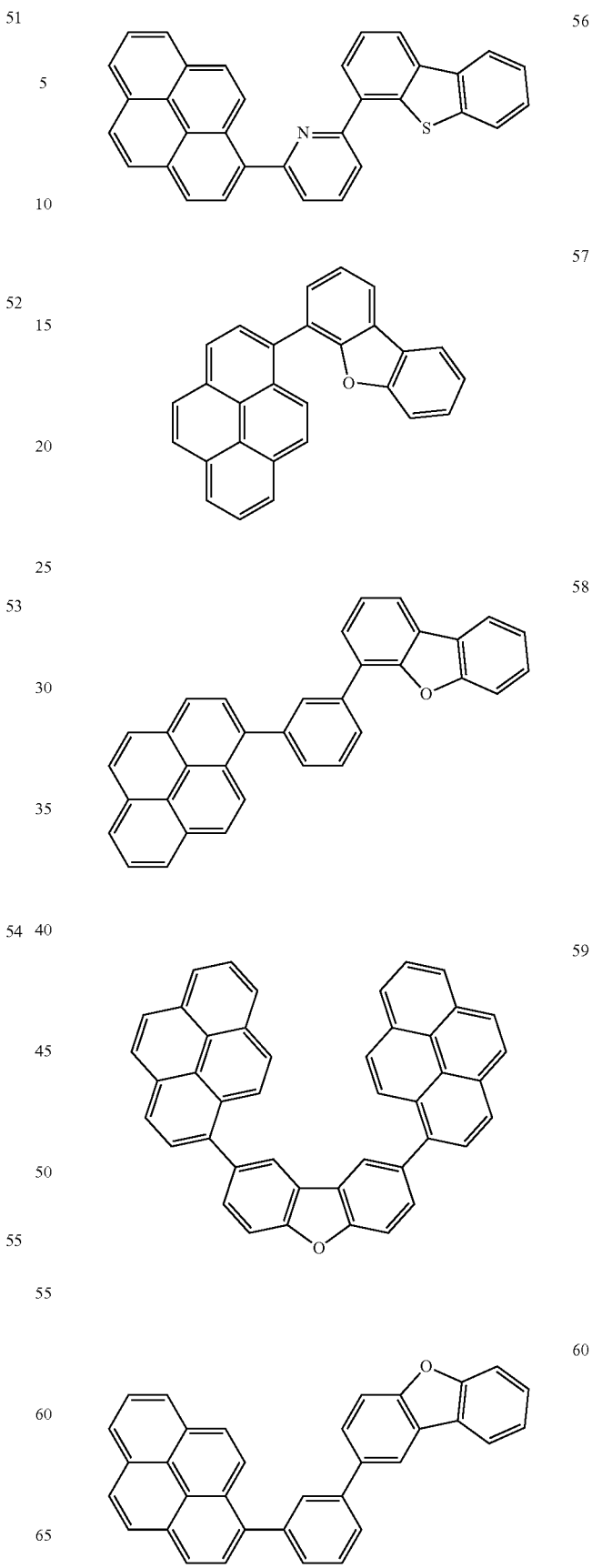

61
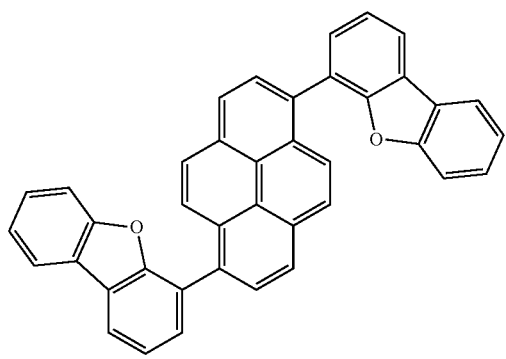
62
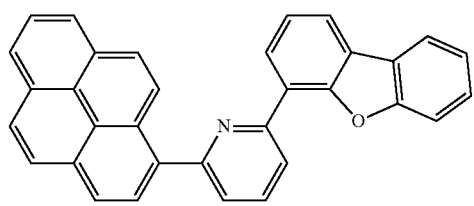
63
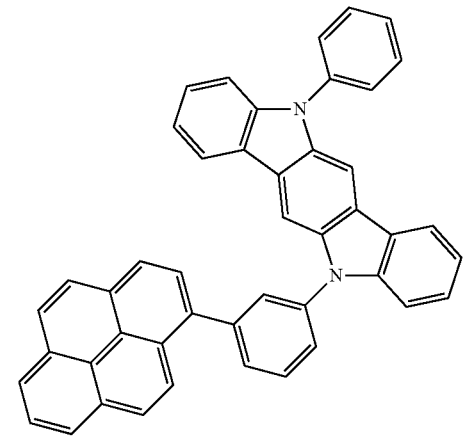
64
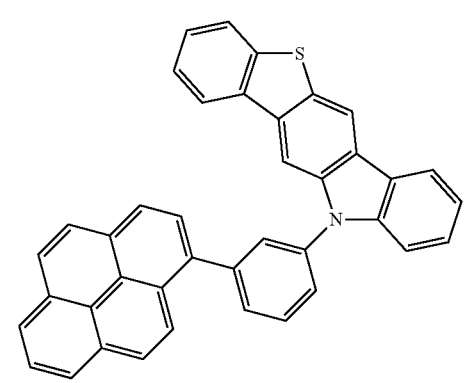
65
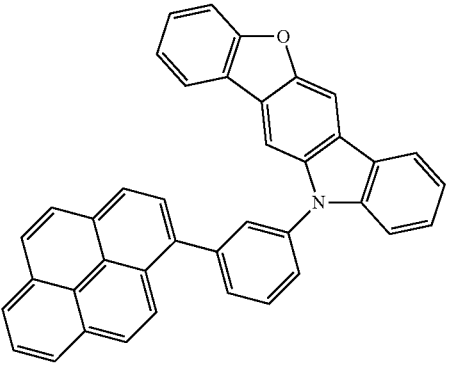
66
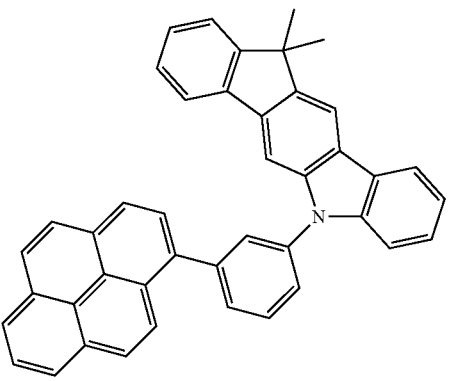
67
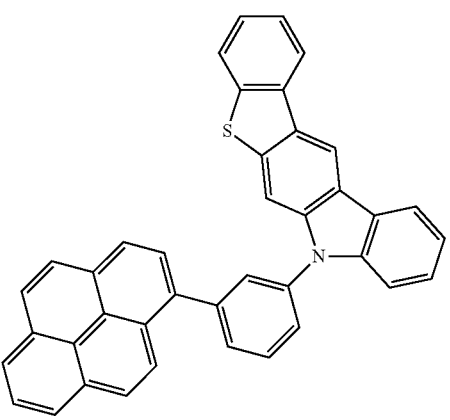
68
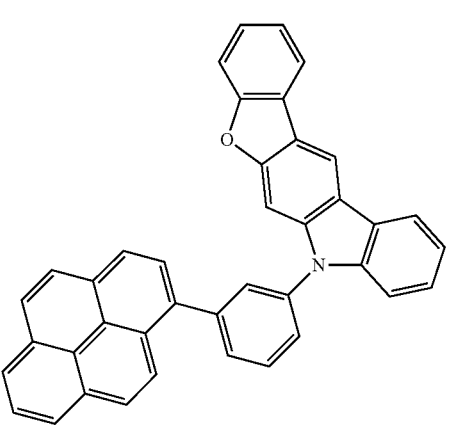

29
-continued
69
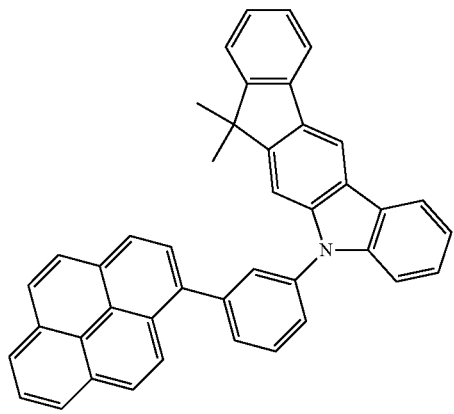
70
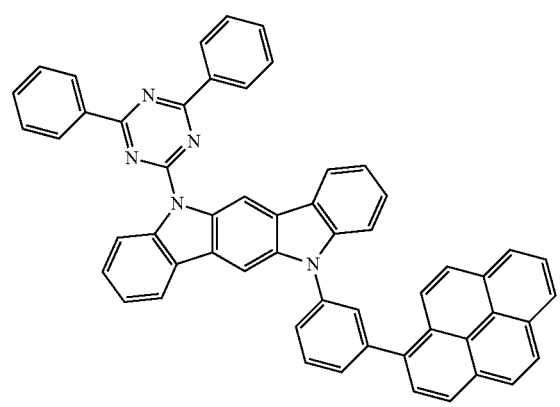
71
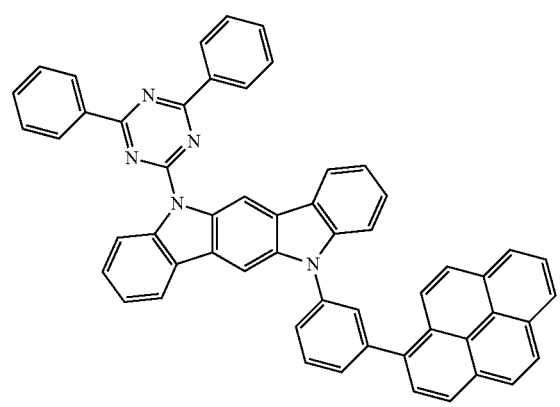
30
-continued
72
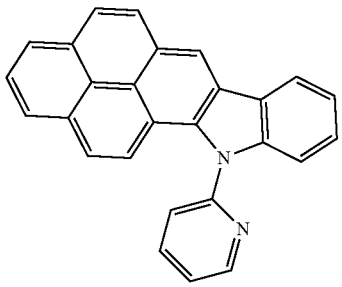
73
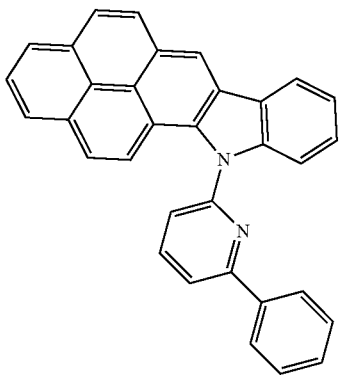
74
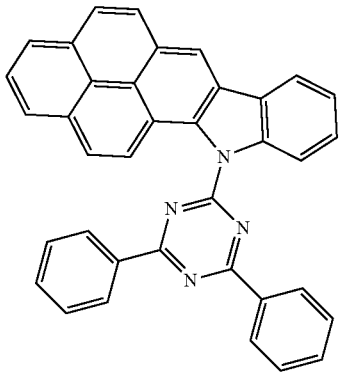
75
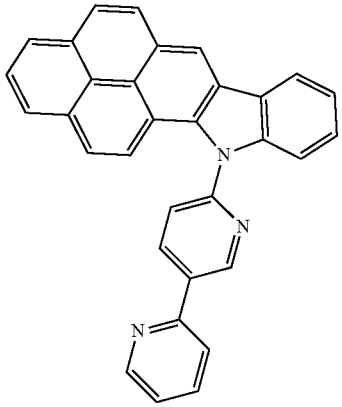

76
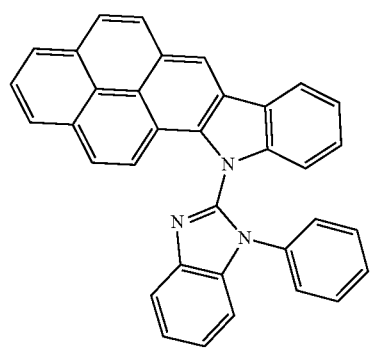
77
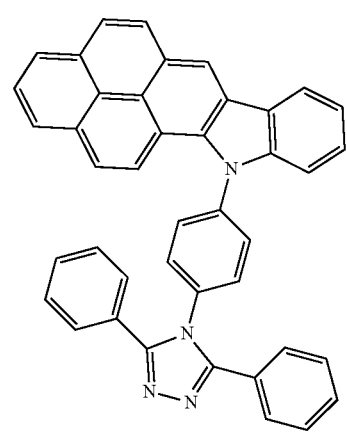
78
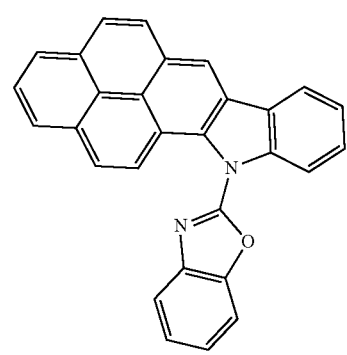
79
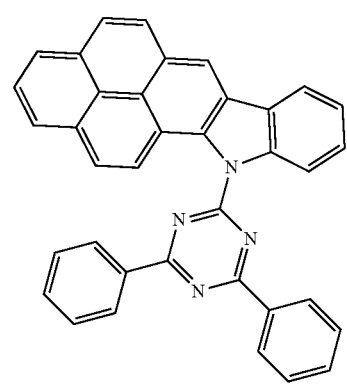
80
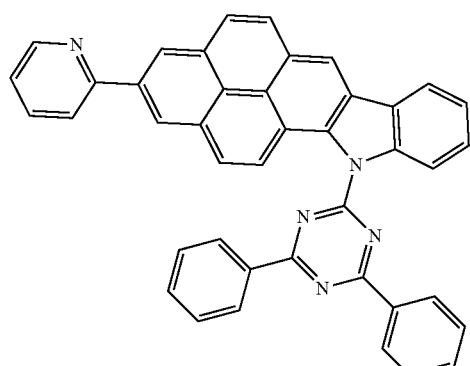
81
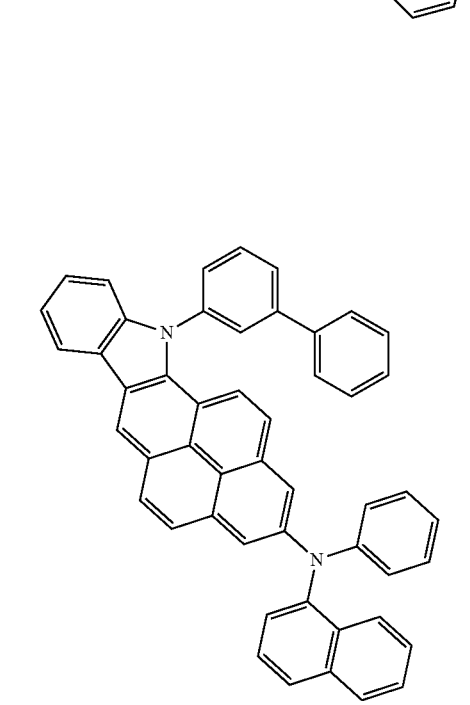
82
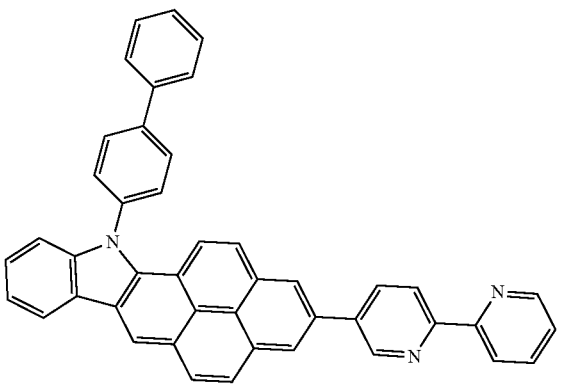

83
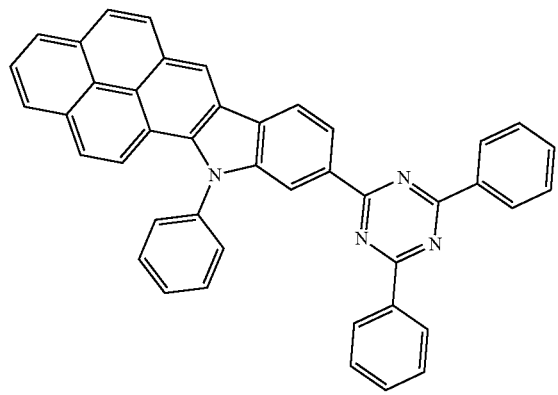
84
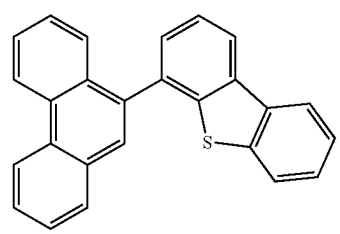
85
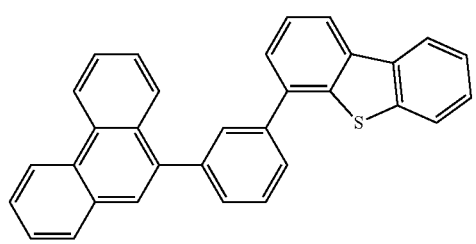
86
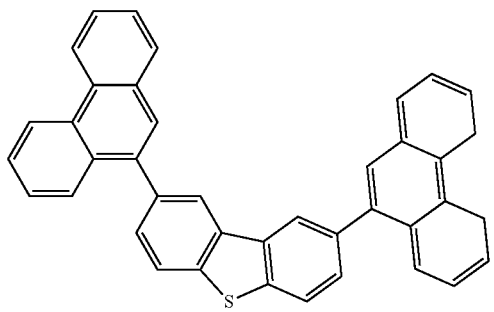
87
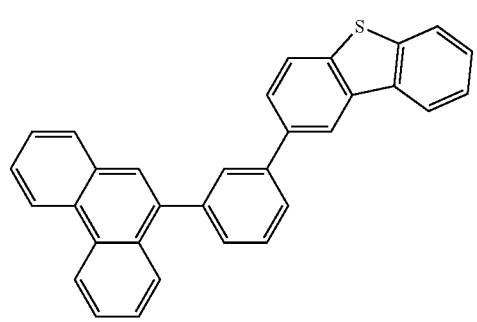
88
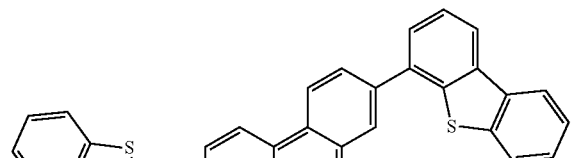
89
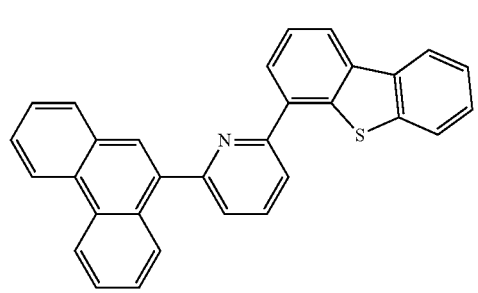
90
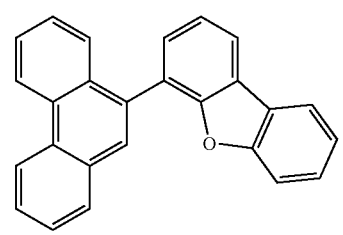
91
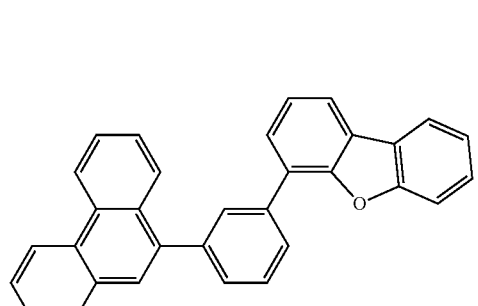
92
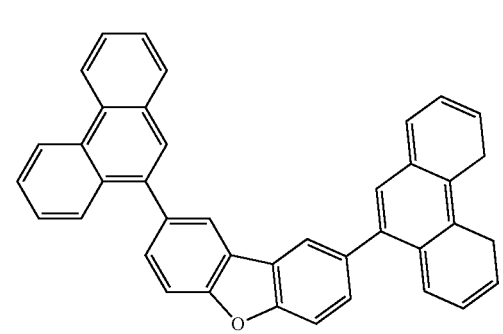

93
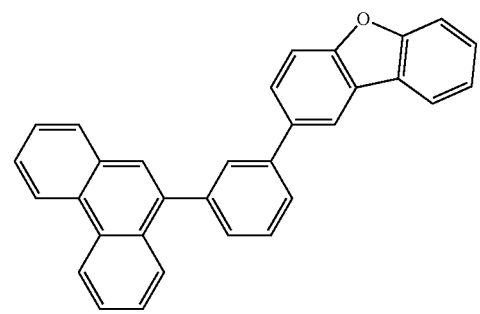
94
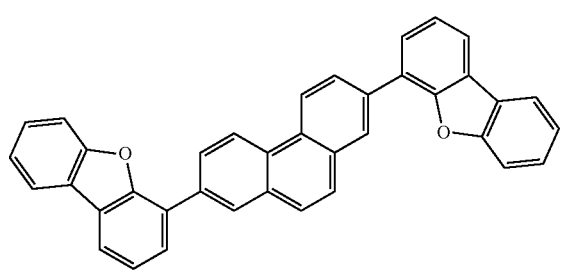
95
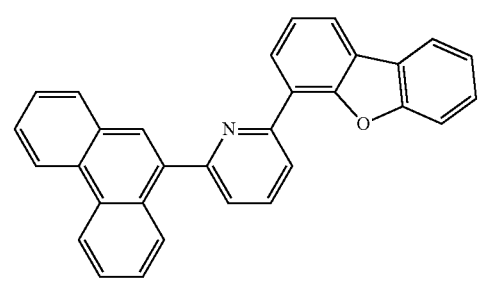
96
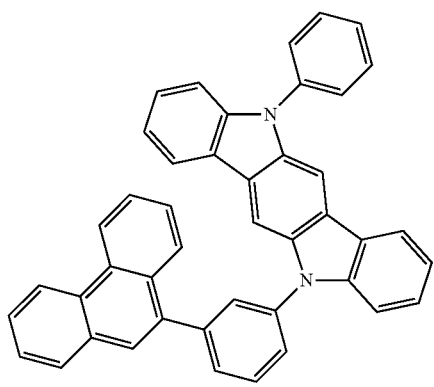
97
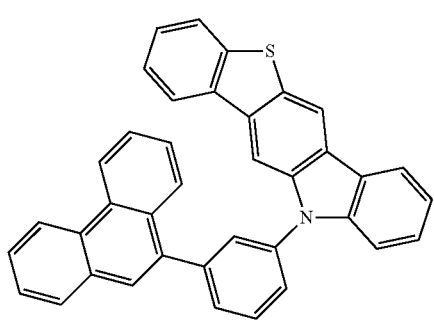
98
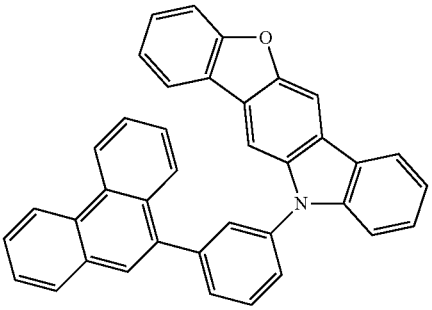
99
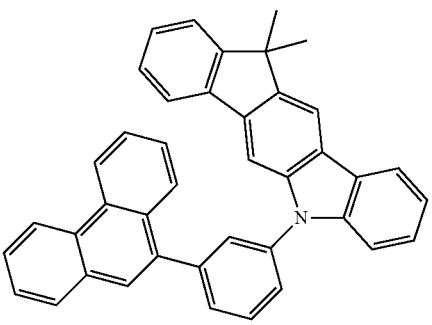
100
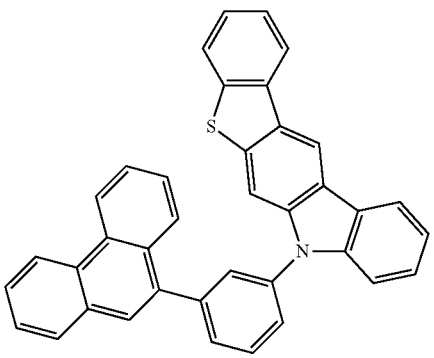
101
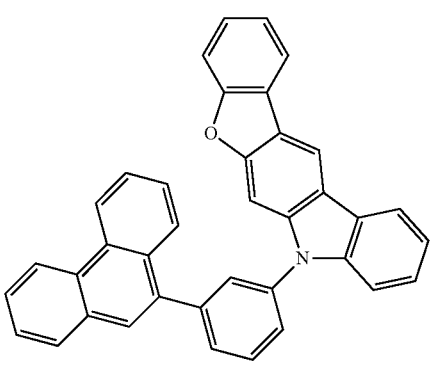

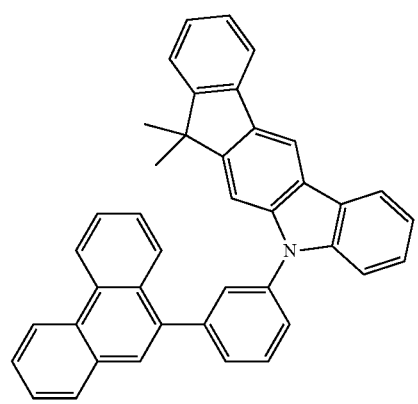
102
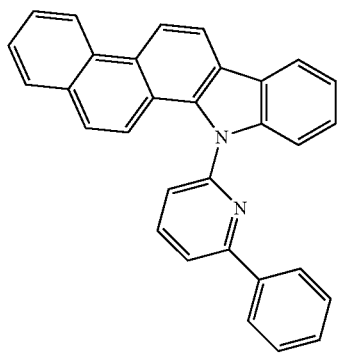
106
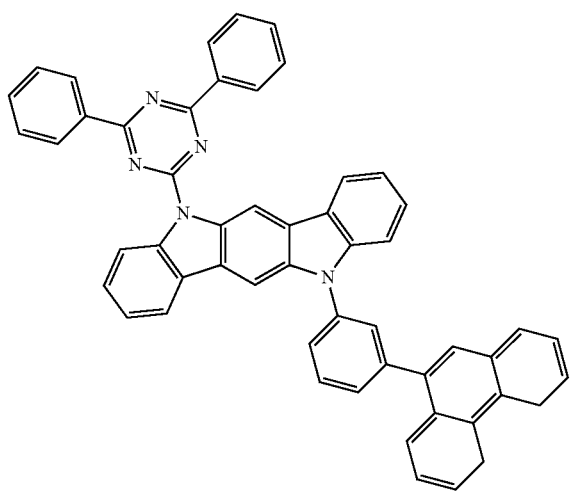
103
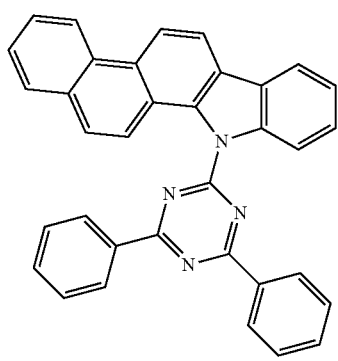
107
104
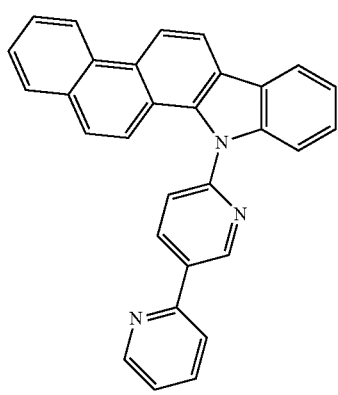
108
105
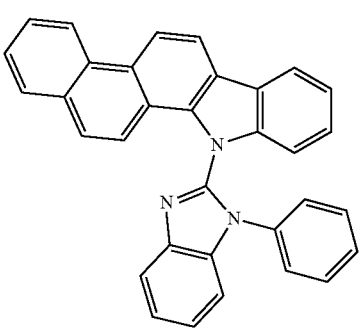
109

110
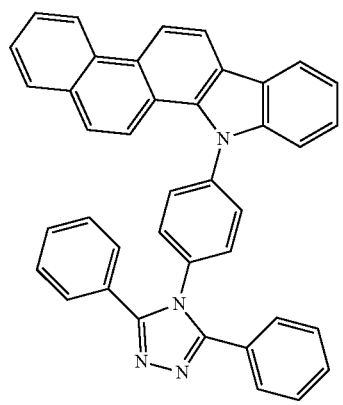
111
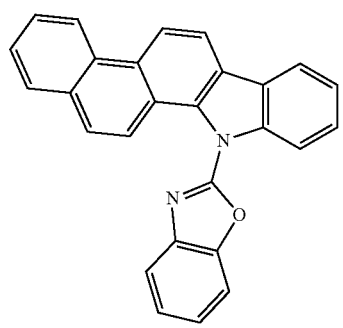
112
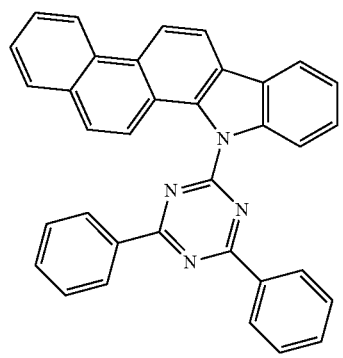
113
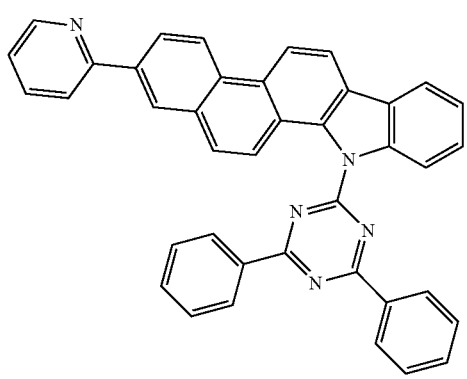
114
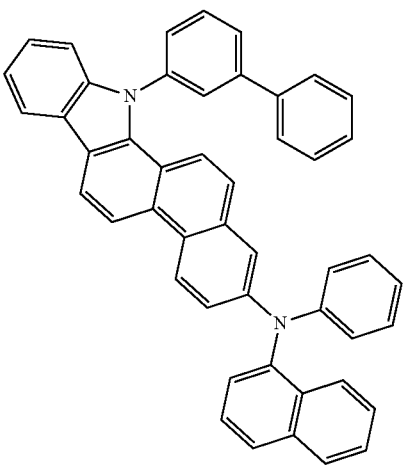
115
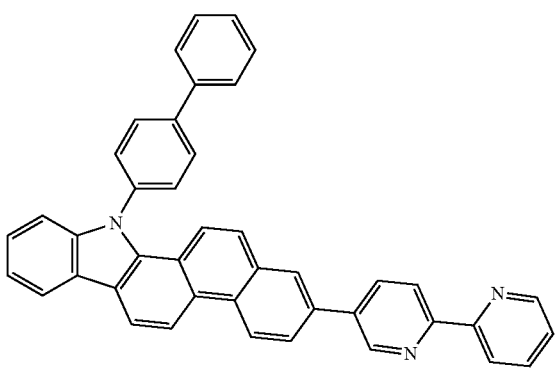
116

Referring now to Formulae 4 and 5, non-limiting examples of the compounds represented by Formulae 4 and 5 include compounds 200 to 230:
200
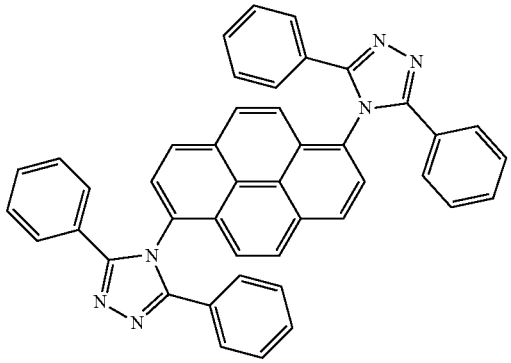
201
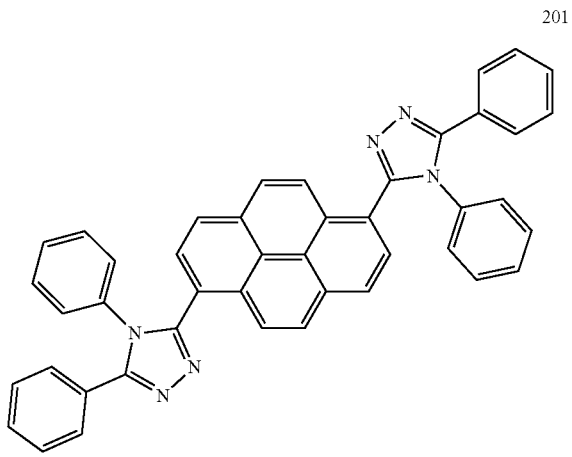
202
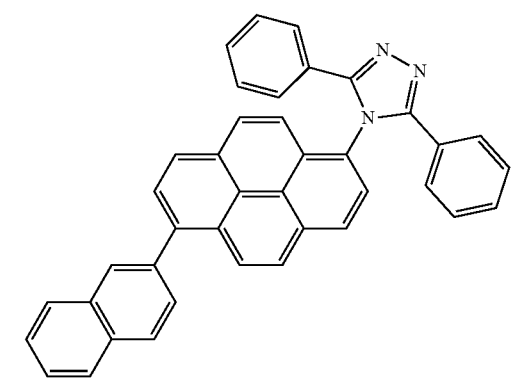
-continued
203
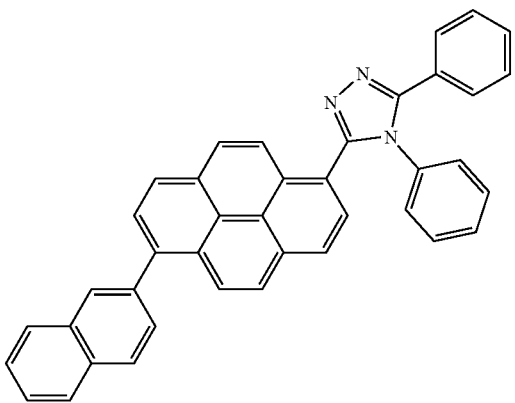
204
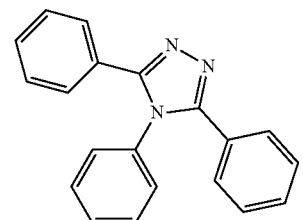
205
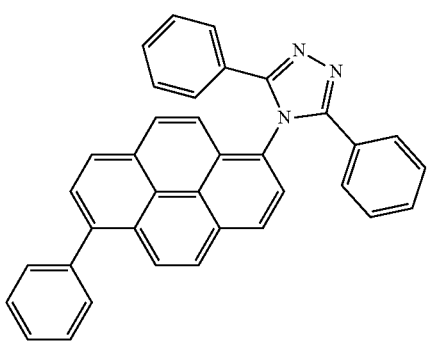

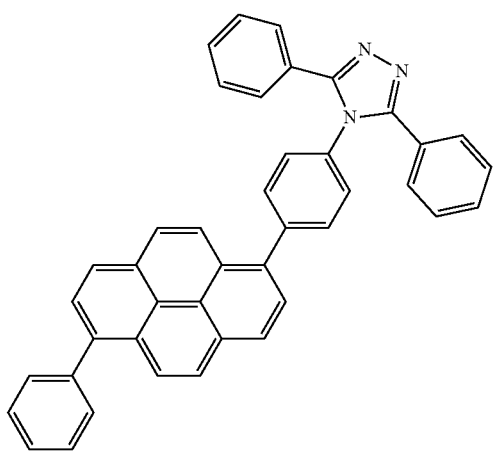
206
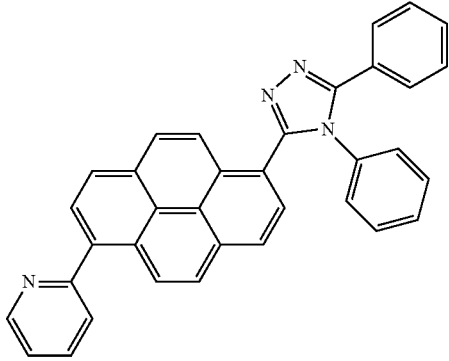
209
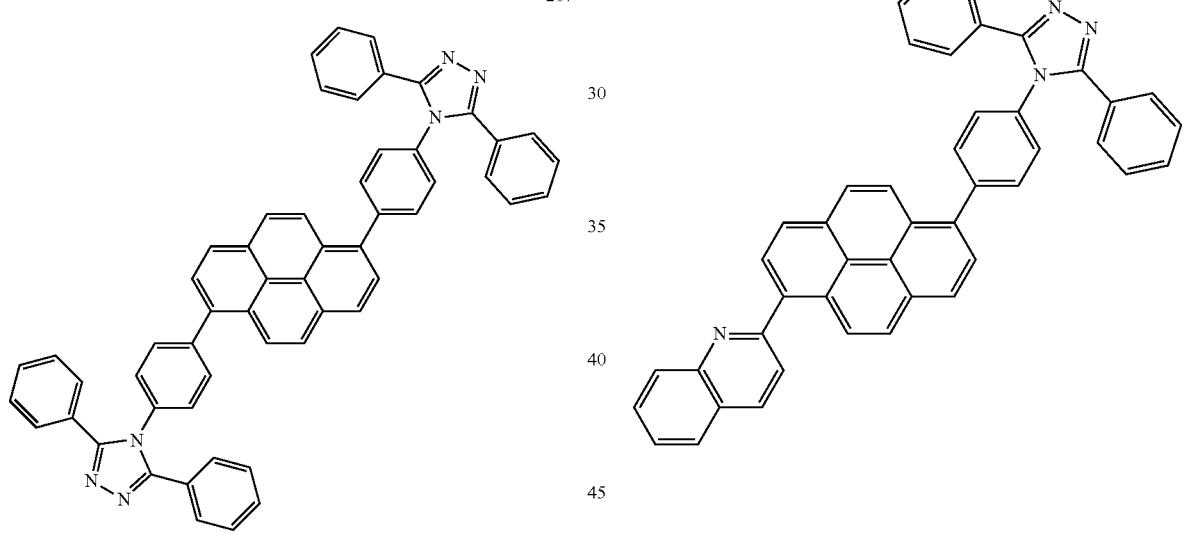
207
210
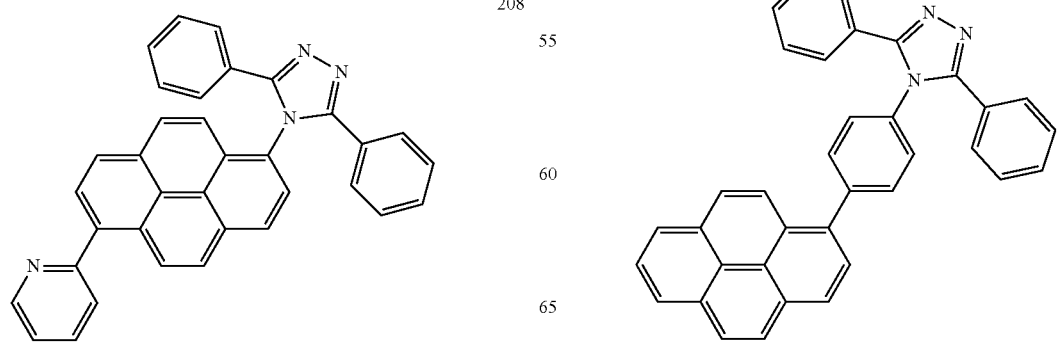
208
211

212
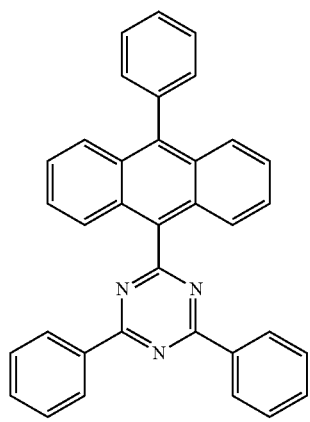
213
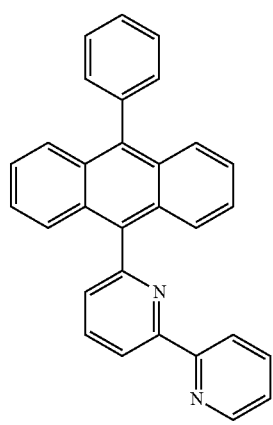
214
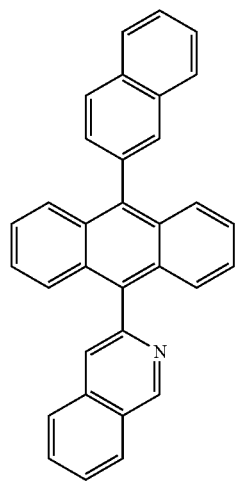
215
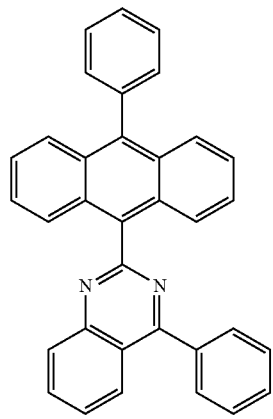
216
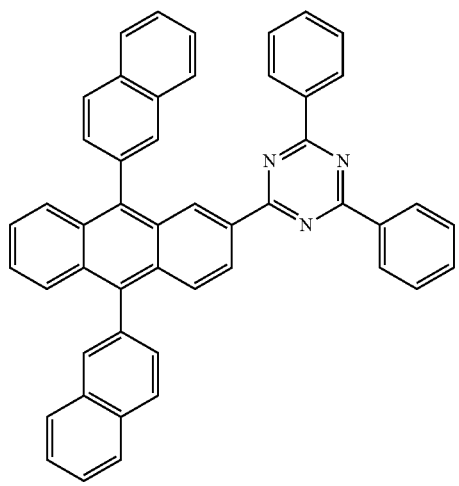
217
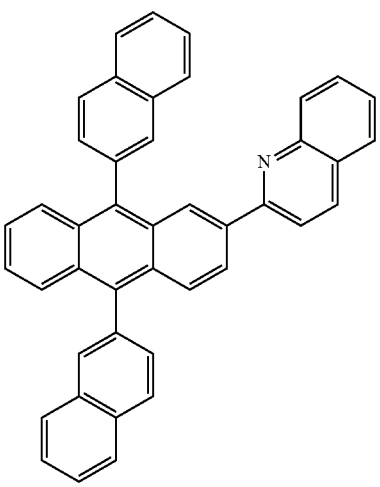

218
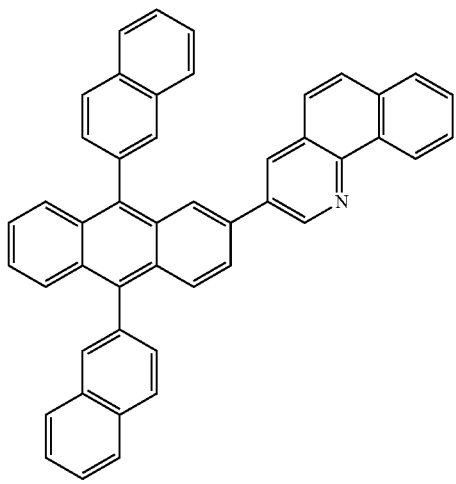
219
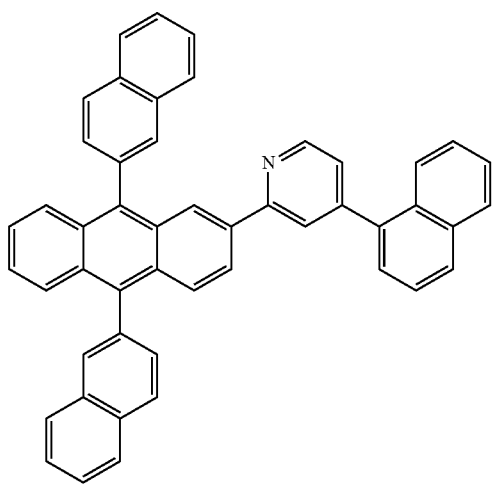
220
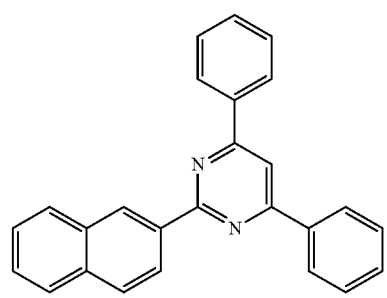
221
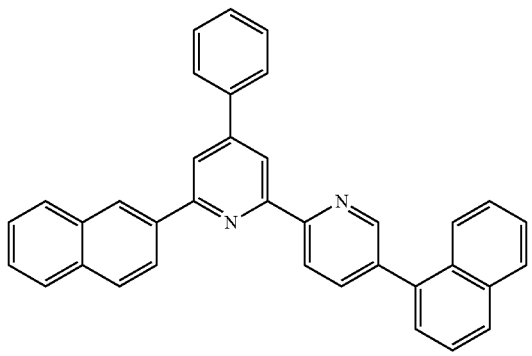
222
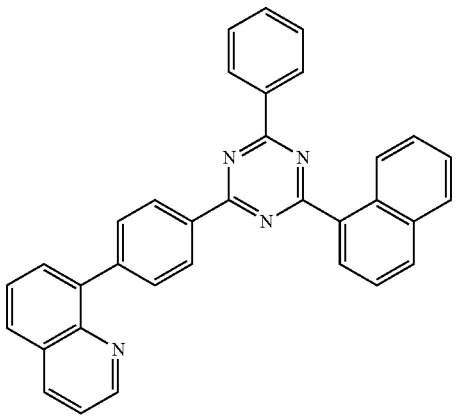
223
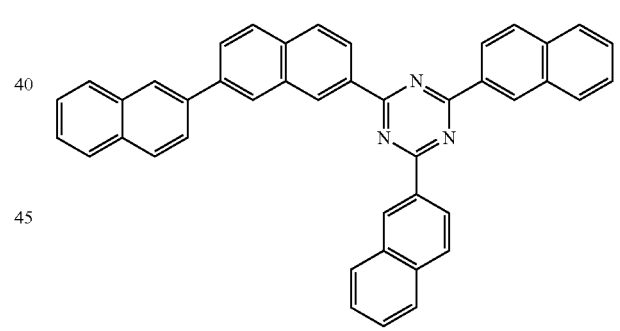
224
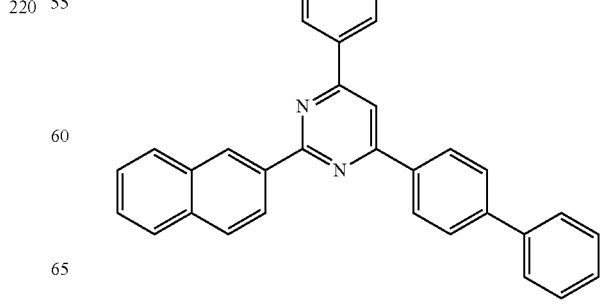

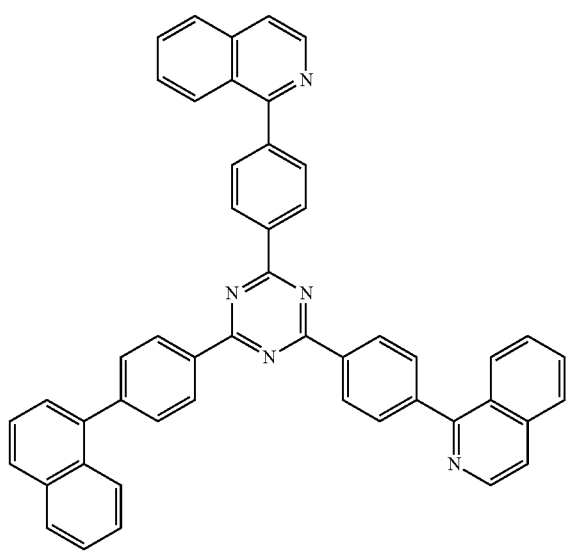

225

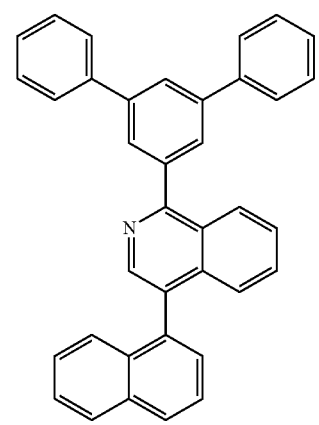

226

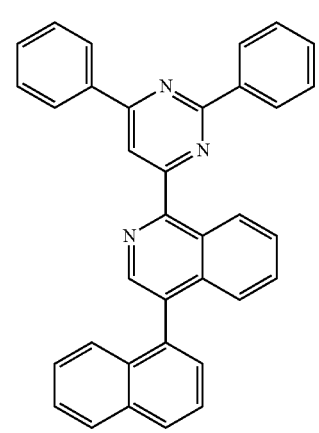

227

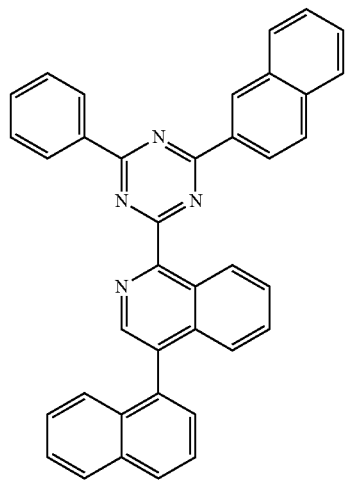

228

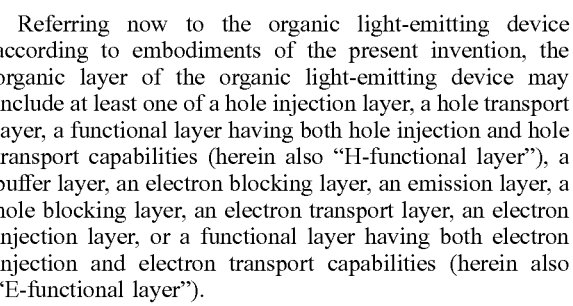

229

230

Referring now to the organic light-emitting device according to embodiments of the present invention, the organic layer of the organic light-emitting device may include at least one of a hole injection layer, a hole transport layer, a functional layer having both hole injection and hole transport capabilities (herein also "H-functional layer"), a buffer layer, an electron blocking layer, an emission layer, a hole blocking layer, an electron transport layer, an electron injection layer, or a functional layer having both electron injection and electron transport capabilities (herein also "E-functional layer").

For example, the organic layer may include an emission layer and an electron transporting layer.

In some embodiments, the organic layer may further include at least one of an electron injection layer, a hole injection layer, a hole transport layer, or a functional layer having both hole injection and transport capabilities.

The emission layer may include an anthracene-based compound, an arylamine-based compound or a styryl-based compound. The organic layer may include one of a red emission layer, a green emission layer, a blue emission layer, and/or a white emission layer. At least one of the red, green, blue and/or white emission layers may include a phosphorescent compound. At least one of the hole injection layer, the hole transport layer, or the functional layer having hole injection and hole transport capabilities may include a charge-generating material. In some embodiments, the charge-generating material may be a p dopant, such as a quinone derivative, a metal oxide or a cyano group-containing compound.

In some embodiments, the organic layer may include an electron transport layer. The electron transport layer may include an electron-transporting organic compound and a metal complex. The metal complex may be a lithium (Li) complex.

The term "organic layer," as used herein, refers to a single layer or a plurality of layers between the first electrode and the second electrode of the organic light-emitting device.

The organic layer may include an emission layer. The emission layer may include the compound of Formula 1, Formula 2, and/or Formula 3. The organic layer may further include at least one of a hole injection layer, a hole transport layer, or a functional layer having both hole injection and hole transport capabilities. At least one of the hole injection layer, the hole transport layer, and the functional layer having both hole injection and hole transport capabilities may include the compound of Formula 1, Formula 2, and/or Formula 3.

The drawing is a schematic sectional view of an organic light-emitting device according to an embodiment of the present invention. Hereinafter, a structure of an organic light-emitting device according to an embodiment of the present invention and a method of manufacturing the same are described with reference to the drawing.

A substrate may include any suitable substrate commonly used in organic light emitting devices. In some embodiments, the substrate is a glass substrate or a transparent plastic substrate with suitable mechanical strength, thermal stability, transparency, surface smoothness, ease of handling, and/or water resistance.

The first electrode may be formed on the substrate by depositing (e.g., by sputtering) a first electrode-forming material on the substrate. When the first electrode is an anode, a material having a high work function may be used as the first electrode-forming material to facilitate hole injection. The first electrode may be a reflective electrode or a transmission electrode (e.g., a transparent or transmissive electrode). Transparent and conductive materials such as ITO, IZO, $SnO_2$, or ZnO may be used to form the first electrode as a transmission electrode. Reflective materials such as magnesium (Mg), aluminum (Al), aluminum-lithium (Al—Li), calcium (Ca), magnesium-indium (Mg—In), magnesium-silver (Mg—Ag), or the like may be used to form the first electrode as a reflective electrode.

The first electrode may have a single-layer structure or a multi-layer structure including at least two layers. For example, the first electrode may have a three-layered structure of ITO/Ag/ITO, but the first electrode is not limited thereto.

In one embodiment, an organic layer is on the first electrode. The organic layer may include a hole injection layer (HIL), a hole transport layer (HTL), a buffer layer, an emission layer (EML), an electron transport layer (ETL), and/or an electron injection layer (EIL).

The HIL may be formed on the first electrode by vacuum deposition, spin coating, casting, Langmuir-Blodgett (LB) deposition, or the like. When the HIL is formed using vacuum deposition, the vacuum deposition conditions may vary depending on the compound that is used to form the HIL, and the desired structural and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the spin coating conditions may vary depending on the compound that is used to form the HIL, and the desired structural and thermal properties of the HIL to be formed. For example, the coating rate may be about 2000 rpm to about 5000 rpm, and the temperature at which heat treatment is performed to remove the solvent after coating may be about 80° C. to about 200° C. However, the coating conditions are not limited thereto.

The HIL may be formed of any suitable material commonly used to form an HIL. Non-limiting examples of the material that can be used to form the HIL include N,N'-diphenyl-N,N'-bis-[4-(phenyl-m-tolyl-amino)-phenyl]-biphenyl-4,4'-diamine, (DNTPD), a phthalocyanine compound such as copperphthalocyanine, 4,4',4"-tris (3-methylphenylphenylamino) triphenylamine (m-MT-DATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

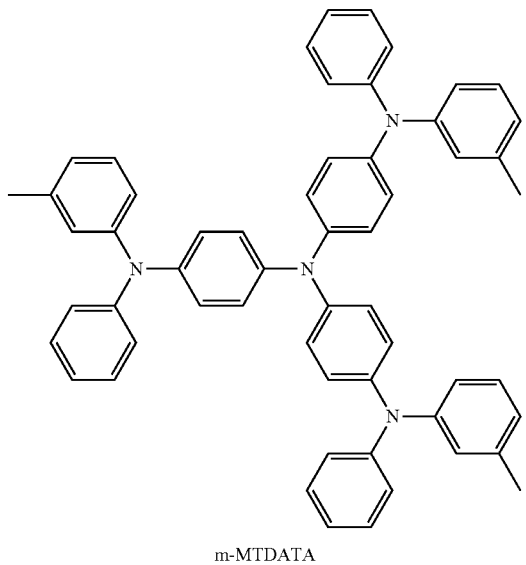

m-MTDATA

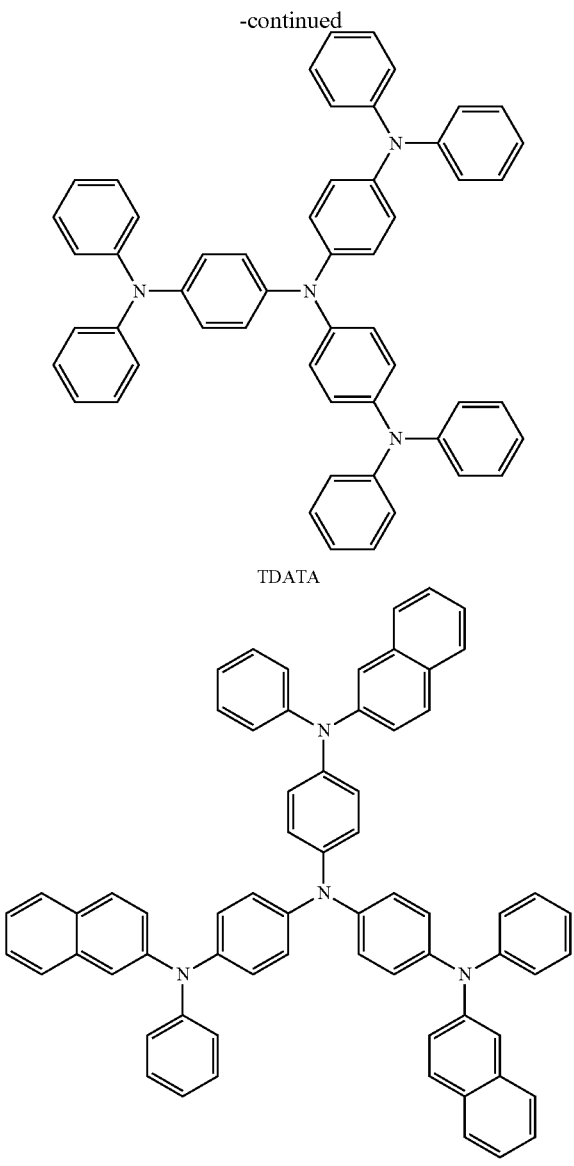

TDATA

2-TNATA

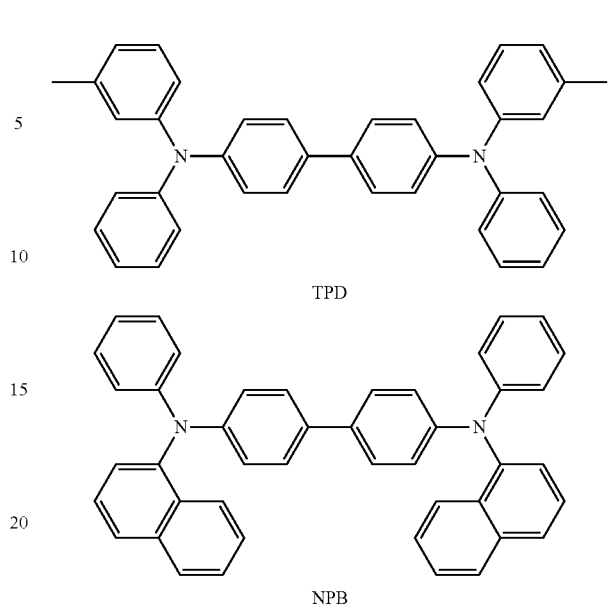

TPD

NPB

In some embodiments, the thickness of the HIL may be about 100 Å to about 10000 Å, and in some embodiments, may be about 100 Å to about 1000 Å. In these embodiments, the HIL may have good hole injecting ability without a substantial increase in driving voltage.

The HTL may be formed on the HIL by vacuum deposition, spin coating, casting, Langmuir-Blodgett (LB) deposition, or the like. When the HTL is formed using vacuum deposition or spin coating, the conditions for deposition or coating may be similar to those for the formation of the HIL, with the conditions for the deposition or coating varying depending on the material that is used to form the HTL.

The HTL may be formed of any suitable hole-transporting material commonly used to form an HTL. Non-limiting examples of suitable HTL forming materials include carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine) (NPB).

In some embodiments, the thickness of the HTL may be about 50 Å to about 2000 Å, and in some embodiments, may be about 100 Å to about 1500 Å. In these embodiments, the HTL may have good hole transporting ability without a substantial increase in driving voltage.

The H-functional layer (having both hole injection and hole transport capabilities) may contain at least one hole injection material and at least one hole transport material. In some embodiments, the thickness of the H-functional layer may be about 500 Å to about 10,000 Å, and in some embodiments, may be about 100 Å to about 1000 Å. In these embodiments, the H-functional layer may have good hole injection ability and good hole transport ability without a substantial increase in driving voltage.

In some embodiments, at least one of the HIL, the HTL, or the H-functional layer may include a compound of Formula 300 and/or a compound of Formula 350:

Formula 300

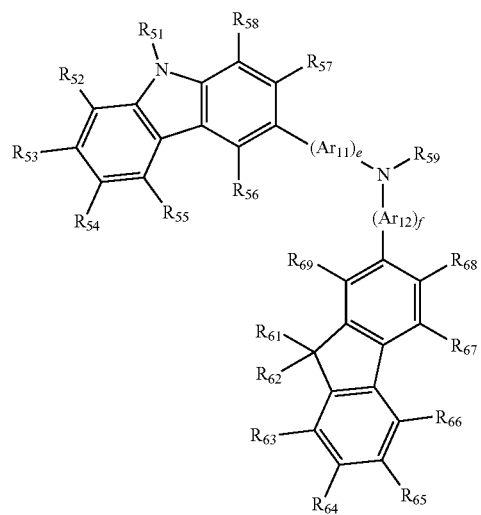

Formula 350

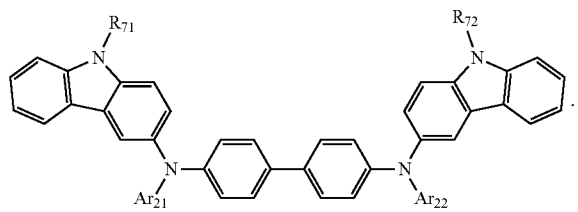

In Formulae 300 and 350, $Ar_{11}$ and $Ar_{12}$ may each independently be a substituted or unsubstituted $C_6$-$C_{60}$ arylene group, and $Ar_{21}$ and $Ar_{22}$ may each independently be a substituted or unsubstituted $C_6$-$C_{60}$ aryl group.

In Formula 300, e and f may each independently be an integer of 0 to 5 (e.g., 0, 1, or 2) and when one or more of e or f is an integer of 2 or more, the two or more corresponding $Ar_{11}$s or $Ar_{12}$s may be the same or different. For example, e may be 1, and f may be 0, but e and f are not limited thereto.

In Formulae 300 and 350 above, $R_{51}$ to $R_{58}$, $R_{61}$ to $R_{69}$, and $R_{71}$ and $R_{72}$ may each independently be a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group. In some embodiments, $R_{51}$ to $R_{58}$, $R_{61}$ to $R_{69}$, $R_{71}$, and $R_{72}$ may each independently be a hydrogen atom; a deuterium atom; a halogen atom; a hydroxyl group; a cyano group; a nitro group; an amino group; an amidino group; a hydrazine group; a hydrazone group; a carboxyl group or a salt thereof; a sulfonic acid group or a salt thereof; a phosphoric acid group or a salt thereof; an unsubstituted $C_1$-$C_{10}$ alkyl group (for example, a methyl group, an ethyl group, a propyl group, a butyl group, a pentyl group, a hexyl group, or the like); an unsubstituted $C_1$-$C_{10}$ alkoxy group (for example, a methoxy group, an ethoxy group, a propoxy group, a butoxy group, a pentoxy group, or the like); a $C_1$-$C_{10}$ alkyl group or $C_1$-$C_{10}$ alkoxy group substituted with at least one of a deuterium atom, a halogen atom, a hydroxyl group, a cyano group, a nitro group, an amino group, an amidino group, a hydrazine group, a hydrazone group, a carboxyl group or a salt thereof, sulfonic acid group or a salt thereof, and/or a phosphoric acid group or a salt thereof; a phenyl group; a naphthyl group; an anthryl group; a fluorenyl group; a pyrenyl group; or a phenyl group, a naphthyl group, an anthryl group, a fluorenyl group, or a pyrenyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{10}$ alkyl group, or a $C_1$-$C_{10}$ alkoxy group.

In Formula 300, $R_{109}$ may be a phenyl group, a naphthyl group, an anthryl group, a biphenyl group, a pyridyl group; or a phenyl group, a naphthyl group, an anthryl group, a biphenyl group, or a pyridyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{20}$ alkyl group, or a substituted or unsubstituted $C_1$-$C_{20}$ alkoxy group.

In an embodiment, the compound of Formula 300 may be a compound represented by Formula 300A:

Formula 300A

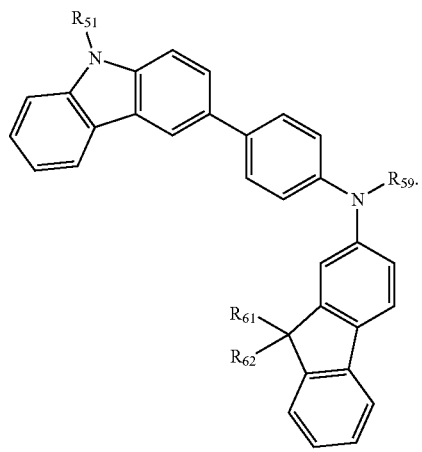

In Formula 300A, $R_{51}$, $R_{61}$, $R_{62}$, and $R_{59}$ are the same as already described in connection with Formula 300.

In some non-limiting embodiments, at least one of the HIL, the HTL, or the H-functional layer may include at least one of Compounds 301 to 320:

301

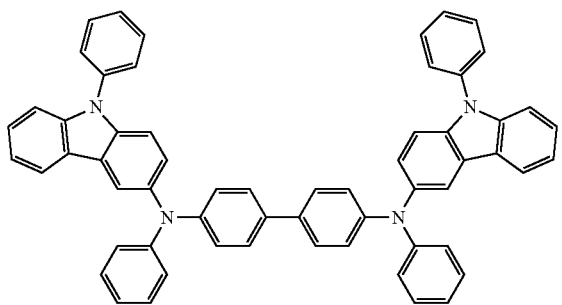

302

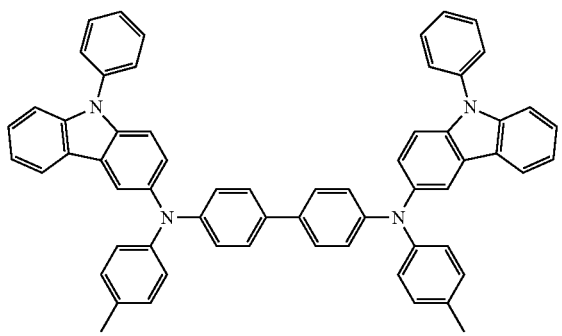

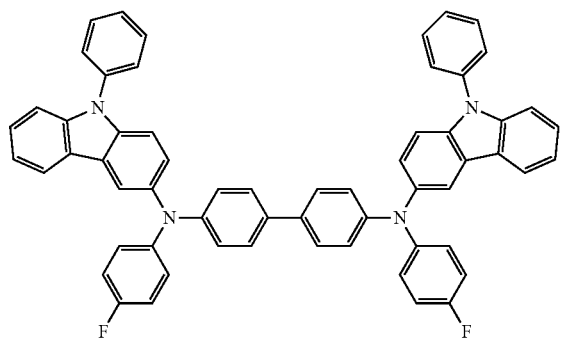
303
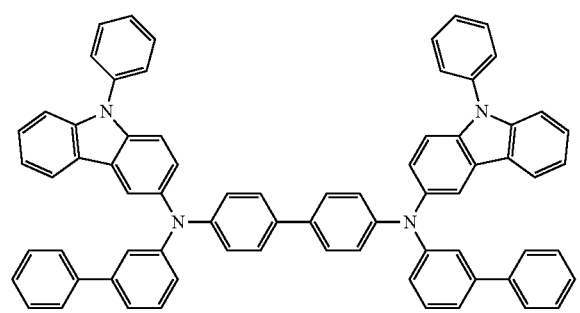
307
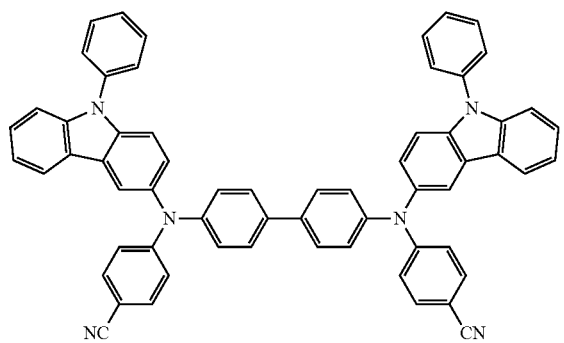
304
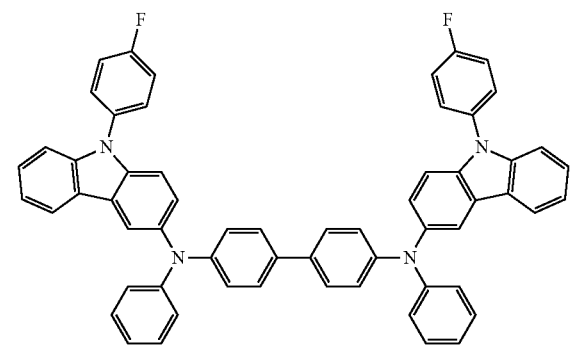
308
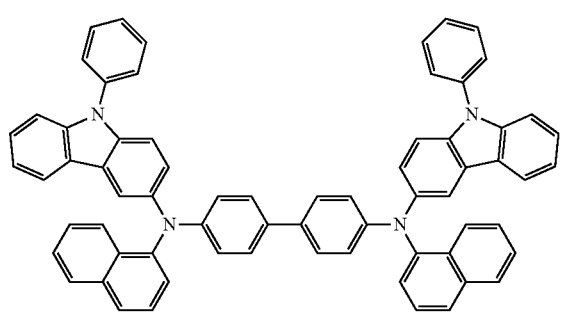
305
306
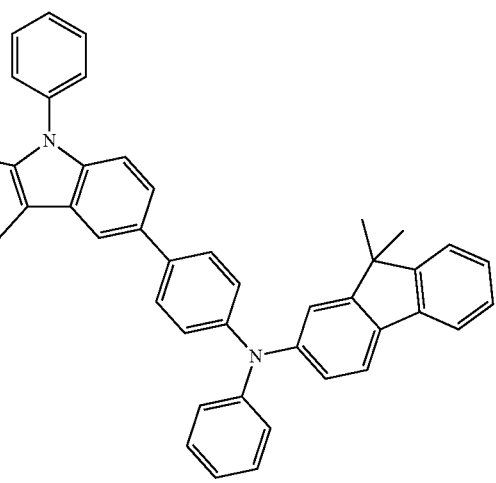
309

310
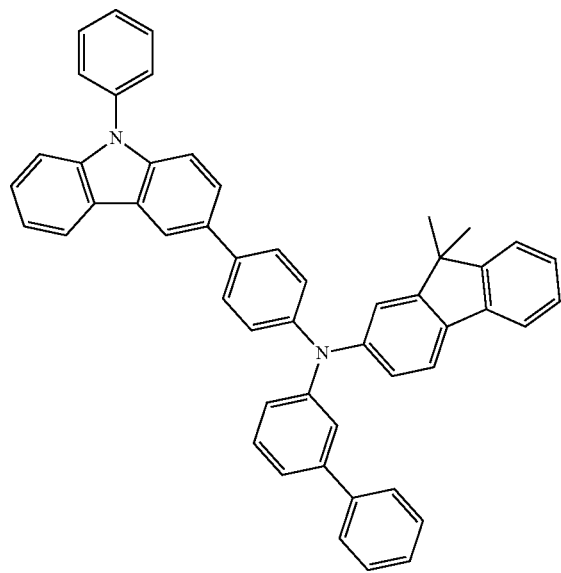
311
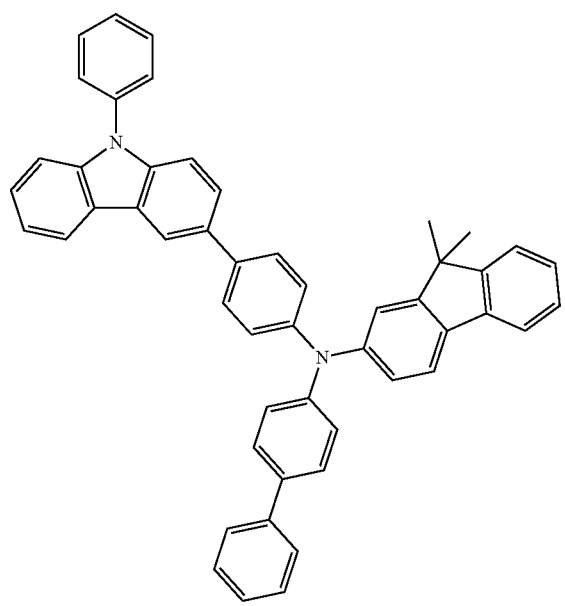
312
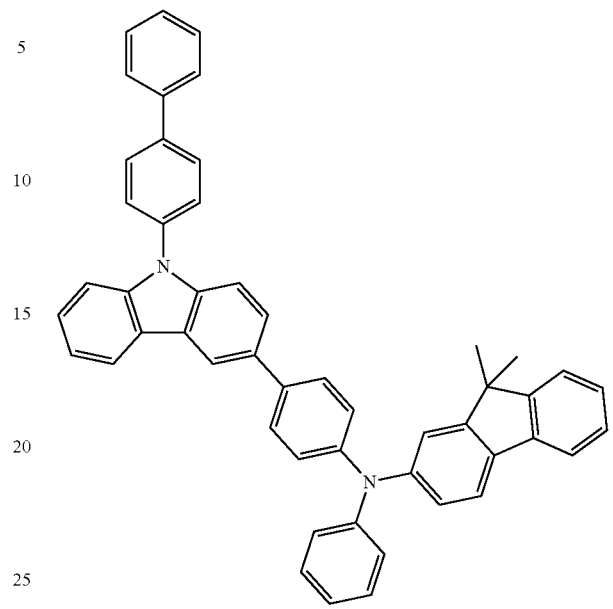
313
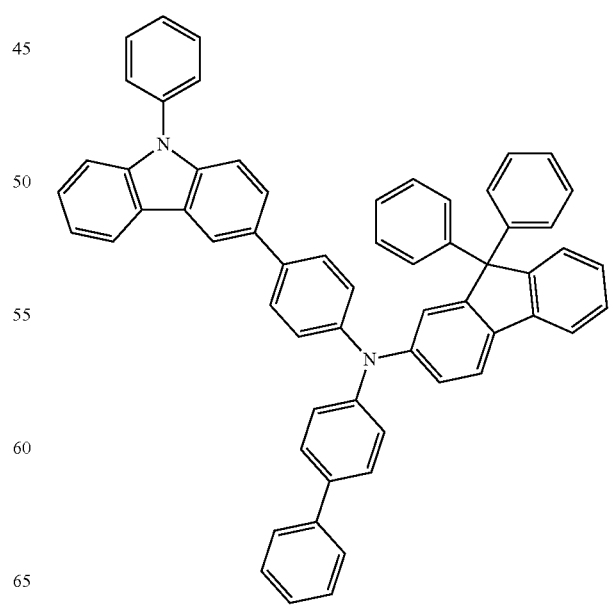

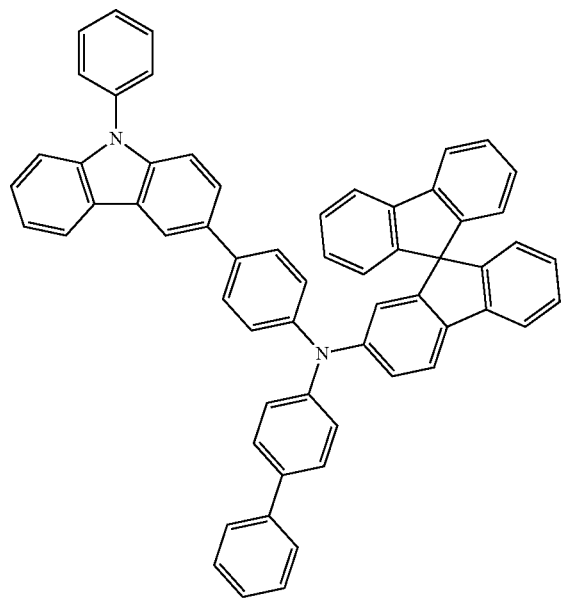
314
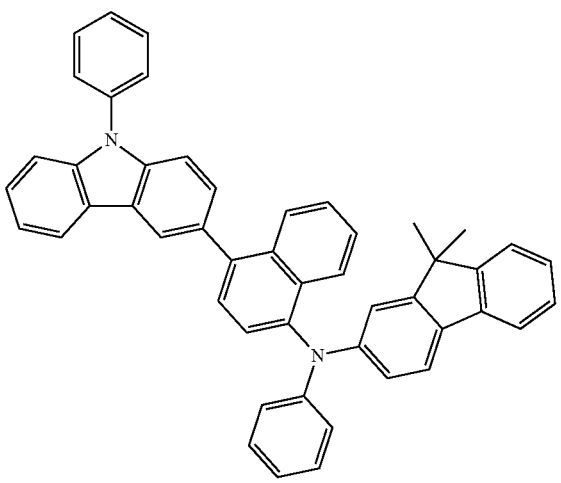
316
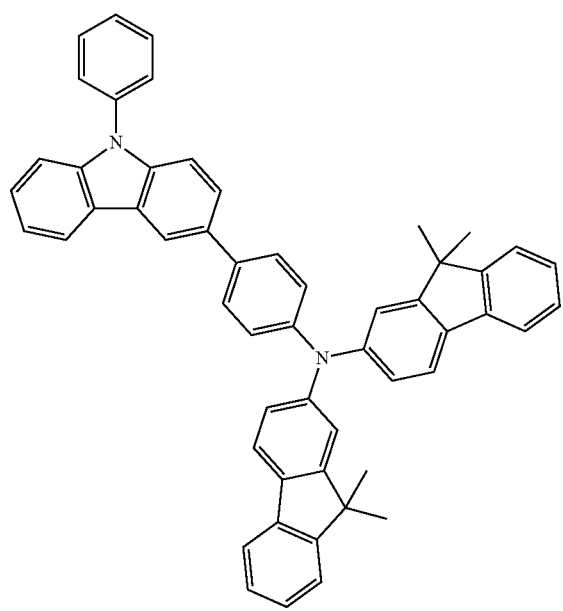
315
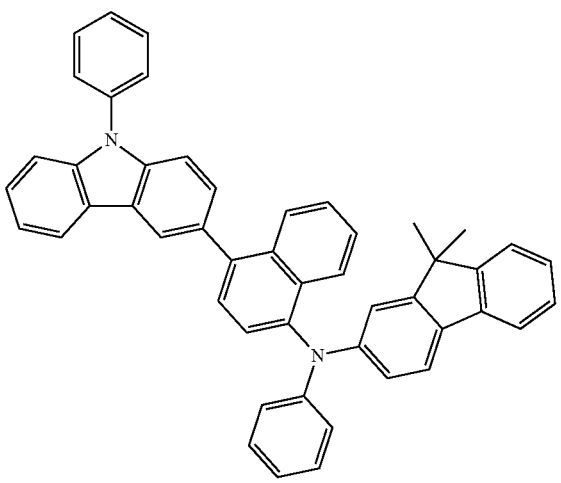
317

318

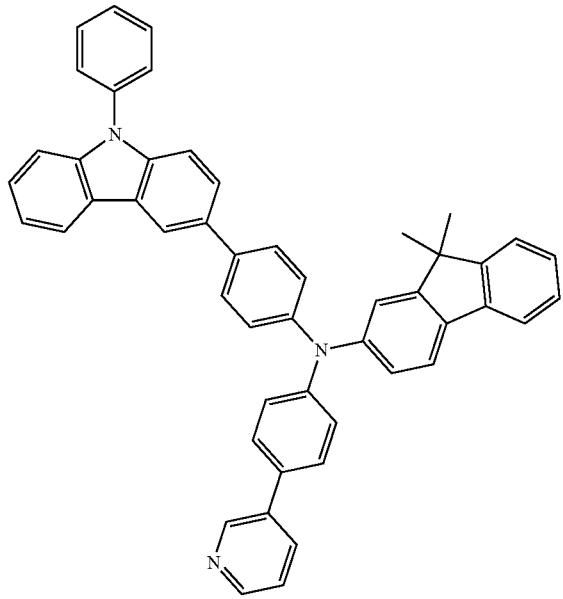

319

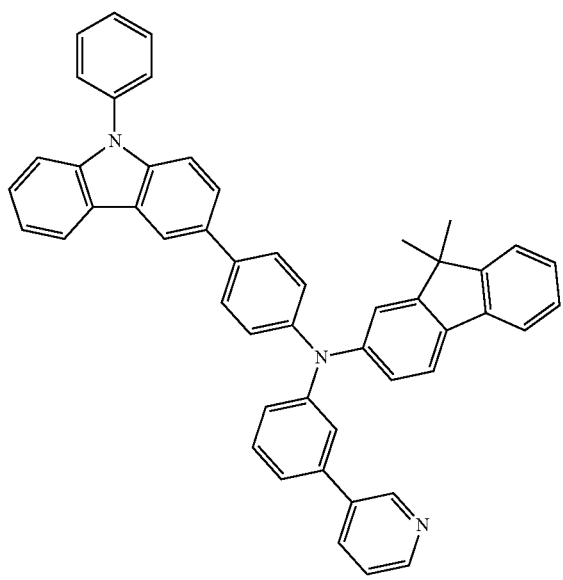

320

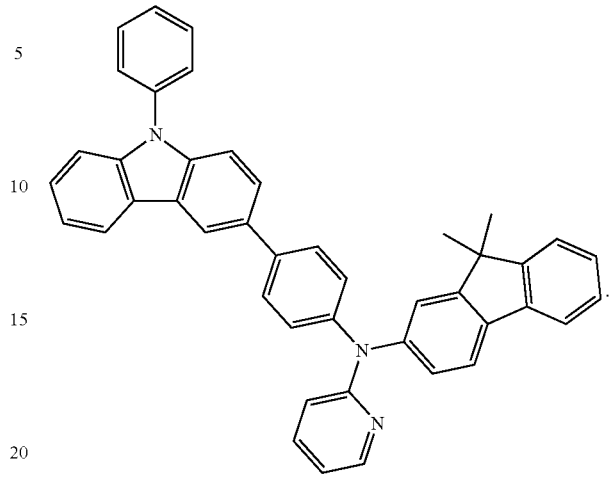

To improve conductivity, at least one of the HIL, the HTL, or the H-functional layer may further include a charge-generating material in addition to the hole injecting material, the hole transport material, and/or the material having hole injection and hole transport capabilities.

The charge-generating material may be, for example, a p-dopant. The p-dopant may be a quinone derivative, a metal oxide, or a cyano-containing compound, but the p-dopant is not limited thereto. Non-limiting examples of the p-dopant include quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200:

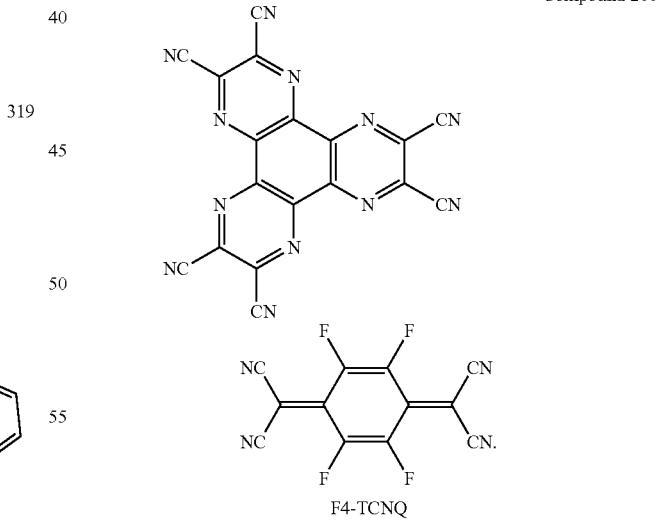

Compound 200

F4-TCNQ

When the hole injection layer, the hole transport layer, and/or the H-functional layer further includes a charge-generating material, the charge-generating material may be homogeneously distributed or non-homogeneously distributed therein.

A buffer layer may be included between the EML and at least one of the HIL, the HTL, or the H-functional layer. The buffer layer may compensate for an optical resonance distance of light based on the wavelength of light emitted from the EML, and thus may increase efficiency. The buffer layer may include any suitable hole injecting material and/or any suitable hole transporting material commonly used to form an HIL and/or an HTL. In some other embodiments, the buffer layer may include the same material as one of the materials included in the HIL, the HTL, or the H-functional layer underneath the buffer layer.

The EML may be formed on the HTL, the H-functional layer, or the buffer layer by vacuum deposition, spin coating, casting, Langmuir-Blodget (LB) deposition, or the like. When the EML is formed using vacuum deposition or spin coating, the deposition or coating conditions may be similar to those described above for the formation of the HIL, with the conditions for deposition or coating varying in accordance with the material used to form the EML.

The EML may be formed using the compound of Formula 1, Formula 2, Formula 3, and/or other suitable light-emitting materials commonly used to form an EML, such as hosts and dopants.

Dopants that may be used to form the EML may include any suitable fluorescent or phosphorescent dopant commonly used to form an EML.

Non-limiting examples of suitable hosts include $Alq_3$, 4,4'-N,N'-dicarbazole-biphenyl (CBP), poly(n-vinylcarbazole) (PVK), 9,10-di(naphthalene-2-yl)anthracene (DNA), TCTA, 1,3,5-tris(N-phenylbenzimidazole-2-yl)benzene (TPBI), 3-tert-butyl-9,10-di-2-naphthylanthracene (TBADN), E3, distyrylarylene (DSA), dmCBP, and Compounds 501 to 509:

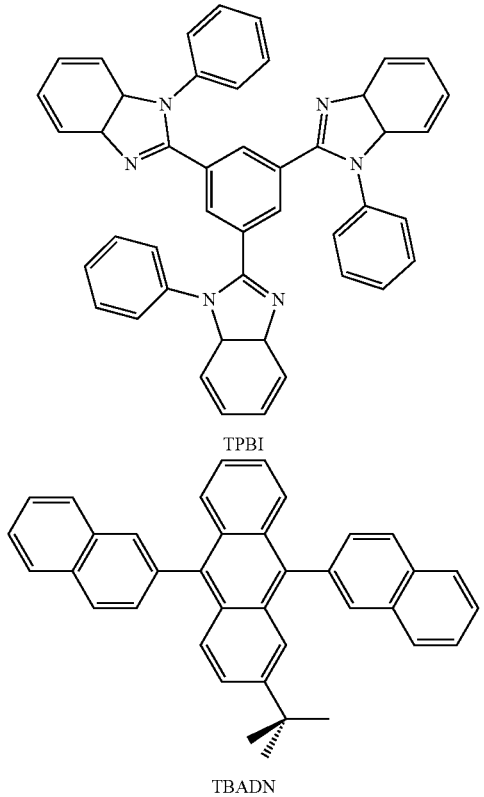

TPBI

TBADN

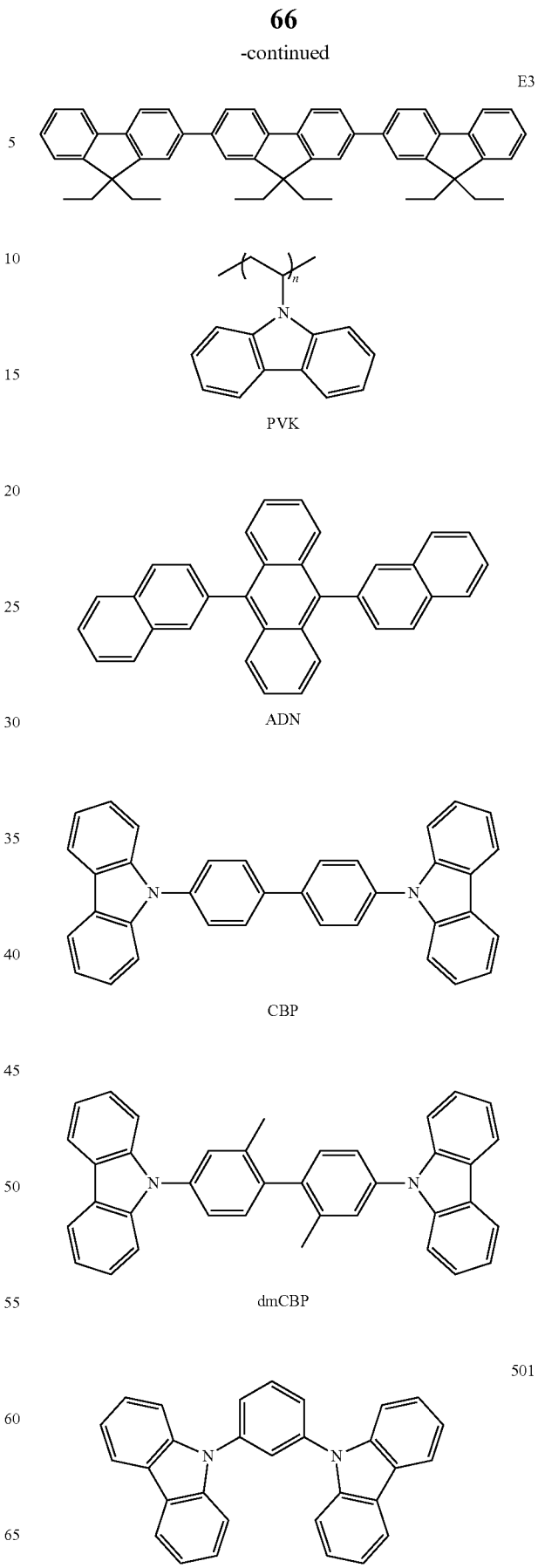

E3

PVK

ADN

CBP dmCBP

501

502
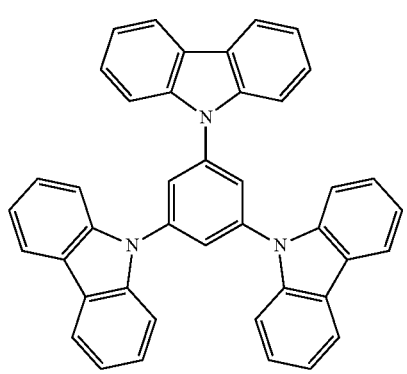
503
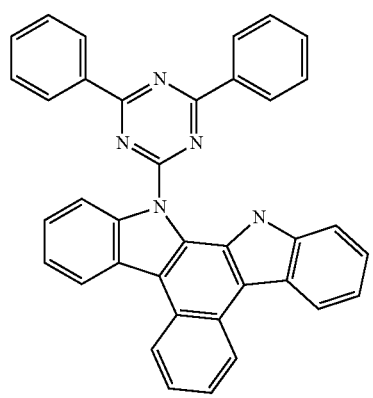
504
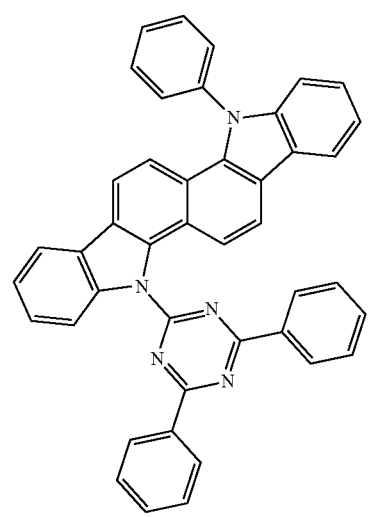
505
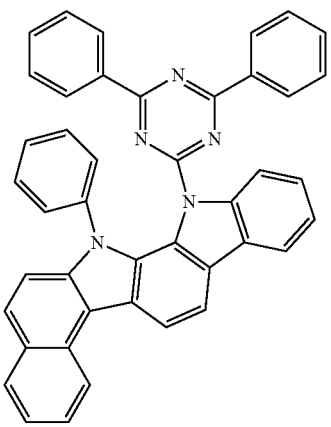
506
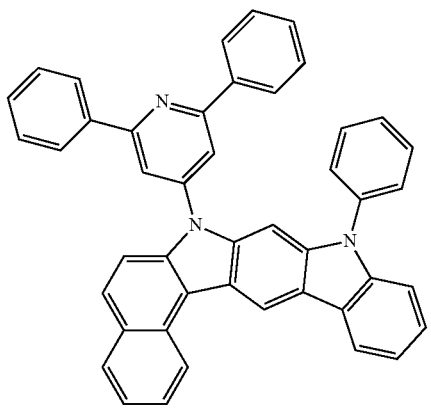
507
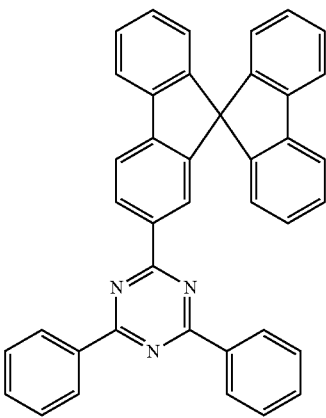
508
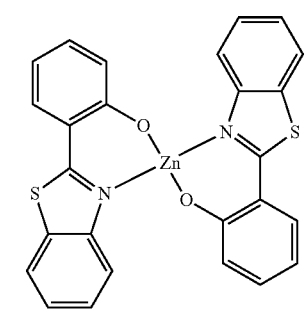

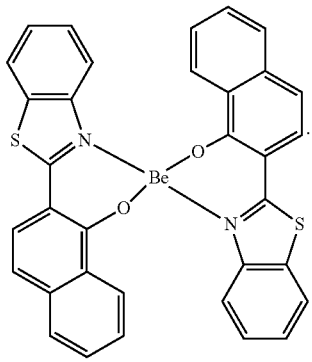

509

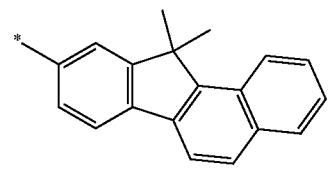 [SMILES: Cc1ccc2c(c1)C(C)(C)c1c-2ccc2ccccc12]

moiety. However, $Ar_{113}$ to $Ar_{116}$ are not limited thereto.

For example, the anthracene-based compound of Formula 400 may be one of the following compounds, but the anthracene-based compound represented by Formula 400 is not limited thereto:

In some embodiments, the host is an anthracene-based compound represented by Formula 400:

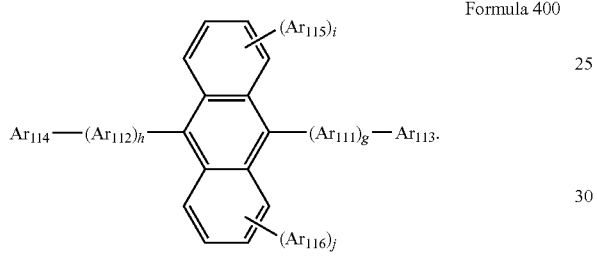

Formula 400

In Formula 400, $Ar_{111}$ and $Ar_{112}$ may each independently be a substituted or unsubstituted $C_6$-$C_{60}$ arylene group. $Ar_{113}$ to $Ar_{116}$ may each independently be a substituted or unsubstituted $C_1$-$C_{10}$ alkyl group, or a substituted or unsubstituted $C_6$-$C_{60}$ aryl group. g, h, l, and j may each independently be an integer of 0 to 4. For example, g, h, l, and j may each independently be 0, 1, or 2.

In some embodiments, $Ar_{111}$ and $Ar_{112}$ in Formula 400 may each independently be a phenylene group; a naphthalene group; a phenanthrenylene group; a fluorenyl group; a pyrenylene group; or a phenylene group, a naphthalene group, a phenanthrenylene group, a fluorenyl group, or a pyrenylene group substituted with at least one of a phenyl group, a naphthyl group, or an anthryl group.

In some embodiments, $Ar_{113}$ to $Ar_{116}$ in Formula 400 may each independently be a $C_1$-$C_{10}$ alkyl group substituted with at least one of a phenyl group, a naphthyl group, and/or an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, or a fluorenyl group substituted with a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and/or a fluorenyl group; or a

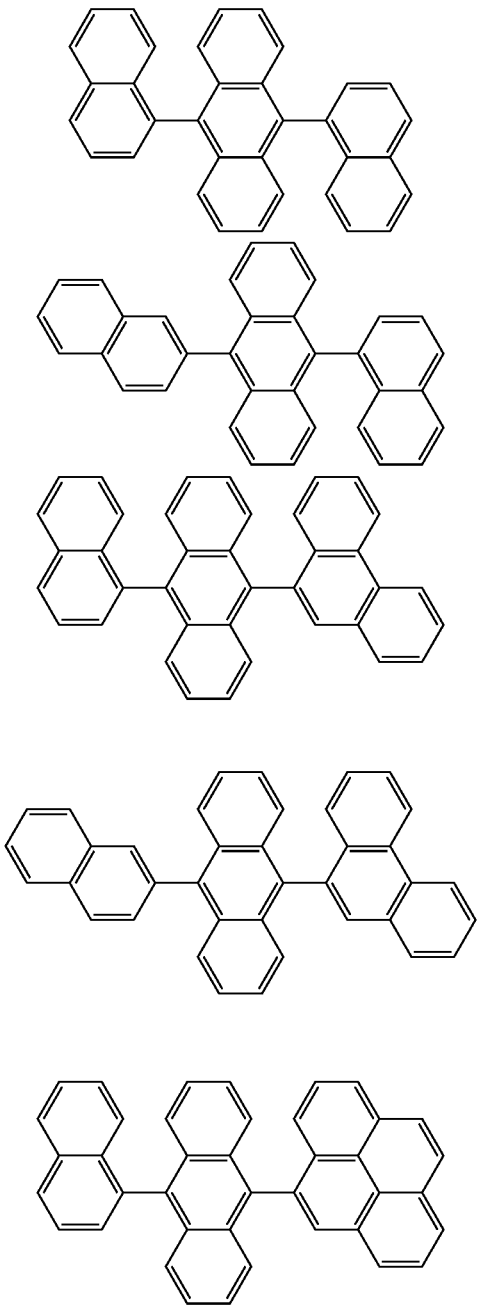

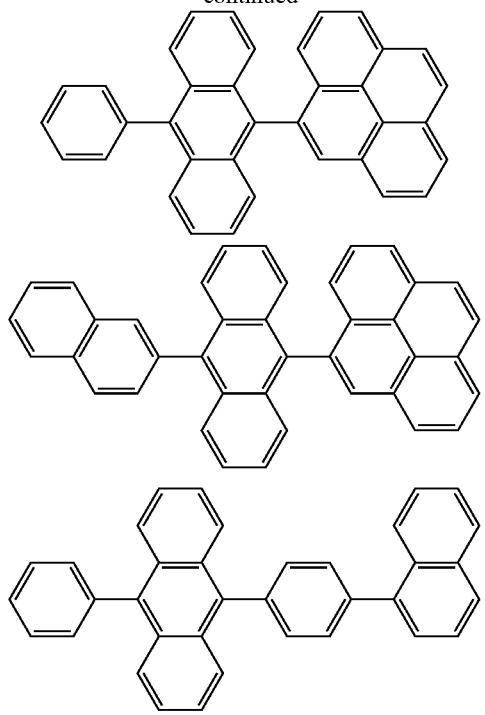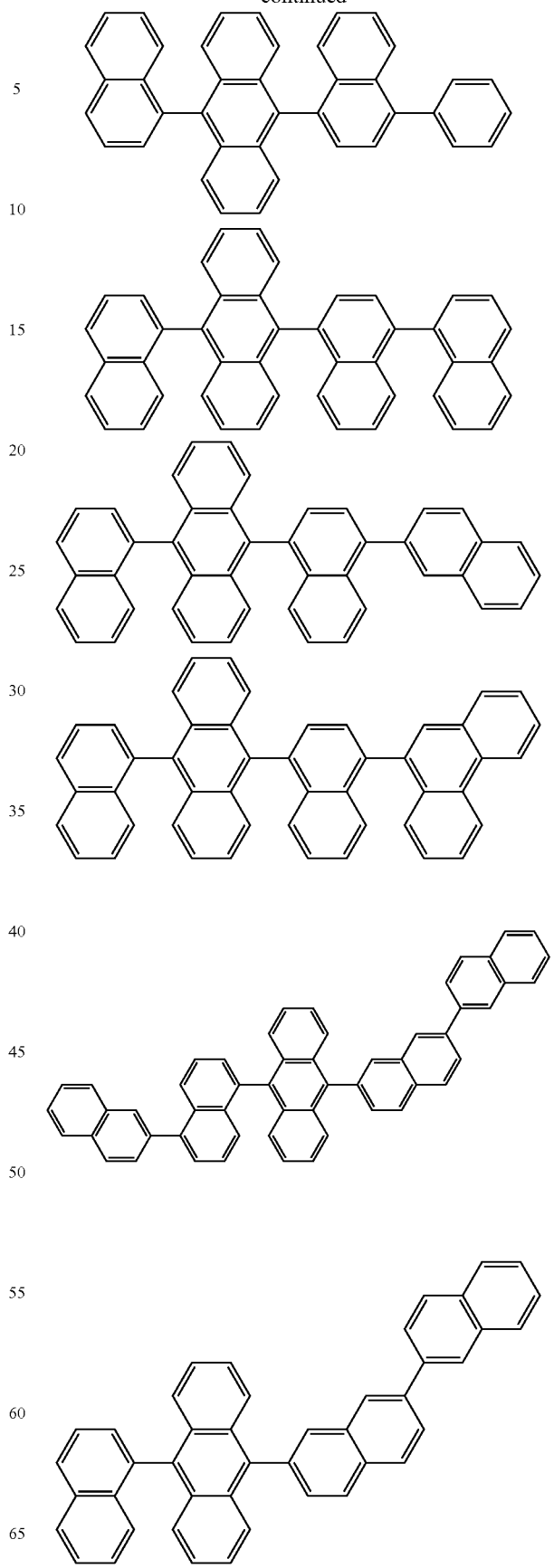

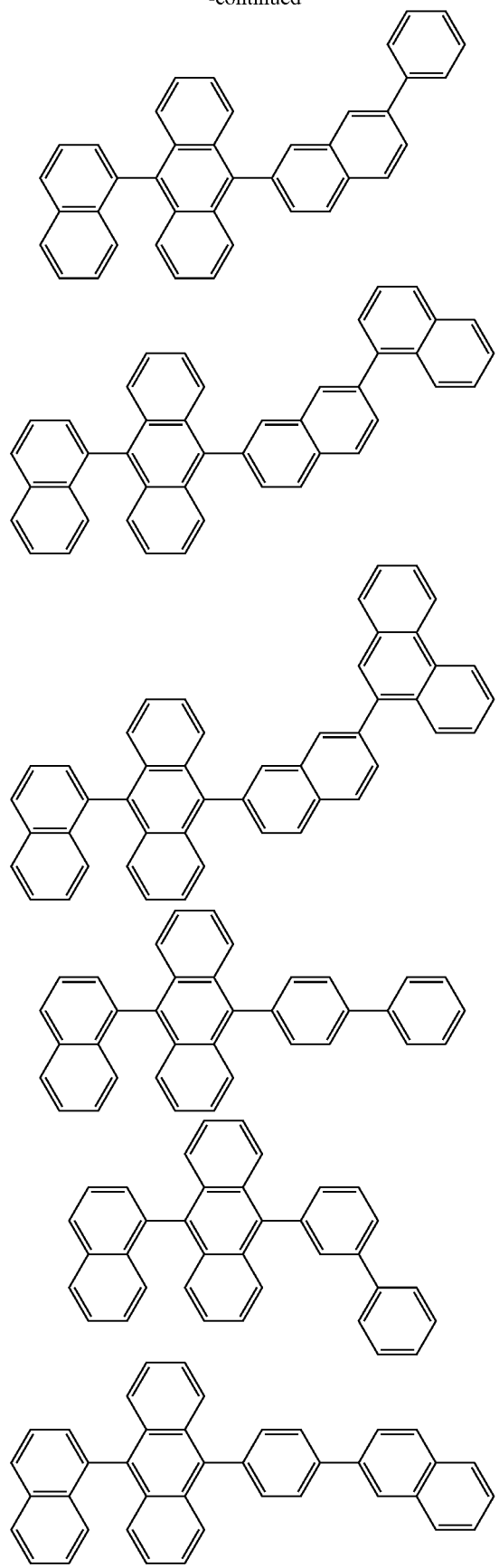
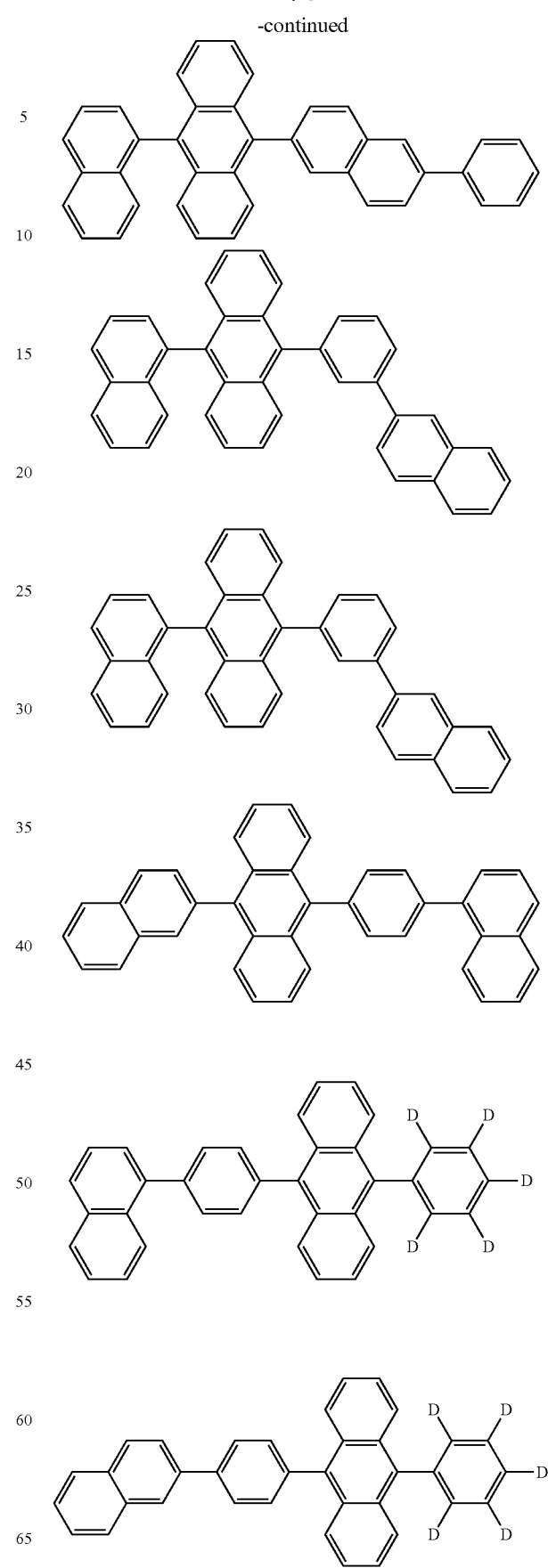

75
-continued
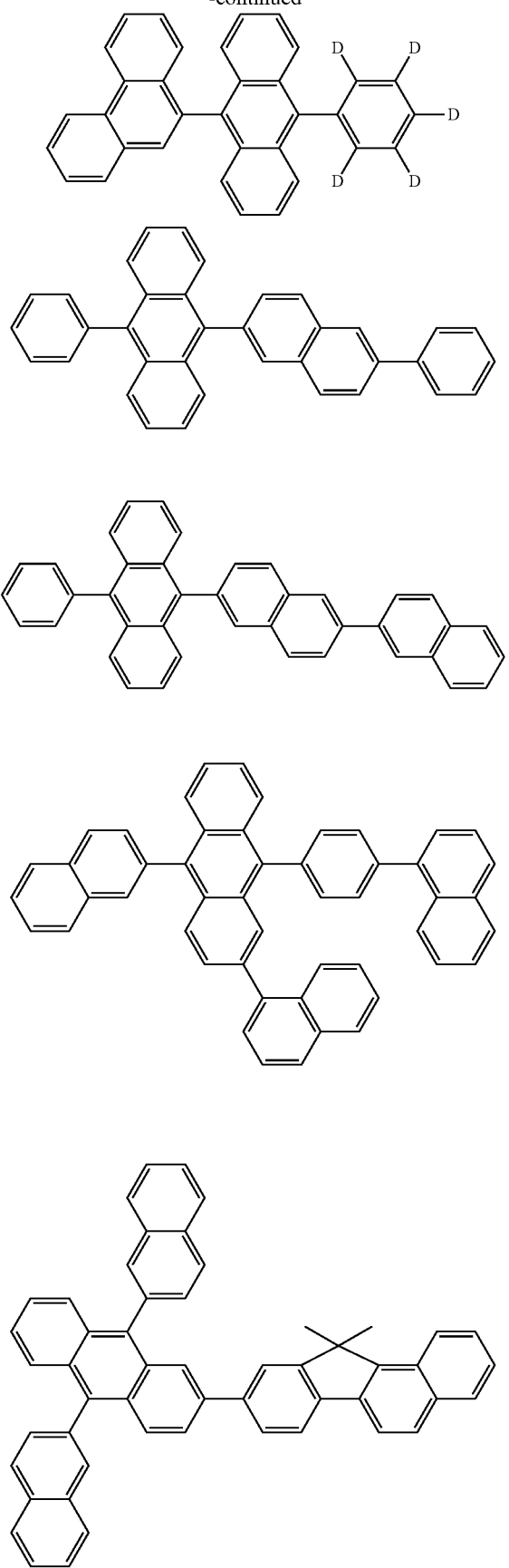
76
-continued
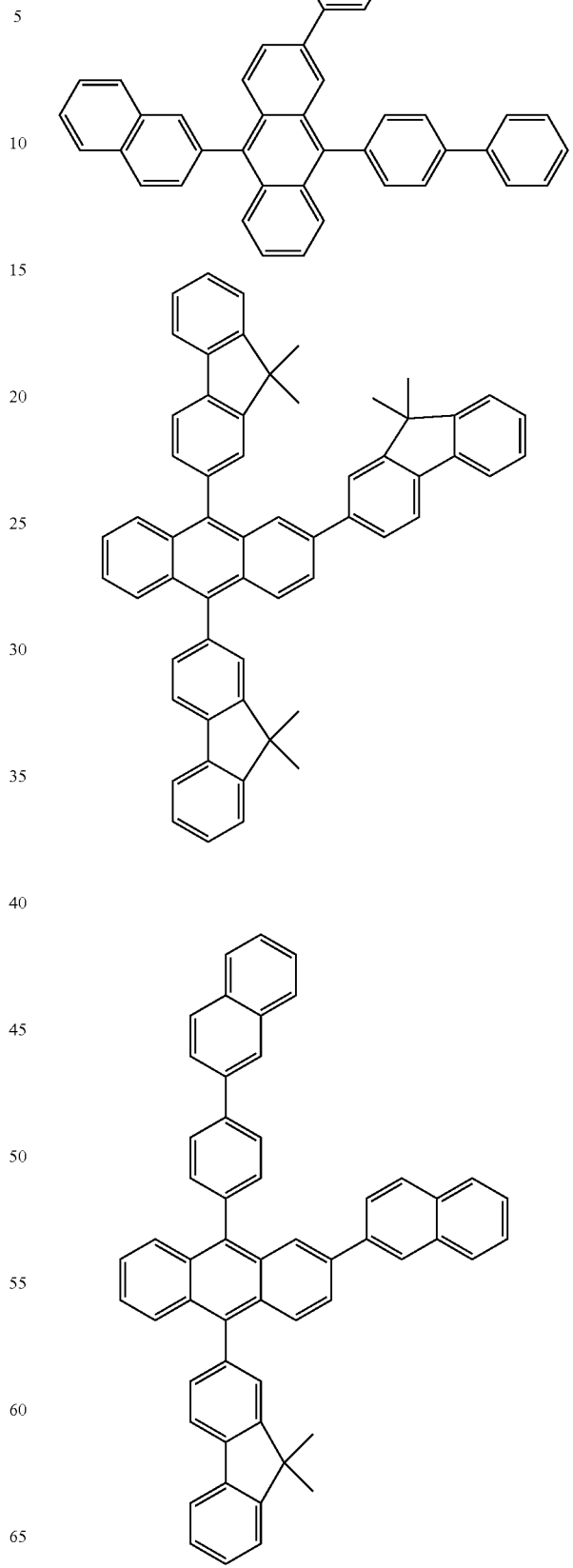

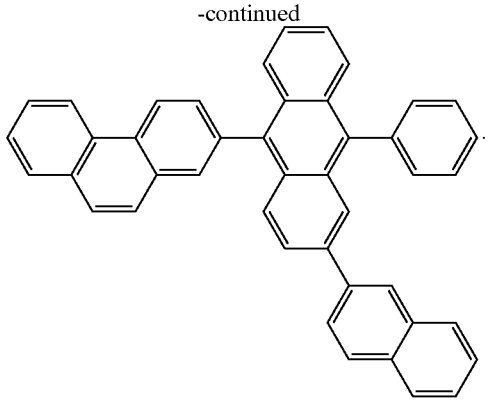

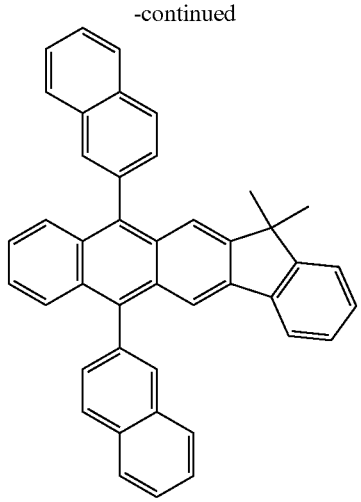

In some embodiments, the host may be an anthracene-based compound represented by Formula 401:

Formula 401

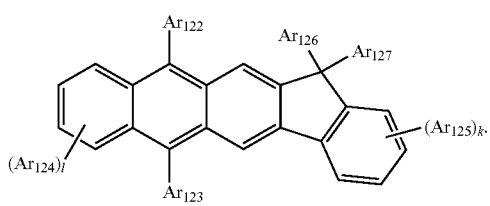

$Ar_{122}$ to $Ar_{125}$ in Formula 401 are the same as already described in connection with $Ar_{113}$ of Formula 400.

$Ar_{126}$ and $Ar_{127}$ in Formula 401 may each independently be a $C_1$-$C_{10}$ alkyl group, such as a methyl group, an ethyl group, or a propyl group.

In Formula 401, k and l may each independently be an integer of 0 to 4, for example, 0, 1, or 2.

For example, the anthracene compound represented by Formula 401 may be one of the following compounds, but the anthracene compound represented by Formula 401 is not limited thereto:

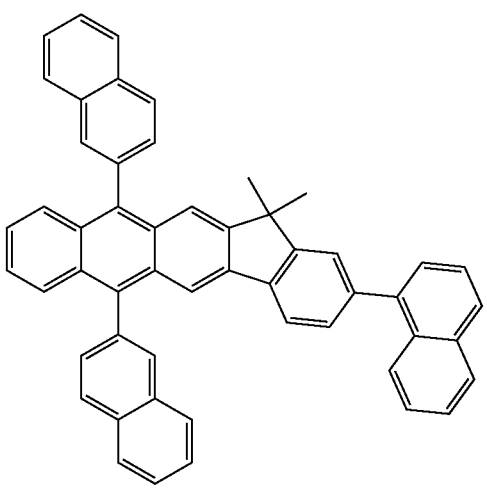

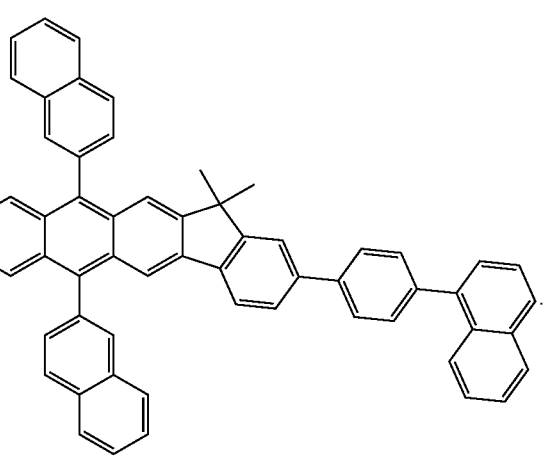

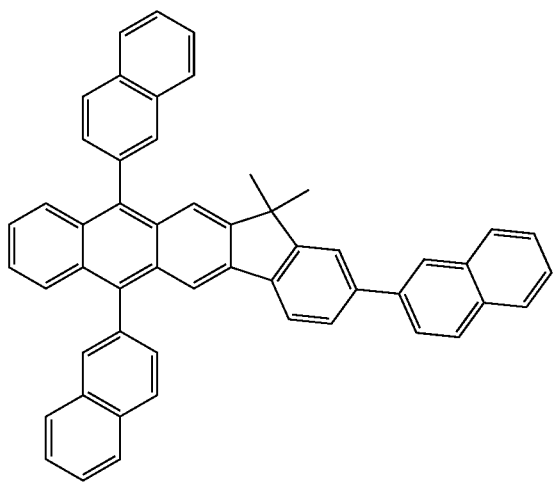

When the organic light-emitting device is a full color organic light-emitting device, the emission layer may be patterned into a red emission layer, a green emission layer, and a blue emission layer.

At least one of the red EML, the green EML, or the blue EML may include a corresponding red dopant, green dopant, and/or blue dopant.

Non-limiting examples of the blue dopant include the following compounds:
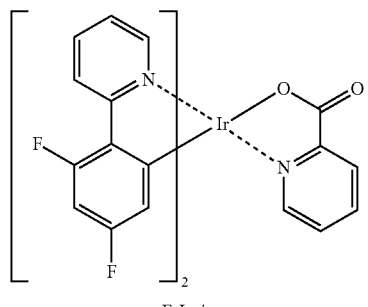
F2Irpic
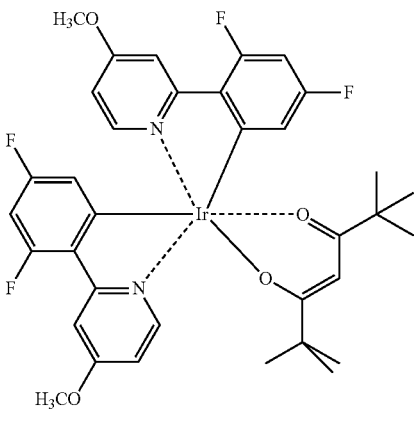
(F2ppy)2Ir(tmd)
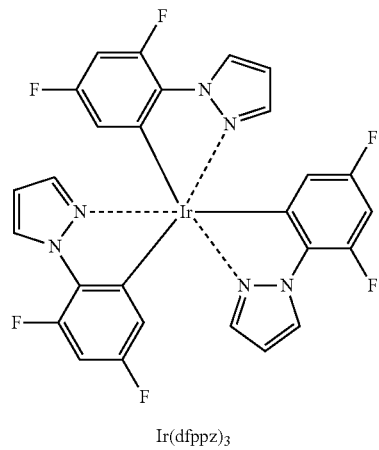
Ir(dfppz)3
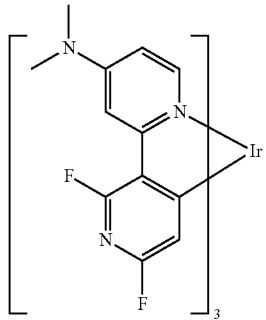
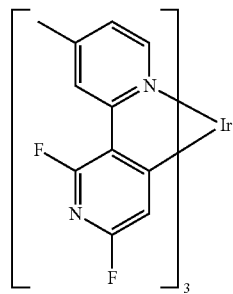
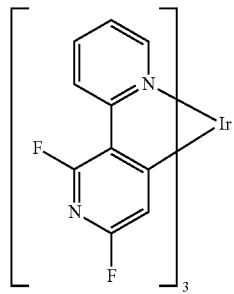
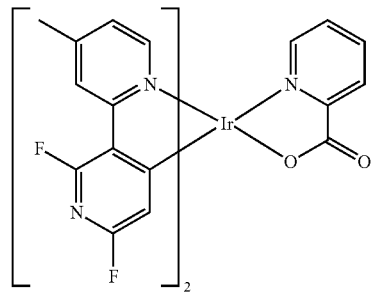
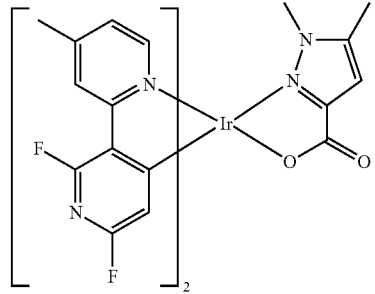
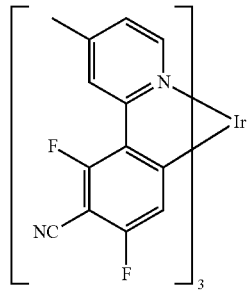
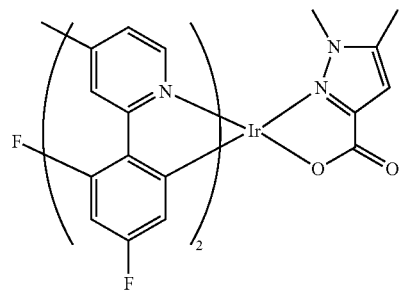
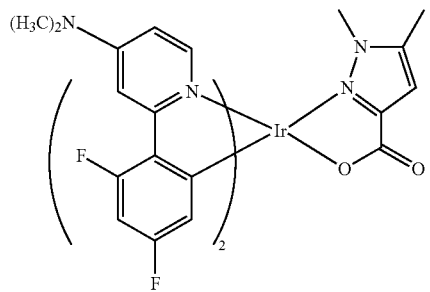

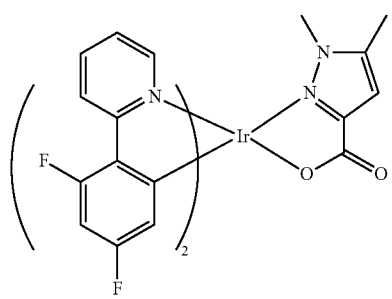
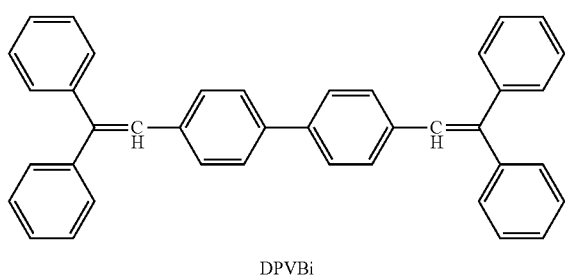
DPVBi
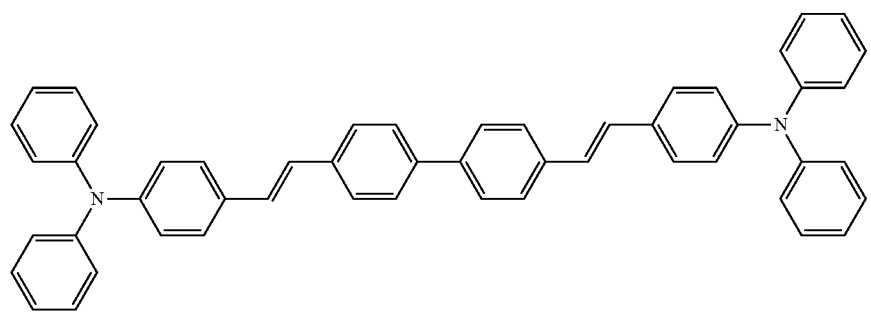
DPAVBi
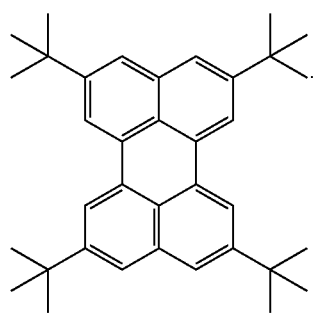
TBPe
Non-limiting examples of the red dopant include the following compounds:
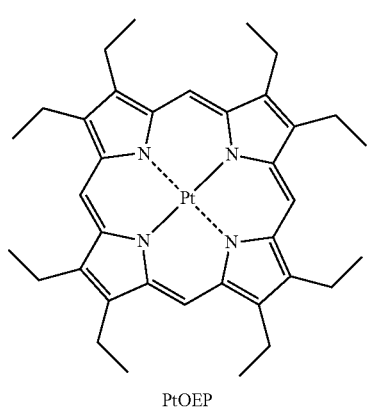
PtOEP
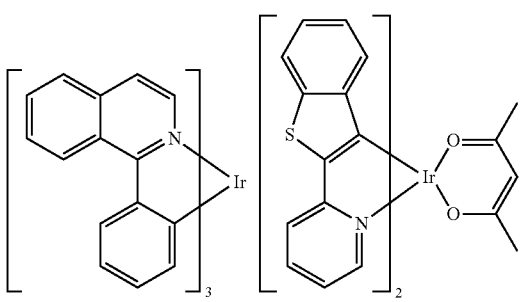
Ir(piq)₃                Btp₂Ir(acac)
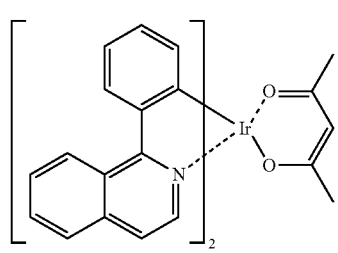

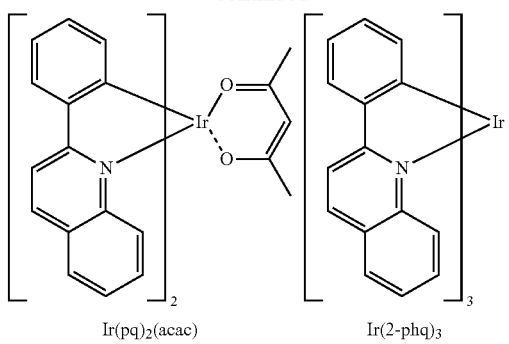
Ir(pq)₂(acac)  Ir(2-phq)₃
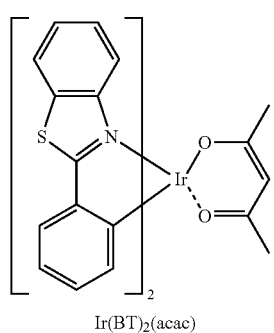
Ir(BT)₂(acac)
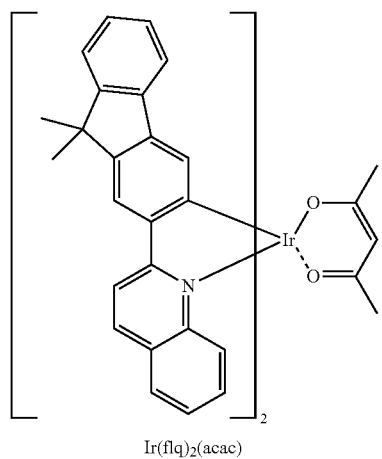
Ir(flq)₂(acac)
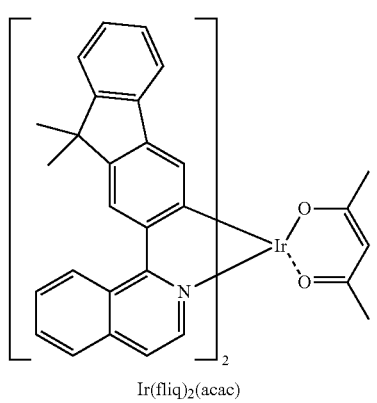
Ir(fliq)₂(acac)
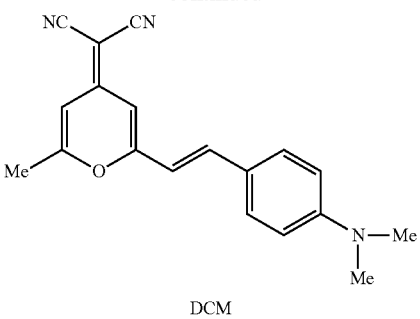
DCM
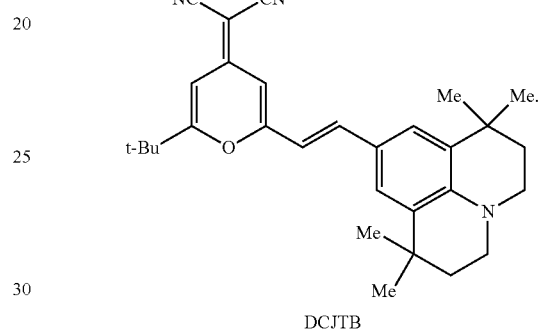
DCJTB
Non-limiting examples of the green dopant include the following compounds:
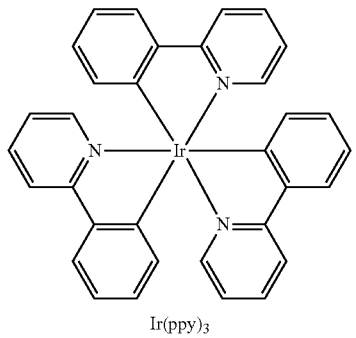
Ir(ppy)₃
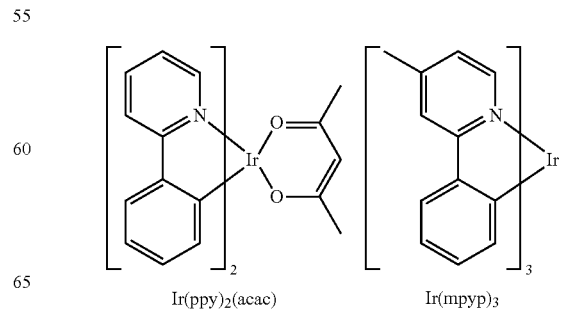
Ir(ppy)₂(acac)  Ir(mpyp)₃

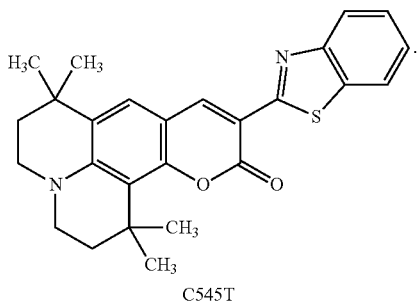
C545T
Non-limiting examples of the dopant that may be used in the EML include Pd complexes and Pt complexes. Non-limiting examples of the Pt complexes and Pd complexes include Compounds D1 to D50:
D1
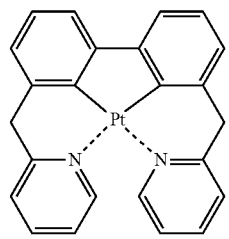
D2
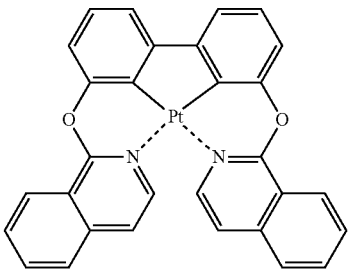
D3
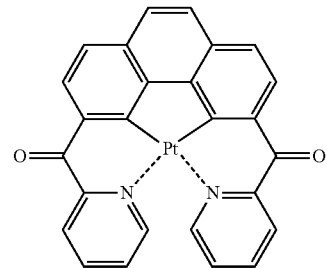
D4
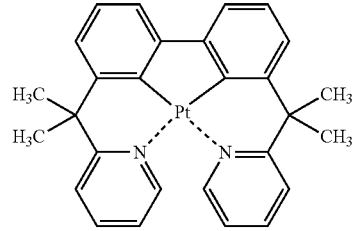
D5
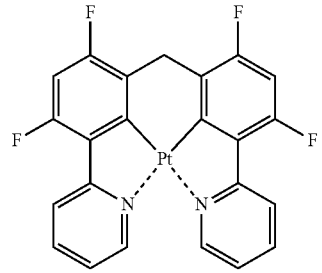
D6
D7
D8
D9
D10
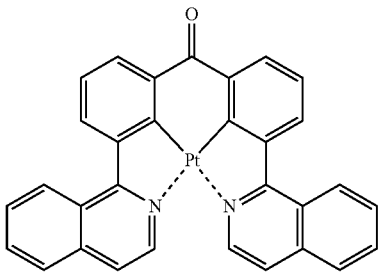

D11 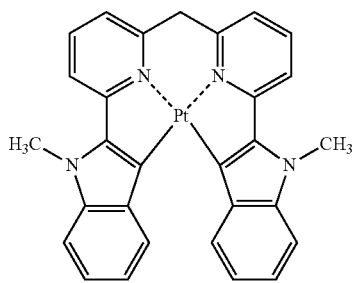
D12 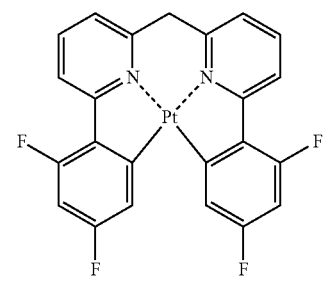
D13 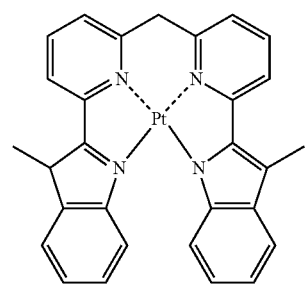
D14 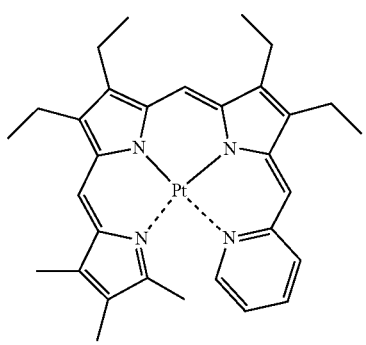
D15 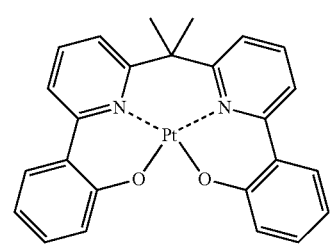
D16 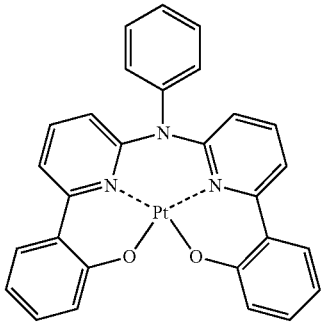
D17 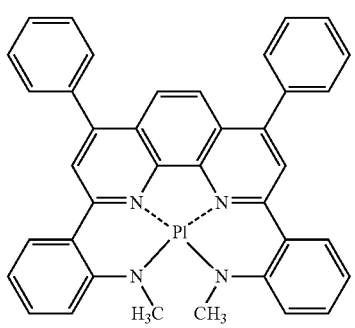
D18 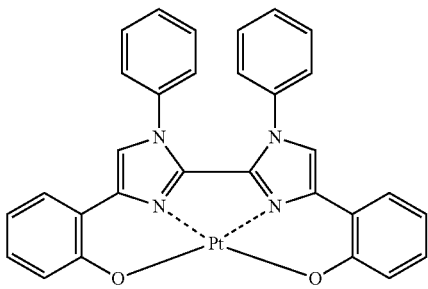
D19 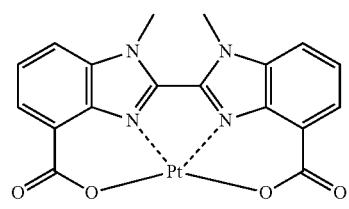
D20 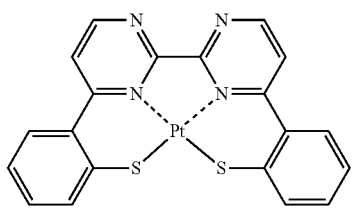

-continued
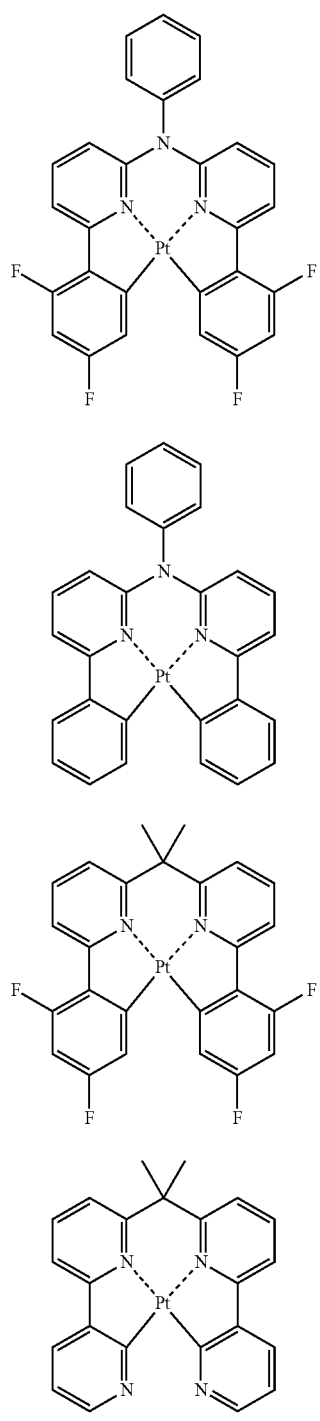
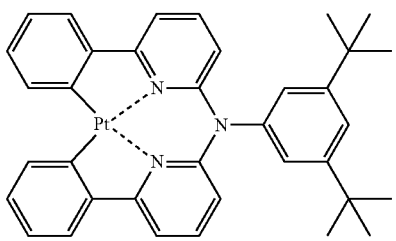
D26
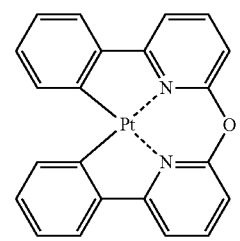
D27
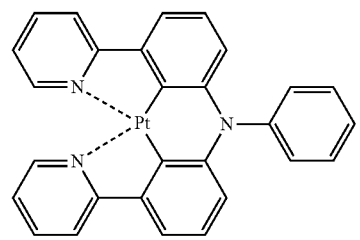
D28
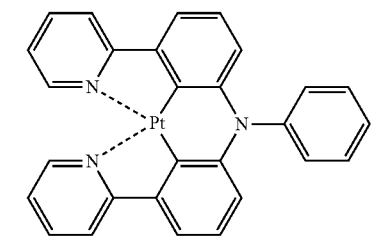
D29
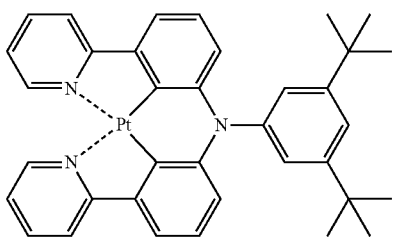
D30
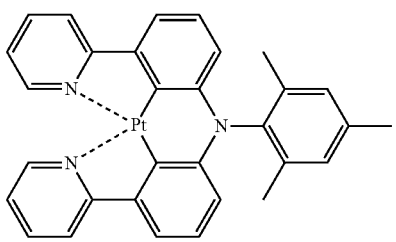
D31

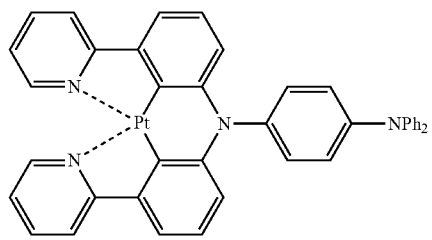
D32
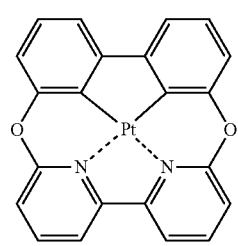
D33
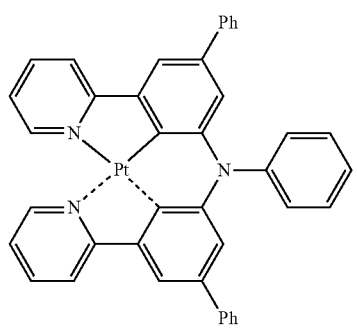
D34
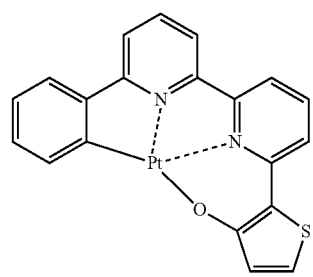
D35
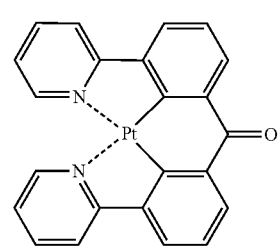
D36
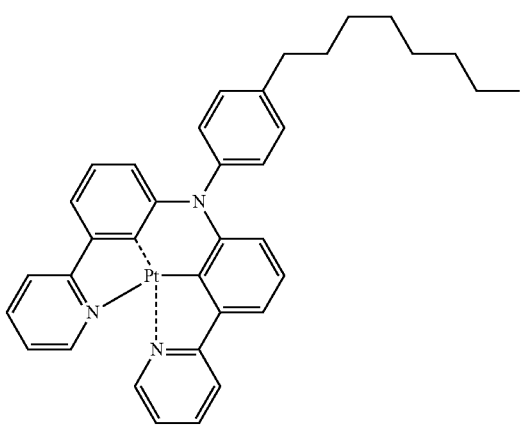
D37
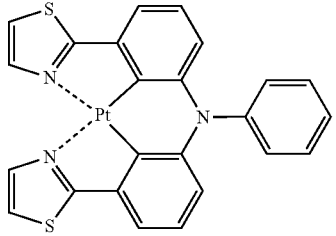
D38
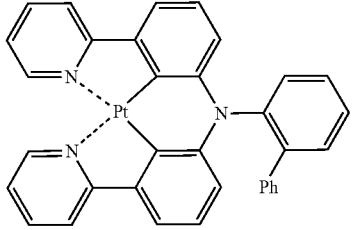
D39
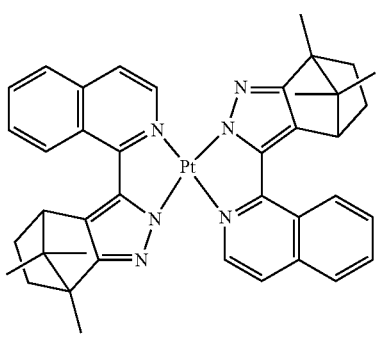
D40
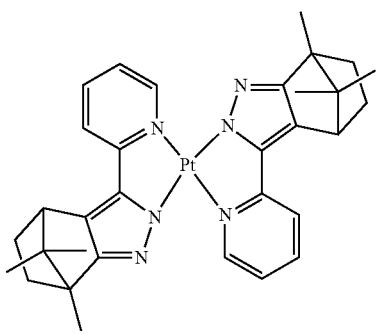
D41

-continued
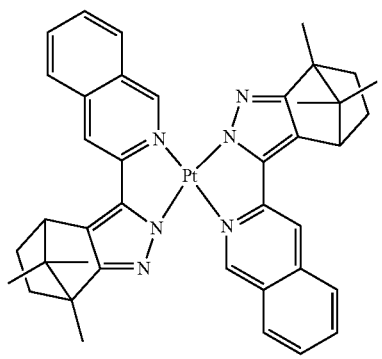
D42
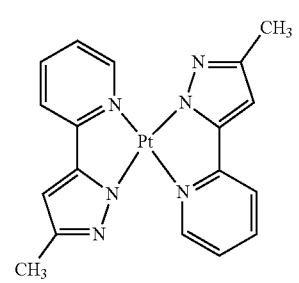
D43
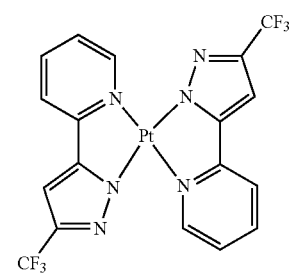
D44
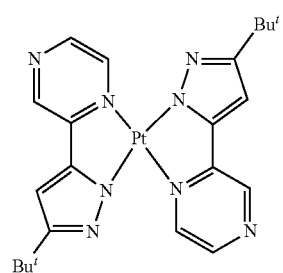
D45
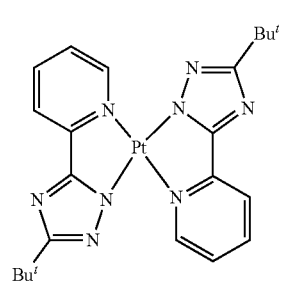
D46
-continued
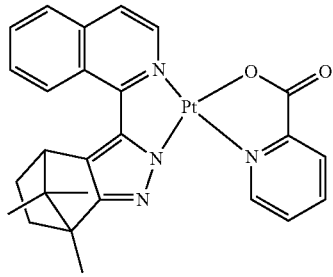
D47
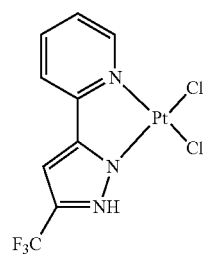
D48
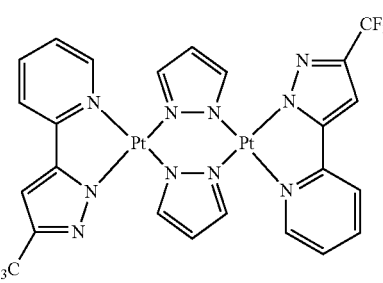
D49
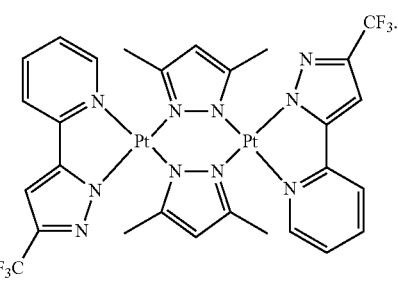
D50
Non-limiting examples of the dopant that may be used in the EML include osmium (Os) complexes, such as the following complexes:
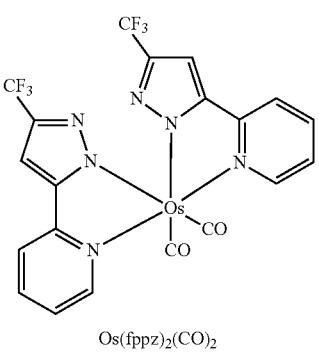
Os(fppz)$_2$(CO)$_2$ -continued

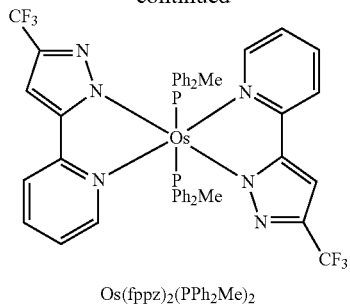

Os(fppz)₂(PPh₂Me)₂

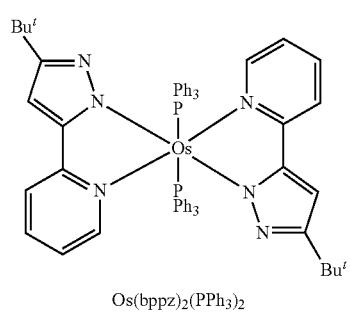

Os(bppz)₂(PPh₃)₂

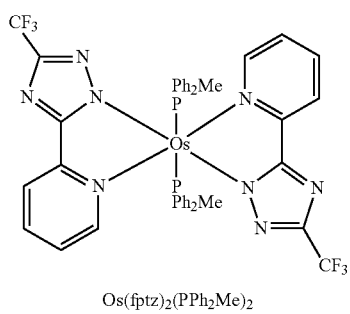

Os(fptz)₂(PPh₂Me)₂

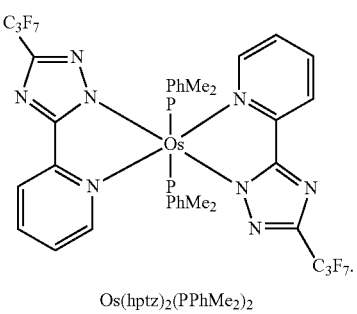

Os(hptz)₂(PPhMe₂)₂

When the EML includes both a host and a dopant, the amount of the dopant may be about 0.01 to about 15 parts by weight based on 100 parts by weight of the host. However, the amount of the dopant is not limited thereto.

In some embodiments, the thickness of the EML may be about 100 Å to about 1000 Å, and in some embodiments, may be about 200 Å to about 600 Å. In these embodiments, the EML may have good light emitting ability without a substantial increase in driving voltage.

The ETL may be formed on the EML by vacuum deposition, spin coating, casting, or the like. When the ETL is formed using vacuum deposition or spin coating, the deposition or coating conditions may be similar to those described above for the formation of the HIL, with the deposition or coating conditions varying in accordance with the compound used to form the ETL.

The material for forming the ETL may be a compound of Formula 4, Formula 5 and/or any material suitable for stably transporting electrons injected from an electron injecting electrode (i.e., the cathode).

Non-limiting examples of the material for forming the ETL include quinoline derivatives, such as tris(8-hydroxyquinolinato)aluminum (Alq₃), TAZ, BAlq, beryllium bis(benzoquinolin-10-olate (Bebq₂), 9,10-di(naphthalene-2-yl)anthracene (ADN), Compound 201, and Compound 202:

Compound 201

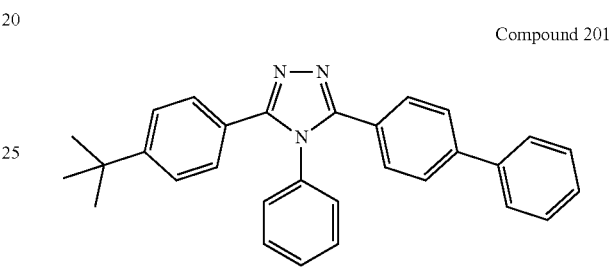

TAZ

Compound 202

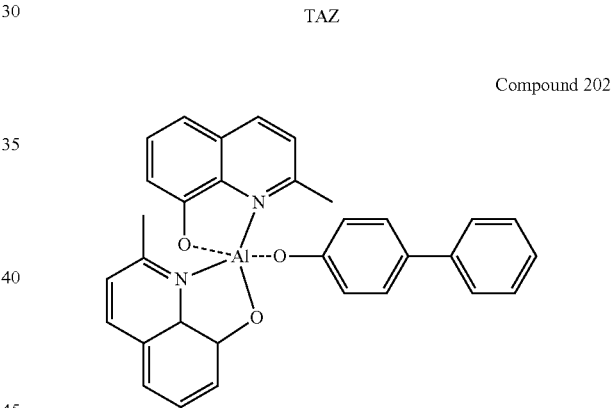

BAlq

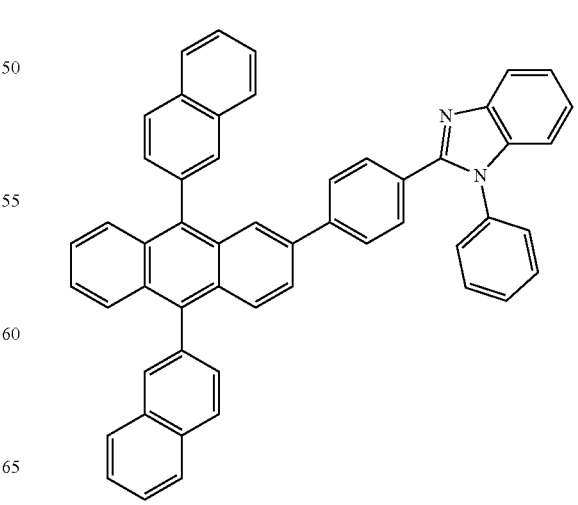

-continued

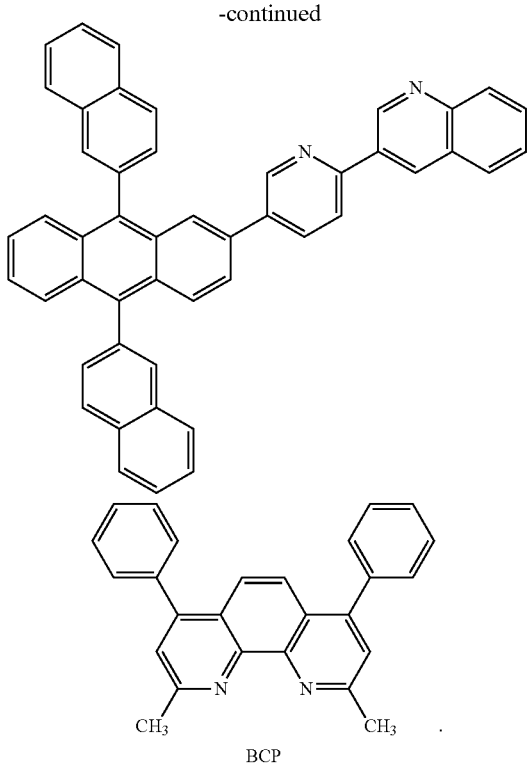
BCP

In some embodiments, the thickness of the ETL may be about 100 Å to about 1,000 Å, and in some embodiments, may be about 150 Å to about 500 Å. In these embodiments, the ETL may have a suitable electron transporting ability without a substantial increase in driving voltage.

In some embodiments, the ETL may further include a metal-containing material, in addition to the suitable electron-transporting material.

The metal-containing material may include a lithium (Li) complex. Non-limiting examples of the Li complex include lithium quinolates (LiQ) and derivatives thereof, and Compound 203:

Compound 203

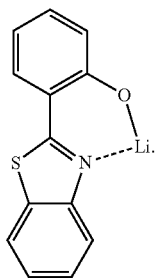

The EIL, which may facilitate injection of electrons from the cathode, may be formed on the ETL. Any suitable electron-injecting material commonly used to form an EIL may be used. Non-limiting examples of the material for forming the EIL include LiF, NaCl, CsF, Li$_2$O, and BaO. The deposition or coating conditions for forming the EIL may be similar to those described above for the formation of the HIL, though the deposition or coating conditions may vary depending on the material that is used to form the EIL.

In some embodiments, the thickness of the EIL may be about 1 Å to about 100 Å, and in some embodiments, may be about 3 Å to about 90 Å. In these embodiments, the EIL may have suitable electron injection ability without a substantial increase in driving voltage.

The second electrode is on the organic layer. The second electrode may be a cathode, that is, an electron injection electrode. The material for forming the second electrode may be a metal, an alloy, or an electro-conductive compound each having a low work function, or may be a mixture thereof. In this regard, the second electrode may be formed of lithium (Li), magnesium (Mg), aluminum (Al), aluminum (AD-lithium (Li), calcium (Ca), magnesium (Mg)-indium (In), magnesium (Mg)-silver (Ag), or the like. The second electrode may be formed as a thin film transmission electrode (e.g., a transparent or a transmissive electrode). In some embodiments, to manufacture a top-emission light-emitting device, the transmission electrode may be formed of indium tin oxide (ITO) or indium zinc oxide (IZO).

Although embodiments of the organic light-emitting device have been described in connection with the accompanying drawing, embodiments of the present invention are not limited thereto.

When a phosphorescent dopant is used in the EML, a HBL may be formed between the HTL and the EML or between the H-functional layer and the EML. The HBL may be formed by vacuum deposition, spin coating, casting, Langmuir-Blodgett (LB) deposition, or the like. The HBL may be formed in order to prevent or reduce diffusion of triplet excitons or holes into the ETL. When the HBL is formed using vacuum deposition or spin coating, the conditions for deposition or coating may be similar to those described above for the formation of the HIL, with the conditions for deposition or coating varying in accordance with the material that is used to form the HBL. Any suitable hole-blocking material commonly used to form a HBL may be used. Non-limiting examples of hole-blocking materials include oxadiazole derivatives, triazole derivatives, and phenanthroline derivatives. For example, bathocuproine (BCP) represented by the following formula may be used as the material for forming the HBL:

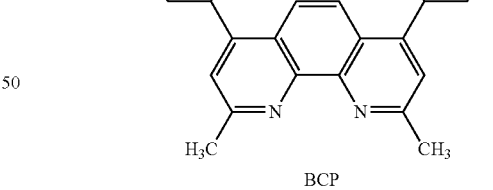
BCP

In some embodiments, the thickness of the HBL may be about 20 Å to about 1000 Å, and in some embodiments, may be about 30 Å to about 300 Å. In these embodiments, the HBL may have improved hole blocking ability without a substantial increase in driving voltage.

The organic light-emitting device according to embodiments of the present invention may be included in various flat panel display devices, such as a passive matrix organic light-emitting display device or an active matrix organic light-emitting display device. In particular, when the organic light-emitting device is included in an active matrix organic light-emitting display device including a thin-film transistor, the first electrode (on the substrate) may function as a pixel electrode, and may be electrically connected to a source electrode or a drain electrode of the thin-film transistor. The organic light-emitting device may also be included in a flat panel display device having a double-sided screen.

In some embodiments, the organic layer of the organic light-emitting device may be formed of the compound of Formula 1, Formula 2 and/or Formula 3 and may be formed by deposition (e.g., deposition on the first electrode) or by a wet method (e.g., by coating a solution of the compound of Formula 1, Formula 2 and/or Formula 3 on the first electrode).

Hereinafter, embodiments of the present invention will be described by reference to the following Synthesis Examples and Examples. However, these Synthesis Examples and Examples are presented for illustrative purposes only and do not limit the scope of the present invention.

SYNTHESIS EXAMPLES

Synthesis Example of the ETL Material

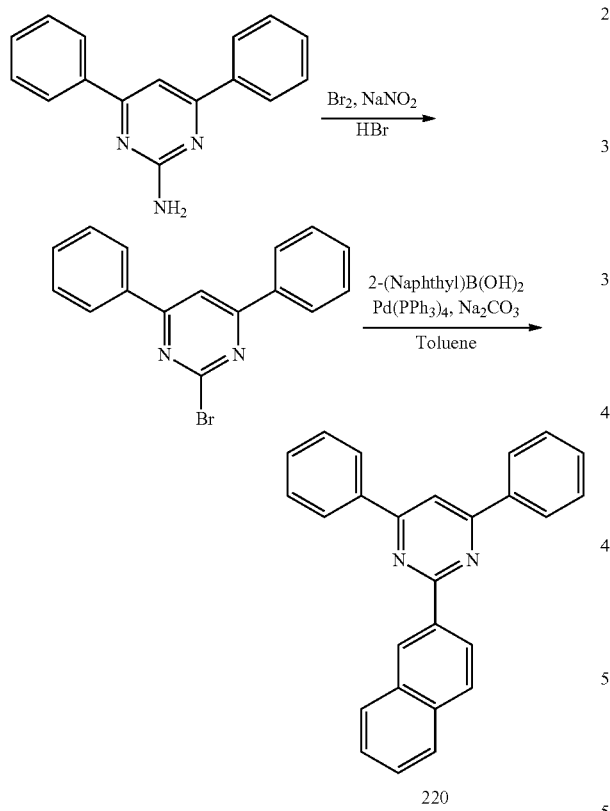

(1) Synthesis of 2-bromo-4,6-diphenylpyrimidine 50 mL of 48% HBr was added to 10 g (40 mmol) of 2-amino-4,6-diphenylpyrimidine and stirred to obtain a solution. The solution was then cooled down to about −20° C., and 2.5 mL (48 mmol) of bromine was added dropwise thereto. 2.8 g (40 mmol) of sodium nitrite was then added and the resulting reaction mixture was stirred at room temperature for about 3 hours. After completion of the reaction, the reaction mixture was extracted using ethyl acetate. The organic layer was then dried using anhydrous magnesium sulfate and the solvent was removed by distillation under reduced pressure. The residue was purified using column chromatography to obtain 9.1 g of 2-bromo-4,6-diphenylpyrimidine (Yield: 73%).

(2) Synthesis of Compound 220

5 g (16 mmol) of 2-bromo-4,6-diphenylpyrimidine, 3.6 g (21 mmole) of 2-naphthylboronic acid, 0.7 g (0.64 mmol) of $Pd(PPh_3)_4$, 8 mL of a 2M $Na_2CO_3$ aqueous solution, 20 mL of toluene, and 20 mL of ethanol were combined and refluxed with stirring under a nitrogen atmosphere for 24 hours. The resulting reaction mixture was washed with distilled water and extracted with ethyl acetate. The organic layer was dried using anhydrous magnesium sulfate, and the solvent was removed by distillation under reduced pressure. The residue was separated using column chromatography to obtain 3.73 g of Compound 220 (Yield: 65%)

Synthesis Example of Phosphorescent the Host Material

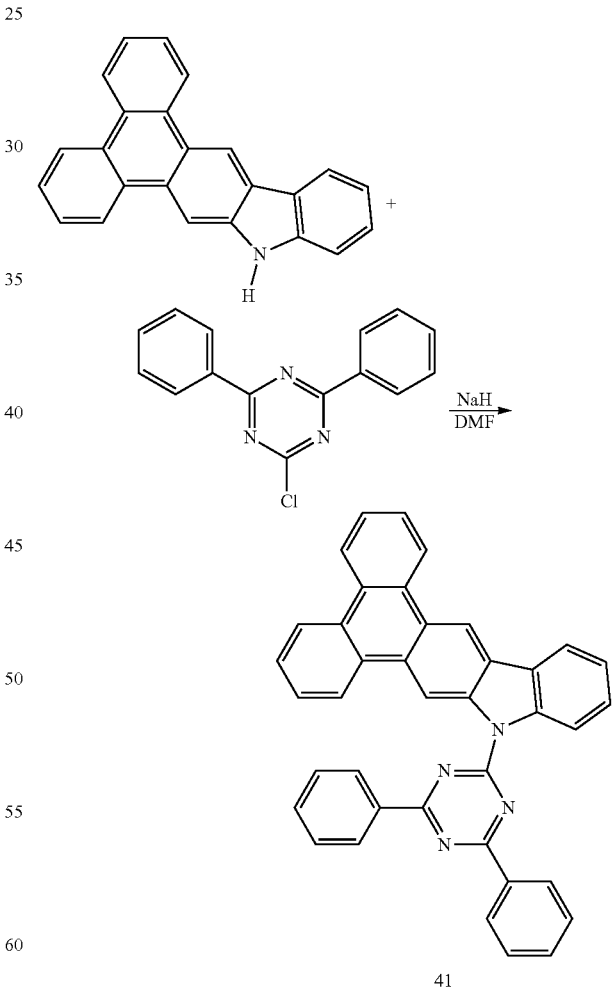

5 g (15.7 mmol) of 10H-phenanthro[9,10-b]Carbazole and an excess of NaH were added to 30 mL of N,N-dimethylformamide (DMF) and stirred for about 1 hour. Subsequently, 5.35 g (0.02 mol) of 2-chloro-4,6-diphenyl- 1,3,5-triazine as a solution in 15 mL of DMF was added thereto. After completion of the reaction, the resulting reaction mixture was extracted using ethyl acetate. The organic layer was then dried using anhydrous magnesium sulfate and the solvent was removed by distillation under reduced pressure. The residue was purified using column chromatography to obtain 4.9 g of Compound 41 (Yield: 57%).

EXAMPLES

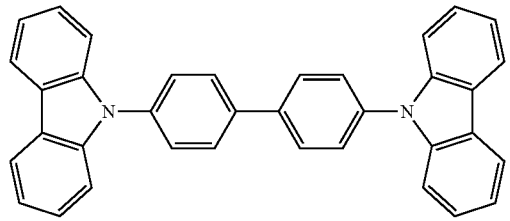

PH1

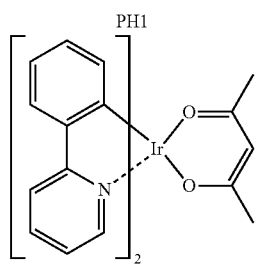

PGD

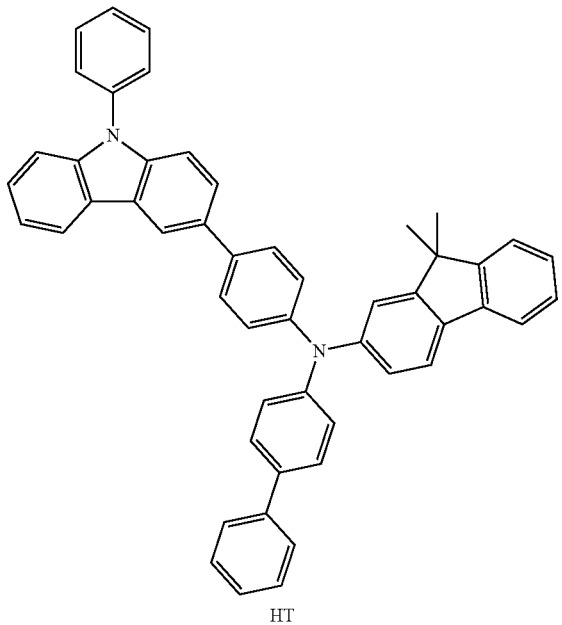

HT

Example 1

An organic light-emitting device was manufactured as follows. An ITO glass substrate was cut to a size of 50 mm×50 mm×0.5 mm, washed sequentially by sonication in acetone, isopropyl alcohol, and pure water (15 minutes each), and then cleaned with UV ozone for 30 minutes. Subsequently, Compound HT (depicted above) was vacuum-deposited on the ITO glass substrate to form an HTL having a thickness of 1200 Å, followed by vacuum-depositing Compound 1 and 5 wt % Compound PGD (depicted above) on the HTL to form an EML having a thickness of 400 Å. Then, Compound 220 was vacuum-deposited on the EML to form an ETL having a thickness of 300 Å. LiF was vacuum-deposited on the ETL to form an EIL having a thickness of about 10 Å. Al was then vacuum-deposited on the EIL to form a cathode having a thickness of about 2000 Å.

Example 2

An organic light emitting device having the structure ITO/HT (1200 Å)/5% PGD+Compound 6 (400 Å)/220 (300 Å)/LiF (10 Å)/Al (2000 Å) was manufactured as in Example 1, except that Compound 6 was used instead of Compound 1 as the phosphorescent host.

Example 3

An organic light-emitting device having the structure ITO/HT (1200 Å)/5% PGD+Compound 41 (400 Å)/220 (300 Å)/LiF (10 Å)/Al (2000 Å) was manufactured as in Example 1, except that Compound 41 was used instead of Compound 1 as the phosphorescent host.

Example 4

An organic light emitting device having the structure ITO/HT (1200 Å)/5% PGD+Compound 44 (400 Å)/220 (300 Å)/LiF (10 Å)/Al (2000 Å) was manufactured as in Example 1, except that Compound 44 was used instead of Compound 1 as the phosphorescent host.

Example 5

An organic light-emitting device having the structure ITO/HT (1200 Å)/5% PGD+Compound 72 (400 Å)/220 (300 Å)/LiF (10 Å)/Al (2000 Å) was manufactured as in Example 1, except that Compound 72 was used instead of Compound 1 as the phosphorescent host.

Example 6

An organic light-emitting device having the structure ITO/HT (1200 Å)/5% PGD+Compound 85 (400 Å)/220 (300 Å)/LiF (10 Å)/Al (2000 Å) was manufactured as in Example 1, except that Compound 85 was used instead of Compound 1 as the phosphorescent host.

Example 7

An organic light-emitting device having the structure ITO/HT (1200 Å)/5% PGD+Compound 96 (400 Å)/220 (300 Å)/LiF (10 Å)/Al (2000 Å) was manufactured as in Example 1, except that Compound 96 was used instead of Compound 1 as the phosphorescent host.

Example 8

An organic light-emitting device having the structure ITO/HT (1200 Å)/5% PGD+Compound 110 (400 Å)/220 (300 Å)/LiF (10 Å)/Al (2000 Å) was manufactured as in Example 1, except that Compound 110 was used instead of Compound 1 as the phosphorescent host.

Example 9

An organic light-emitting device having the structure ITO/HT (1200 Å)/5% PGD+Compound 84+Compound 13

(400 Å)/220 (300 Å)/LiF (10 Å)/Al (2000 Å) was manufactured as in Example 1, except that a 1:3 mixture of Compound 84 and Compound 13 was used instead of Compound 1 as the phosphorescent host.

Comparative Example

An organic light-emitting device having the structure ITO/HT (1200 Å)/PH1+5% PGD1 (400 Å)/220 (300 Å)/LiF (10 Å)/Al (2000 Å) was manufactured as in Example 1, except that PH1 was used instead of Compound 1.

TABLE 1

Test results comparing the organic light-emitting devices

| Example | Efficiency (cd/A) | Driving voltage (V) | Lifetime (hr) | High-temperature lifetime (hr) |
|---|---|---|---|---|
| Comparative Example 1 | 100% | 100% | 100% | 100% |
| Example 1 | 113% | 92% | 125% | 133% |
| Example 2 | 129% | 87% | 118% | 121% |
| Example 3 | 116% | 95% | 110% | 101% |
| Example 4 | 105% | 91% | 167% | 126% |
| Example 5 | 128% | 86% | 131% | 98% |
| Example 6 | 112% | 97% | 129% | 127% |
| Example 7 | 137% | 83% | 149% | 132% |
| Example 8 | 127% | 93% | 151% | 119% |
| Example 9 | 141% | 79% | 163% | 151% |

In Table 1, the efficiency, driving voltage, lifetime, and high-temperature lifetime for each of Examples 1 to 9 are provided relative to Comparative Example 1, which is arbitrarily defined as 100%. Examples 1 to 9, on average, had improved efficiency and lifetime, while having a lower driving voltage compared to Comparative Example 1.

High-temperature lifetime in Table 1 refers to a lifetime of an organic light-emitting device when operated at about 70° C.

As described herein, according to embodiments of the present invention, an organic light-emitting device may be manufactured using any suitable hole transport material and any suitable electron transport material commonly used to form an HTL, without introducing an additional charge blocking layer that is likely to deteriorate. Thus, organic light-emitting diodes according to embodiments of the present invention may be durable against deterioration (i.e., the organic light-emitting diode may not deteriorate or may deteriorate more slowly).

While the present invention has been described in connection with certain exemplary embodiments, those of ordinary skill in the art will understand that various modifications may be made to the disclosed embodiments without departing from the spirit and scope of the appended claims, and equivalents thereof.

What is claimed is:
1. An organic light-emitting device comprising:
a first electrode;
a second electrode; and
an organic layer between the first electrode and the second electrode,
wherein the organic layer comprises:
(i) an emission layer comprising a compound represented by one of Formulae 1 to 3, and an electron transport layer comprising a compound represented by Formula 5:

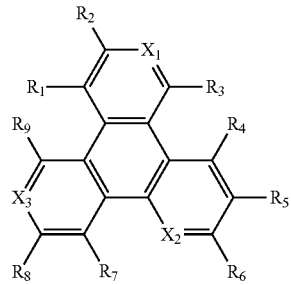

Formula 1

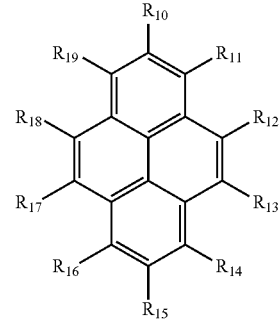

Formula 2

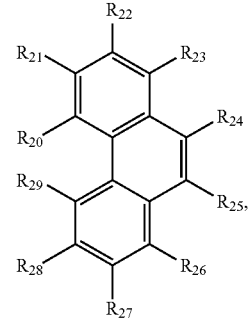

Formula 3 wherein in Formulae 1 to 3:

$X_1$, $X_2$, and $X_3$ are each independently $CR_{81}$, $CR_{82}$, $CR_{83}$, or N, $R_1$ to $R_{29}$, and $R_{81}$ to $R_{83}$ are each independently a hydrogen atom; a deuterium atom; a cyano group; a C1-C60 alkyl group; a substituted or unsubstituted C2-C60 alkenyl group; a substituted or unsubstituted C2-C60 alkynyl group; a substituted or unsubstituted C3-C60 cycloalkyl group; a substituted or unsubstituted C3-C60 cycloalkenyl group; a substituted or unsubstituted C6-C60 aryl group; a substituted or unsubstituted C1-C60 heteroaryl group; a substituted or unsubstituted C6-C60 aryloxy group; a substituted or unsubstituted C6-C60 arylthio group; a substituted or unsubstituted C6-C60 condensed polycyclic group; an amino group substituted with a substituted C6-C60 aryl group; an amino group substituted with a unsubstituted C6-C60 aryl group; an amino group substituted with a substituted C1-C60 heteroaryl group; or an amino group substituted with an unsubstituted C1-C60 heteroaryl group, wherein adjacent substituents selected from $R_1$ to $R_{29}$ and $R_{81}$ to $R_{83}$ may optionally combine to form a ring;

Formula 5

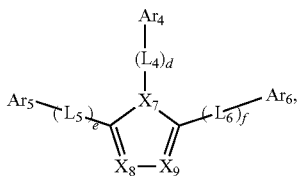

wherein in Formula 5:

$X_7$ to $X_9$ are each N, $Ar_4$ to $Ar_6$ are each independently a hydrogen atom; a deuterium atom; a substituted or unsubstituted C6-C60 aryl group; a substituted or unsubstituted C1-C60 heteroaryl group; a substituted or unsubstituted C6-C60 aryloxy group; a substituted or unsubstituted C6-C60 arylthio group; a substituted or unsubstituted C6-C60 condensed polycyclic group; an amino group substituted with a substituted C6-C60 aryl group; an amino group substituted with an unsubstituted C6-C60 aryl group; an amino group substituted with a substituted C1-C60 heteroaryl group; or an amino group substituted with an unsubstituted C1-C60 heteroaryl group, provided that at least one of $Ar_5$ to $Ar_6$ is a substituted or unsubstituted triazole group, $L_4$ to $L_6$ are each independently a substituted or unsubstituted C6-C60 arylene group; a substituted or unsubstituted C1-C60 heteroarylene group; or a substituted or unsubstituted divalent C6-C60 condensed polycyclic group, provided that the $L_5$ or $L_6$ corresponding to the at least one of $Ar_5$ to $Ar_6$ that is the substituted or unsubstituted triazole is a substituted or unsubstituted divalent pyrene group, wherein adjacent substituents selected from $Ar_4$ to $Ar_6$, and $L_4$ to $L_6$ may optionally combine to form a ring, and d to f are each independently an integer of 0 to 2 and when one or more of d to f is an integer of 2 or more, the two or more corresponding $L_4$s to $L_6$s are the same or different.

2. The organic light-emitting device of claim 1, wherein, in Formulae 1 to 3, each of $X_1$ to $X_3$ is CH.

3. The organic light-emitting device of claim 1, wherein, in Formulae 1 to 3, $R_1$ to $R_{29}$ and $R_{81}$ to $R_{83}$ are each independently a hydrogen atom, a deuterium atom, or a group represented by one of Formulae 2a to 2f:

2a

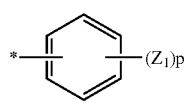

2b

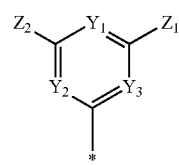

2c

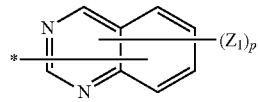

2d

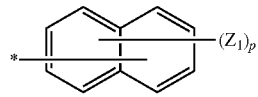

2e

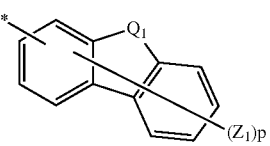

2f

*―$NR_{71}R_{72}$, wherein in Formulae 2a to 2f, $R_{71}$, $R_{72}$, $Z_1$, and $Z_2$ are each independently a hydrogen atom, a deuterium atom, a substituted or unsubstituted C1-C20 alkyl group, a substituted or unsubstituted C6-C20 aryl group, a substituted or unsubstituted C3-C20 heteroaryl group, a substituted or unsubstituted C6-C20 condensed polycyclic group, a halogen group, a cyano group, a nitro group, a hydroxyl group, or a carboxyl group;

$Y_1$ to $Y_3$ are each independently CH or N;

$Q_1$ is S or O;

p is an integer of 1 to 7 and when p is an integer of 2 or more, the two or more $Z_1$s are the same or different; and

* is a binding site to a corresponding atom of Formula 1, Formula 2, or Formula 3, or to a corresponding carbon (C) of $CR_{81}$ to $CR_{83}$.

4. The organic light-emitting device of claim 1, wherein in Formula 5, $Ar_4$ to $Ar_6$ are each independently a hydrogen atom, a deuterium atom, or a group represented by one of Formulae 3a to 3f:

3a

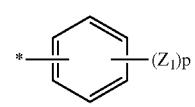

3b

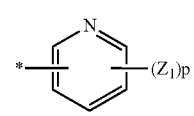

3c

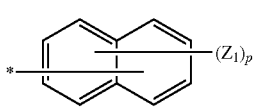

3d

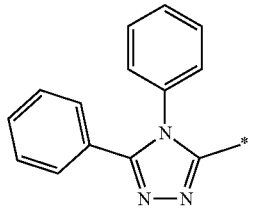

-continued

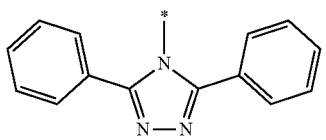
3e

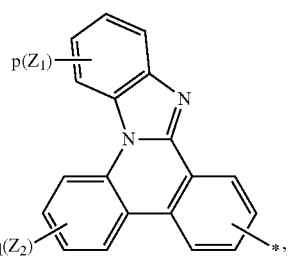
3f wherein, in Formulae 3a to 3f:

$Z_1$ and $Z_2$ are each independently a hydrogen atom, a deuterium atom, a substituted or unsubstituted C1-C20 alkyl group, a substituted or unsubstituted C6-C20 aryl group, a substituted or unsubstituted C3-C20 heteroaryl group, a substituted or unsubstituted C6-C20 condensed polycyclic group, a halogen group, a cyano group, a nitro group, a hydroxyl group, or a carboxyl group;

p and q are each independently an integer from 1 to 7, and when p and/or q is an integer of 2 or more, the two or more corresponding $Z_1$s or $Z_2$s are the same or different; and

* is a binding site to a corresponding $L_1$ to $L_6$ or to a corresponding atom of Formula 5.

5. The organic light-emitting device of claim 1, wherein, in Formula 5, $L_4$ to $L_6$ are each independently a group represented by one of Formulae 5a to 5d:

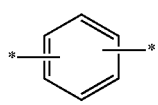
5a

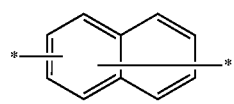
5b

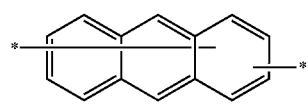
5c

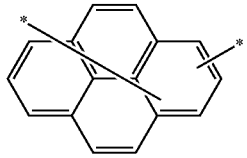
5d wherein in Formulae 5a to 5d, each * is a binding site to a corresponding $Ar_a$ to $Ar_6$, a corresponding $L_4$ to $L_6$, or a corresponding atom of Formula 5.

6. The organic light-emitting device of claim 1, wherein the organic layer further comprises at least one of an electron injection layer, a functional layer having both electron injection and electron transport capabilities, a hole injection layer, a hole transport layer, or a functional layer having both hole injection and hole transport capabilities, wherein:

the emission layer comprises a red emission layer, a green emission layer, a blue emission layer, and a white emission layer, and at least one of the red emission layer, the green emission layer, the blue emission layer and the white emission layer comprises a phosphorescent compound.

7. The organic light-emitting device of claim 6, wherein at least one of the hole injection layer, the hole transport layer, and the functional layer having hole injection and hole transport capabilities comprises a charge-generating material.

8. The organic light-emitting device of claim 7, wherein the charge-generating material is a p-dopant.

9. The organic light-emitting device of claim 8, wherein the p-dopant is a quinone derivative.

10. The organic light-emitting device of claim 8, wherein the p-dopant is a metal oxide.

11. The organic light-emitting device of claim 8, wherein the p-dopant is a cyano group-containing compound.

12. The organic light-emitting device of claim 1, wherein the electron transport layer further comprises a metal complex.

13. The organic light-emitting device of claim 12, wherein the metal complex is a lithium (Li) complex.

14. The organic light-emitting device of claim 12, wherein the metal complex is a lithium quinolate (LiQ) compound or Compound 203:

Compound 203

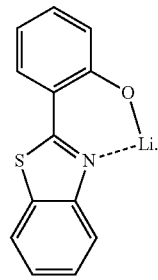

15. The organic light-emitting device of claim 1, wherein the organic layer is formed by a wet process.

16. An organic light-emitting device comprising:
a first electrode;
a second electrode; and
an organic layer between the first electrode and the second electrode,
wherein the organic layer comprises:
an emission layer comprising a compound represented by one of Formulae 1 to 3:

Formula 1

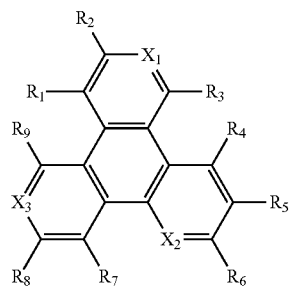

Formula 2

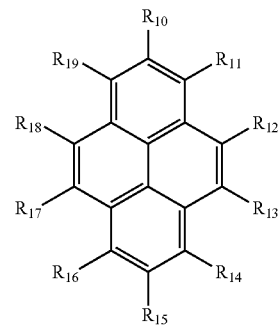

Formula 3

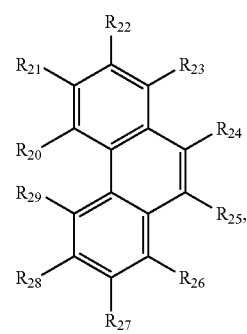

wherein in Formulae 1 to 3:
$X_1$, $X_2$, and $X_3$ are each independently $CR_{81}$, $CR_{82}$, $CR_{83}$, or N,
$R_1$ to $R_{29}$, and $R_{81}$ to $R_{83}$ are each independently a hydrogen atom; a deuterium atom; a cyano group; a C1-C60 alkyl group; a substituted or unsubstituted C2-C60 alkenyl group; a substituted or unsubstituted C2-C60 alkynyl group; a substituted or unsubstituted C3-C60 cycloalkyl group; a substituted or unsubstituted C3-C60 cycloalkenyl group; a substituted or unsubstituted C6-C60 aryl group; a substituted or unsubstituted C1-C60 heteroaryl group; a substituted or unsubstituted C6-C60 aryloxy group; a substituted or unsubstituted C6-C60 arylthio group; a substituted or unsubstituted C6-C60 condensed polycyclic group; an amino group substituted with a substituted C6-C60 aryl group; an amino group substituted with a unsubstituted C6-C60 aryl group; an amino group substituted with a substituted C1-C60 heteroaryl group; or an amino group substituted with an unsubstituted C1-C60 heteroaryl group,
wherein adjacent substituents selected from $R_1$ to $R_{29}$ and $R_{81}$ to $R_{83}$ may optionally combine to form a ring; and
an electron transport layer comprising a compound represented by Formula 5:

Formula 5

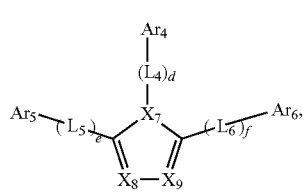

wherein in Formula 5:
$X_7$ to $X_9$ are each N,
$Ar_4$ to $Ar_6$ are each independently a hydrogen atom; a deuterium atom; a substituted or unsubstituted C6-C60 aryl group; a substituted or unsubstituted C1-C60 heteroaryl group; a substituted or unsubstituted C6-C60 aryloxy group; a substituted or unsubstituted C6-C60 arylthio group; a substituted or unsubstituted C6-C60 condensed polycyclic group; an amino group substituted with a substituted C6-C60 aryl group; an amino group substituted with an unsubstituted C6-C60 aryl group; an amino group substituted with a substituted C1-C60 heteroaryl group; or an amino group substituted with an unsubstituted C1-C60 heteroaryl group, provided that at least one of $Ar_5$ to $Ar_6$ is a substituted or unsubstituted triazole group,
$L_4$ to $L_6$ are each independently a substituted or unsubstituted C6-C60 arylene group; a substituted or unsubstituted C1-C60 heteroarylene group; or a substituted or unsubstituted divalent C6-C60 condensed polycyclic group, provided that the $L_5$ or $L_6$ corresponding to the at least one of $Ar_5$ to $Ar_6$ that is the substituted or unsubstituted triazole is a substituted or unsubstituted divalent pyrene group,
wherein adjacent substituents selected from $Ar_4$ to $Ar_6$, and $L_4$ to $L_6$ may optionally combine to form a ring, and
d to f are each independently an integer of 0 to 2 and when one or more of a to f is an integer of 2 or more, the two or more corresponding $L_4$s to $L_6$s are the same or different,
wherein, in Formulae 1 to 3:
two adjacent substituents among $R_1$ to $R_{29}$ and $R_{81}$ to $R_{83}$ combine to form

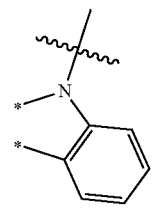 [SMILES: *N(C)c1ccccc1C]

a moiety, and
  each * is a binding site to a corresponding atom of Formulae 1, 2 or 3.

17. An organic light-emitting device comprising:
a first electrode;
a second electrode; and
an organic layer between the first electrode and the second electrode,
wherein the organic layer comprises:
  an emission layer comprising a compound represented by one of Formulae 1 to 3:

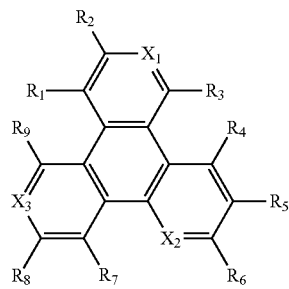

Formula 1

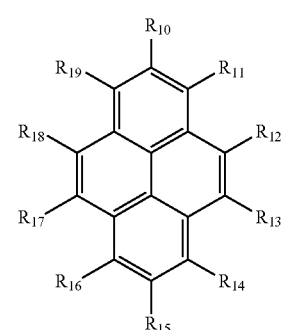

Formula 2

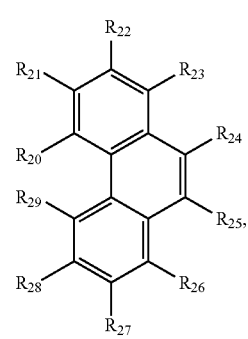

Formula 3 wherein in Formulae 1 to 3:
  $X_1$, $X_2$, and $X_3$ are each independently $CR_{81}$, $CR_{82}$, $CR_{83}$, or N,
  $R_1$ to $R_{29}$, and $R_{81}$ to $R_{83}$ are each independently a hydrogen atom; a deuterium atom; a cyano group; a C1-C60 alkyl group; a substituted or unsubstituted C2-C60 alkenyl group; a substituted or unsubstituted C2-C60 alkynyl group; a substituted or unsubstituted C3-C60 cycloalkyl group; a substituted or unsubstituted C3-C60 cycloalkenyl group; a substituted or unsubstituted C6-C60 aryl group; a substituted or unsubstituted C1-C60 heteroaryl group; a substituted or unsubstituted C6-C60 aryloxy group; a substituted or unsubstituted C6-C60 arylthio group; a substituted or unsubstituted C6-C60 condensed polycyclic group; an amino group substituted with a substituted C6-C60 aryl group; an amino group substituted with a unsubstituted C6-C60 aryl group; an amino group substituted with a substituted C1-C60 heteroaryl group; or an amino group substituted with an unsubstituted C1-C60 heteroaryl group,
  wherein adjacent substituents selected from $R_1$ to $R_{29}$ and $R_{81}$ to $R_{83}$ may optionally combine to form a ring; and
an electron transport layer comprising a compound represented by Formula 5:

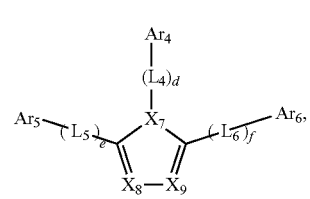

Formula 5 wherein in Formula 5:
  $X_7$ to $X_9$ are each N,
  $Ar_4$ to $Ar_6$ are each independently a hydrogen atom, a deuterium atom, or a group represented by one of Formulae 3a to 3f, provided that at least one of $Ar_5$ to $Ar_6$ is a group represented by one of Formulae 3d to 3f:

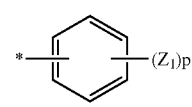

3a

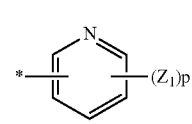

3b

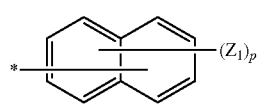

3c

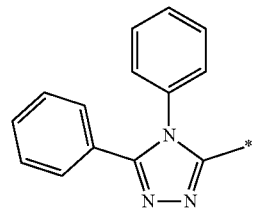

3d

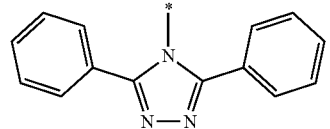

3e

113

-continued

3f

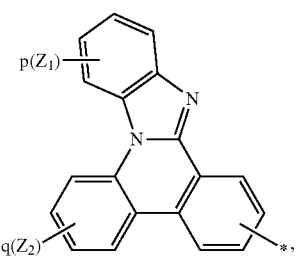

wherein, in Formulae 3a to 3f:

$Z_1$ and $Z_2$ are each independently a hydrogen atom, a deuterium atom, a substituted or unsubstituted C1-C20 alkyl group, a substituted or unsubstituted C6-C20 aryl group, a substituted or unsubstituted C3-C20 heteroaryl group, a substituted or unsubstituted C6-C20 condensed polycyclic group, a halogen group, a cyano group, a nitro group, a hydroxyl group, or a carboxyl group;

p and q are each independently an integer from 1 to 7, and when p and/or q is an integer of 2 or more, the two or more corresponding $Z_1$s or $Z_2$s are the same or different; and

* is a binding site to a corresponding $L_4$ to $L_6$ or to a corresponding atom of Formula 5, $L_4$ to $L_6$ are each independently a substituted or unsubstituted C6-C60 arylene group; a substituted or unsubstituted C1-C60 heteroarylene group; or a substituted or unsubstituted divalent C6-C60 condensed polycyclic group, provided that the $L_5$ or $L_6$ corresponding to the at least one of $Ar_5$ to $Ar_6$ that is a group represented by one of Formulae 3d to 3f is a substituted or unsubstituted divalent pyrene, wherein adjacent substituents selected from $Ar_4$ to $Ar_6$, and $L_4$ to $L_6$ may optionally combine to form a ring, and d to f are each independently an integer of 0 to 2 and when one or more of d to f is an integer of 2 or more, the two or more corresponding $L_4$s to $L_6$s are the same or different, wherein the group represented by Formula 3f is a group represented by Formula 4a:

4a

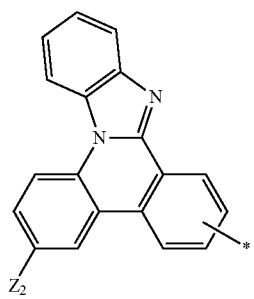

wherein in Formula 4a, $Z_2$ is a hydrogen atom or a naphthyl group, and * is a binding site to a corresponding $L_4$ to $L_6$ or to a corresponding atom of Formula 5.

114

18. An organic light-emitting device comprising:
a first electrode;
a second electrode; and
an organic layer between the first electrode and the second electrode,
wherein the organic layer comprises:
an emission layer comprising one of compounds 2 to 5, 7-40, 42, 43, 45-84, 86-95, 97-109, and 111-116:

2

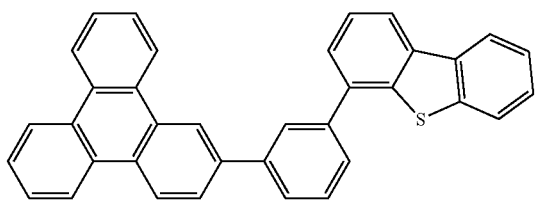

3

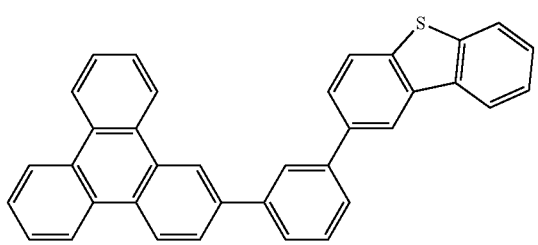

4

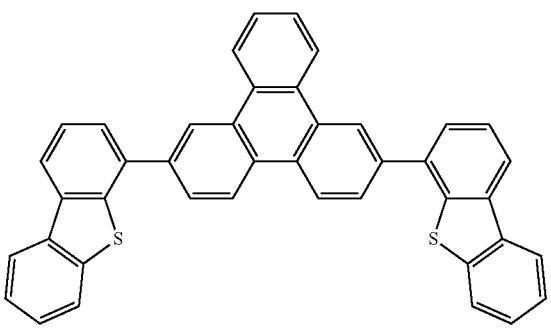

5

7
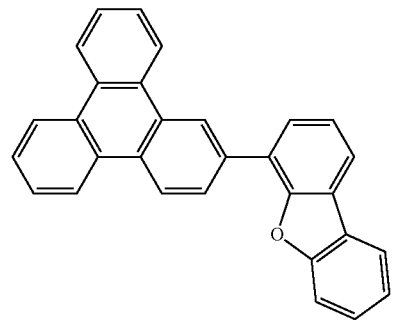
8
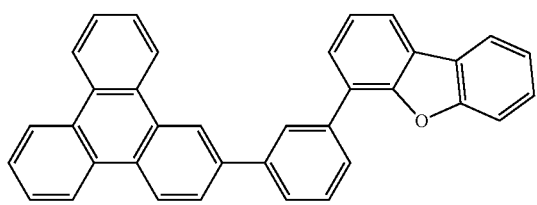
9
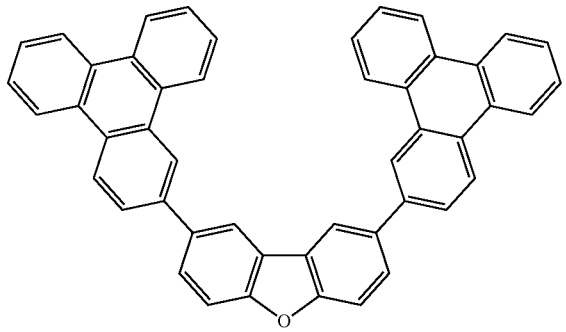
10
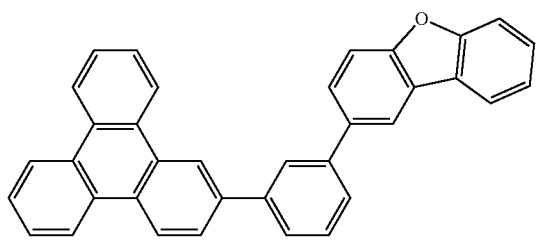
11
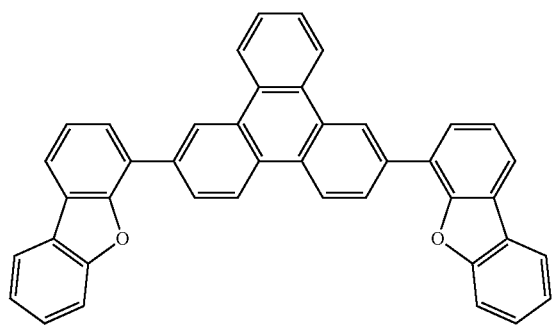
12
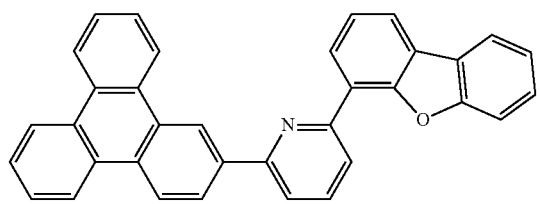
13
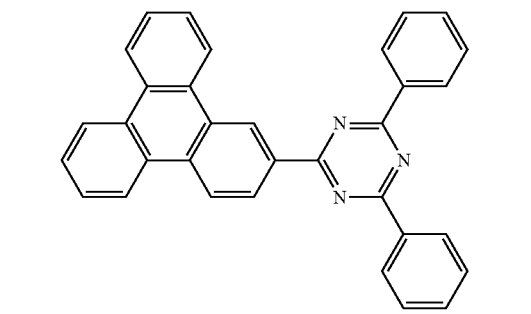
14
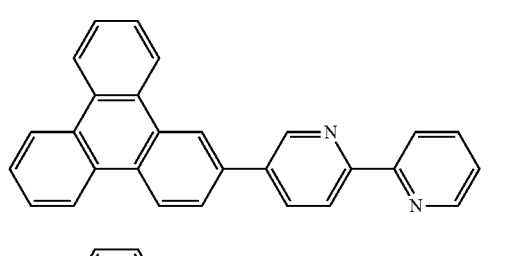
15
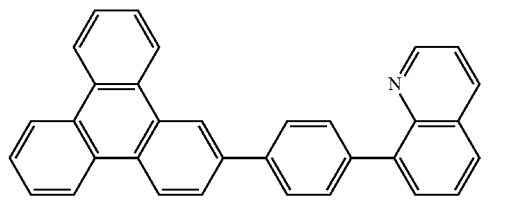
16
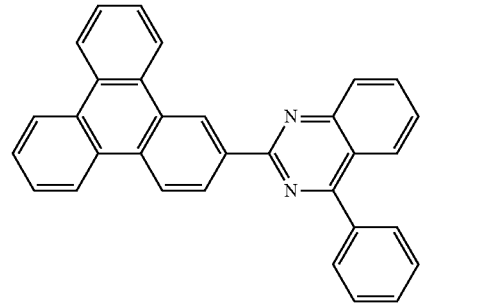
17
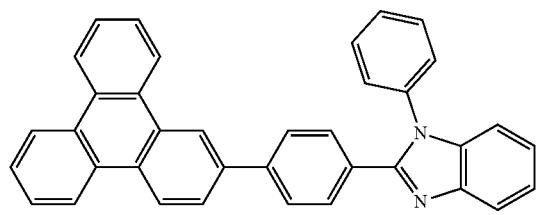

117
-continued
18
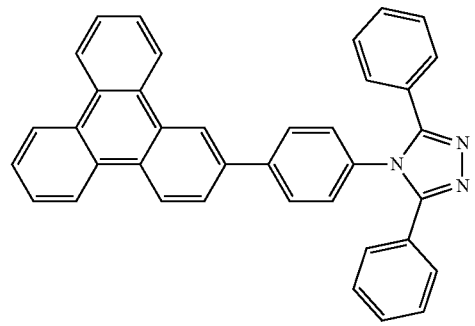
19
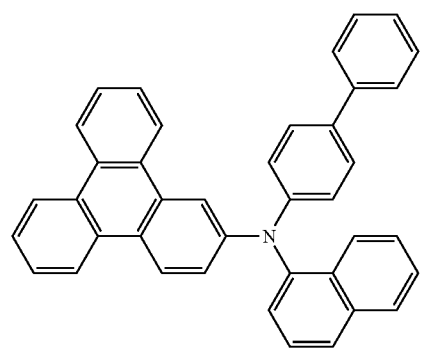
20
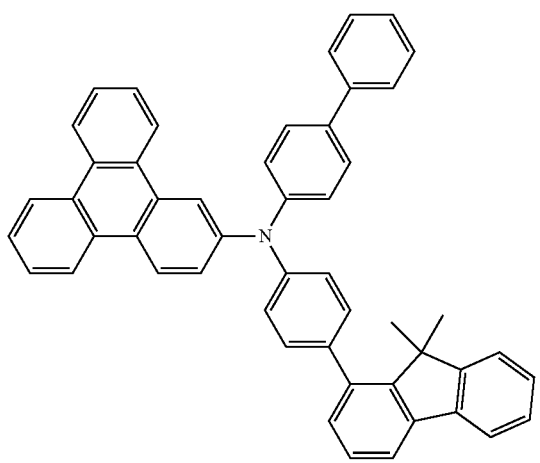
21
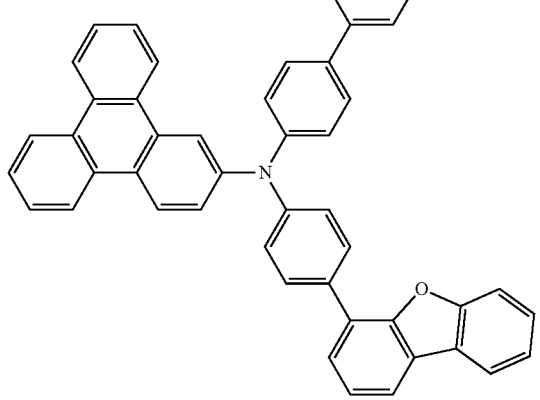
118
-continued
22
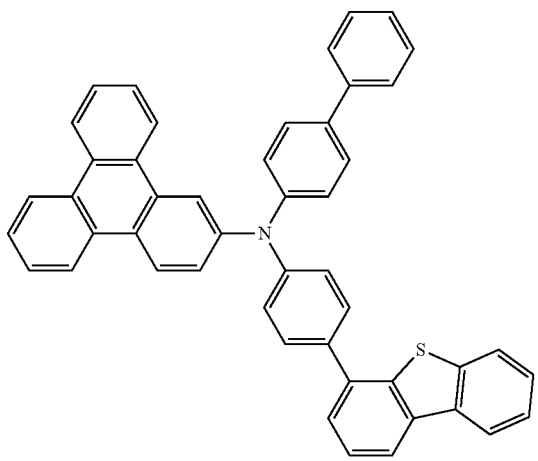
23
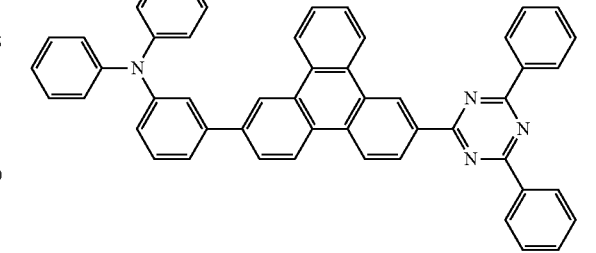
24
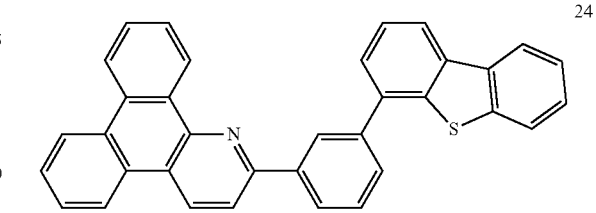
25
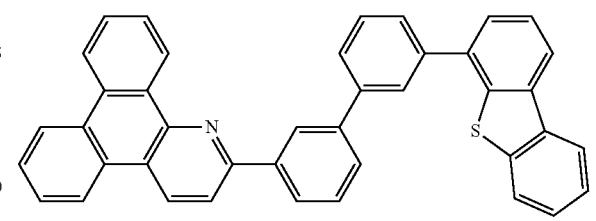
26
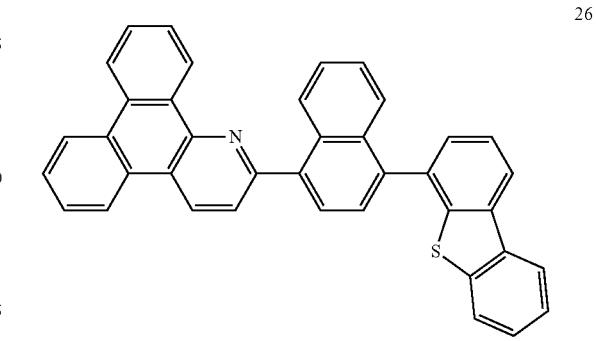

119
-continued
27
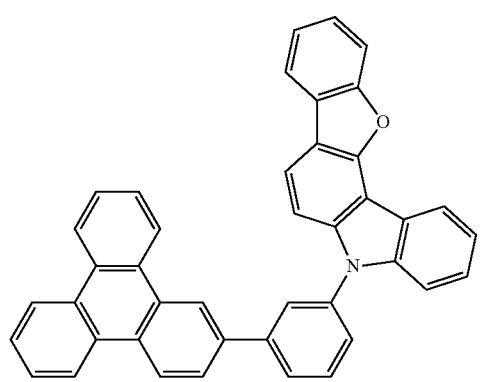
28
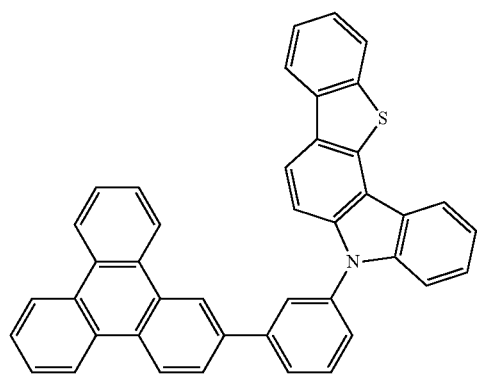
29
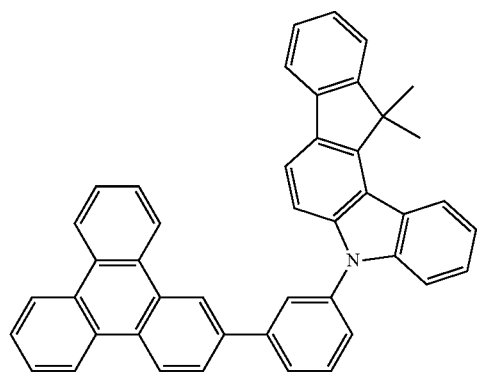
30
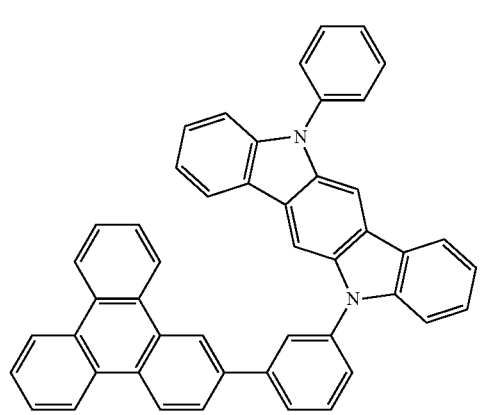
120
-continued
31
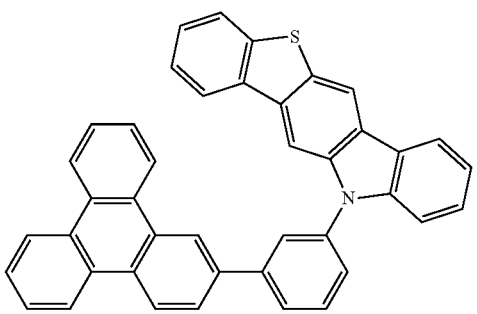
32
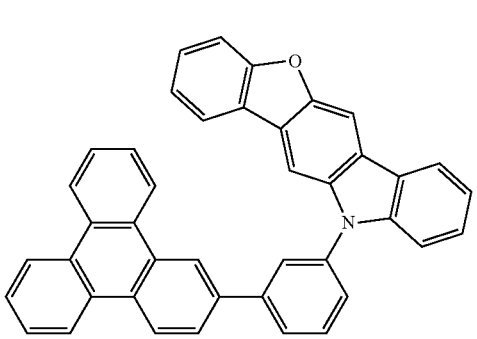
33
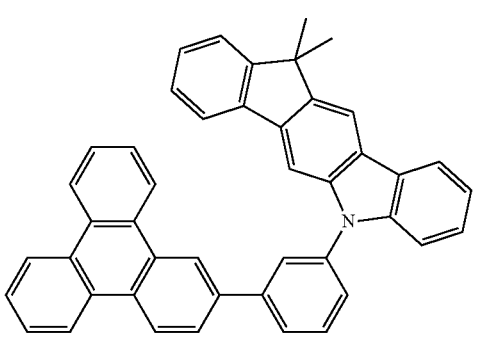
34
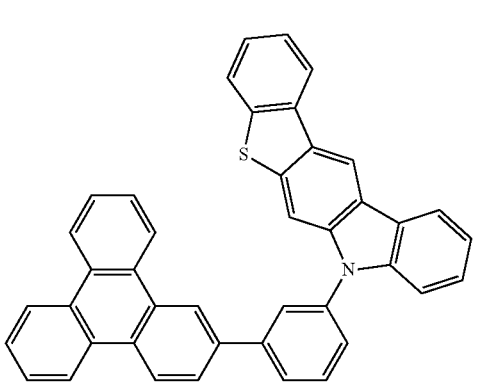

121
-continued
35
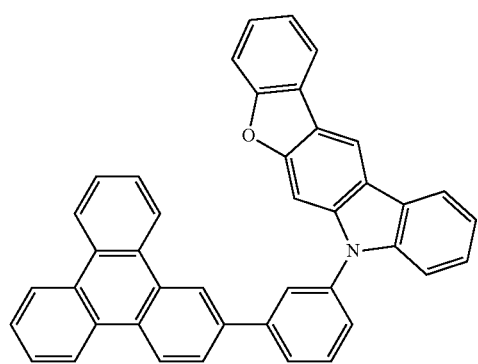
36
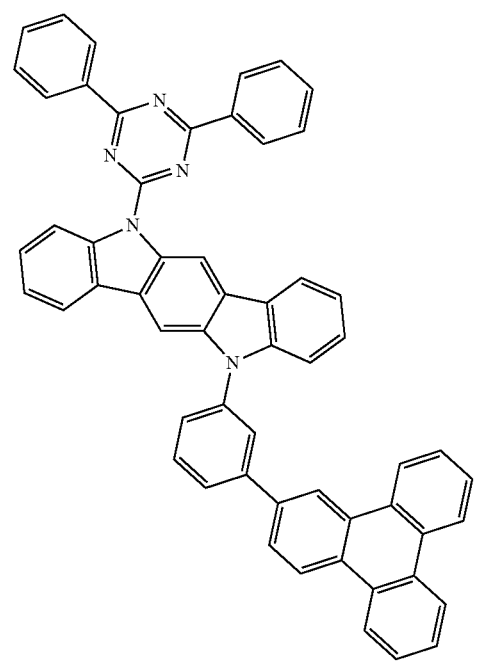
37
122
-continued
38
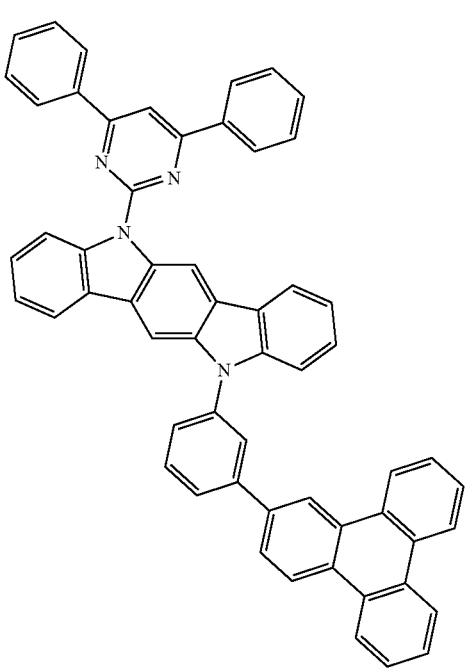
39
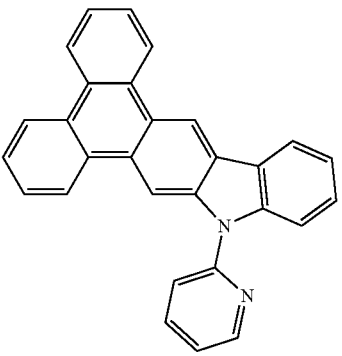
40
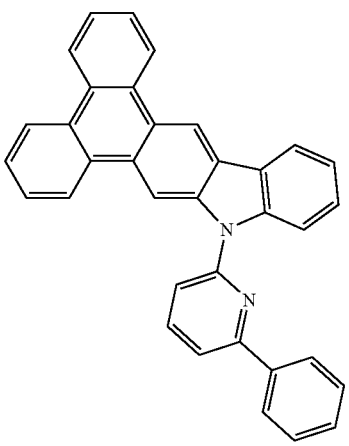

123
-continued
42
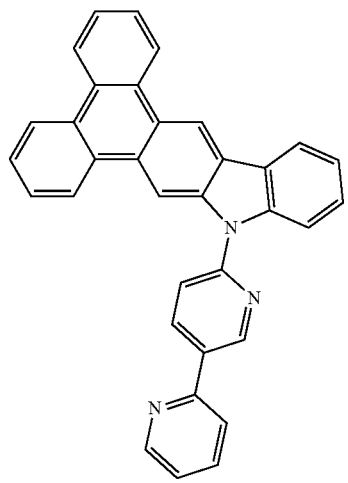
43
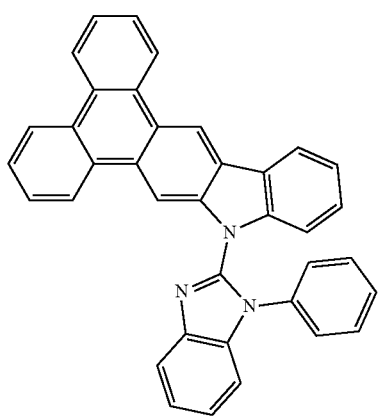
45
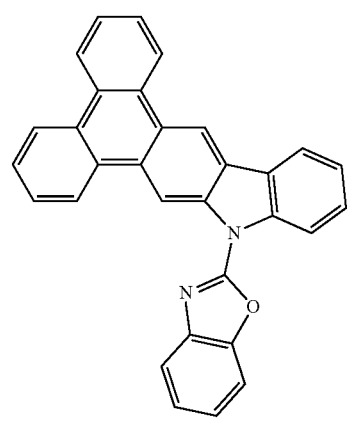
124
-continued
46
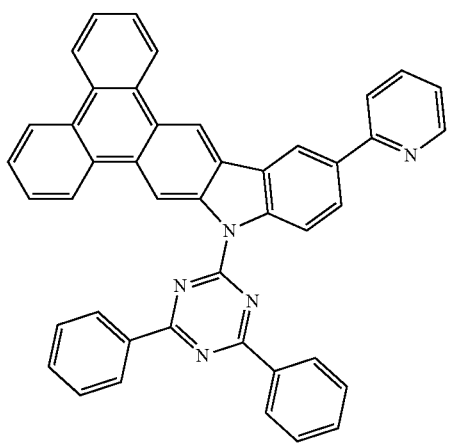
47
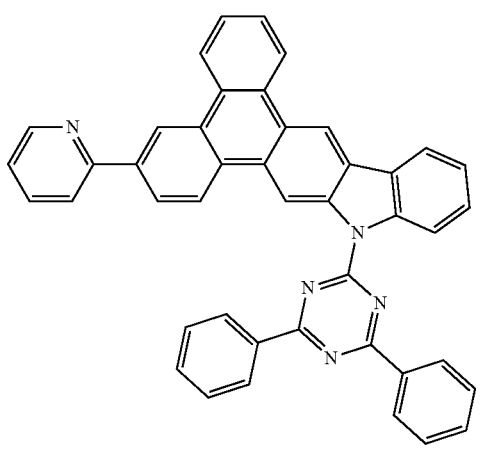
48
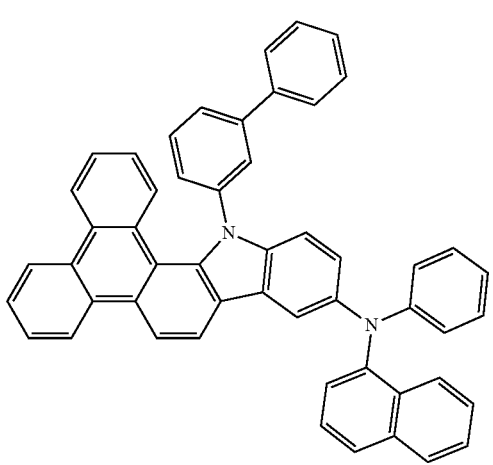

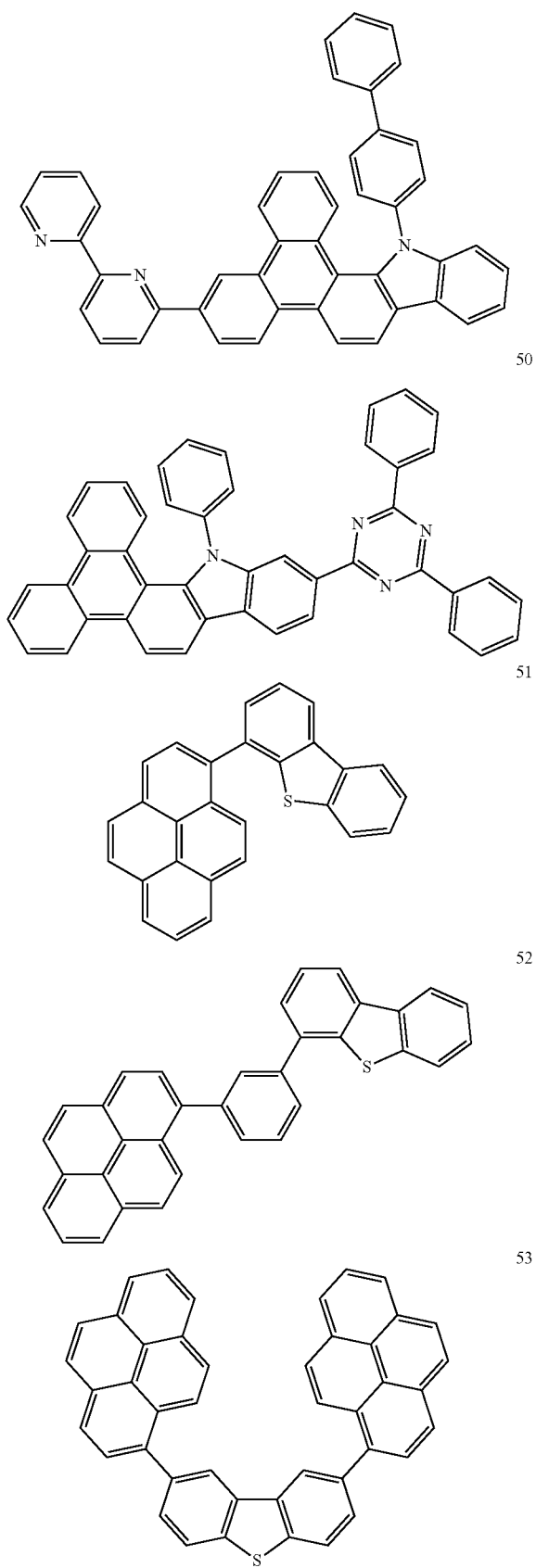
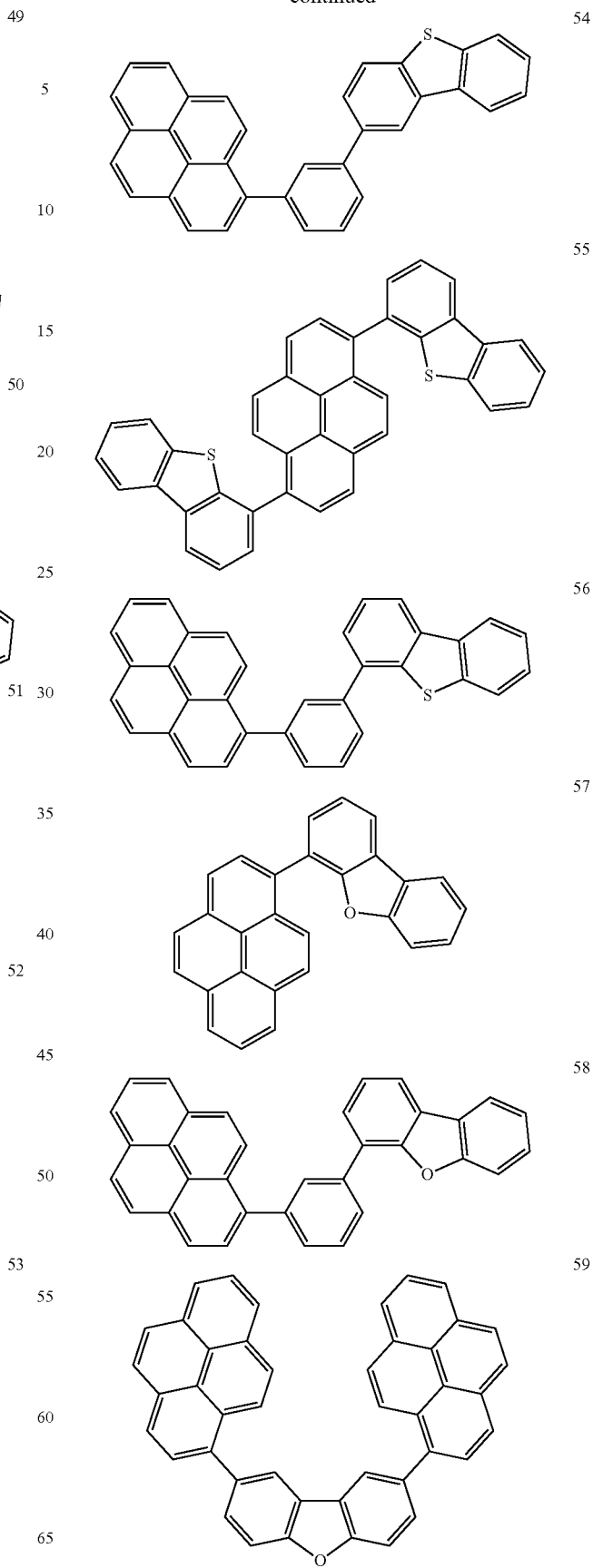

-continued
60
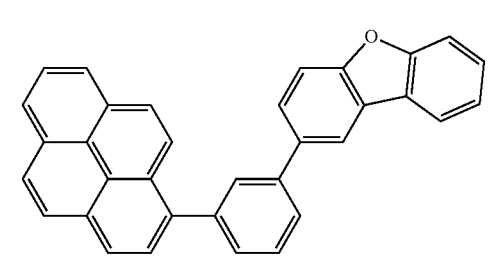
61
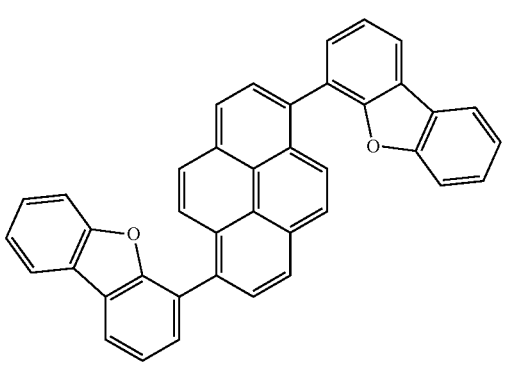
62
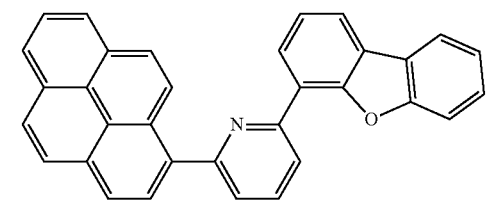
63
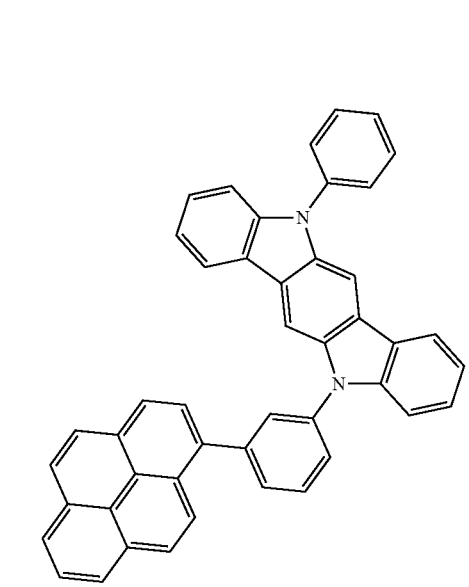
-continued
64
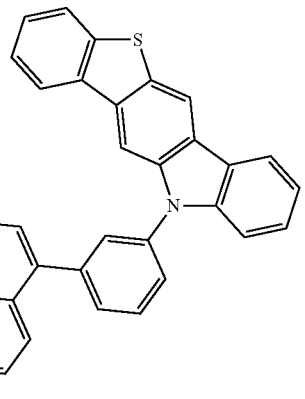
65
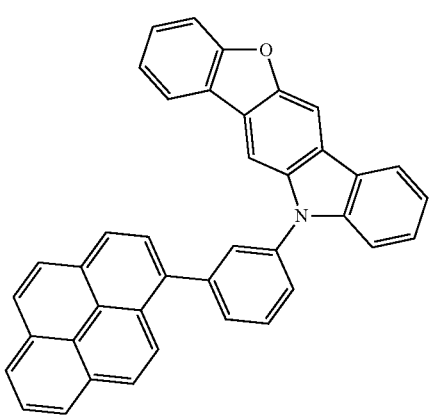
66
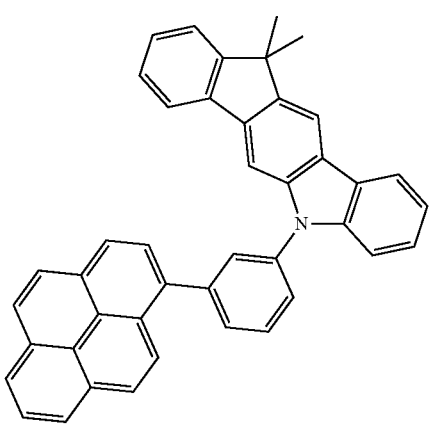

67
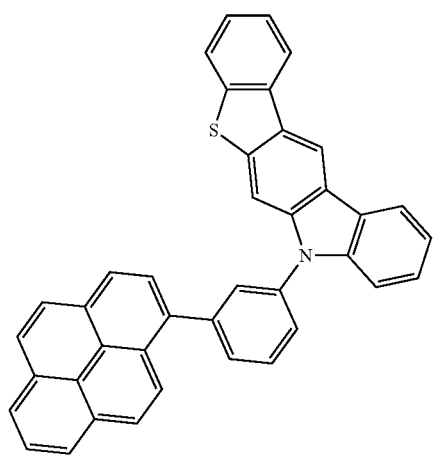
68
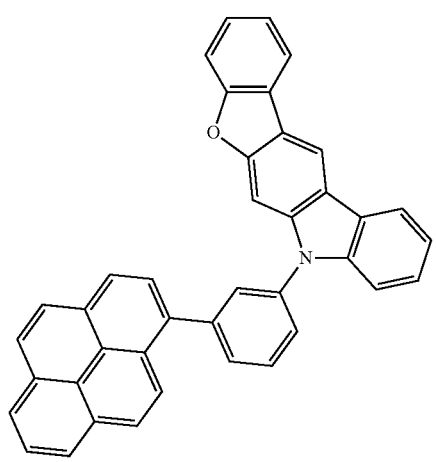
69
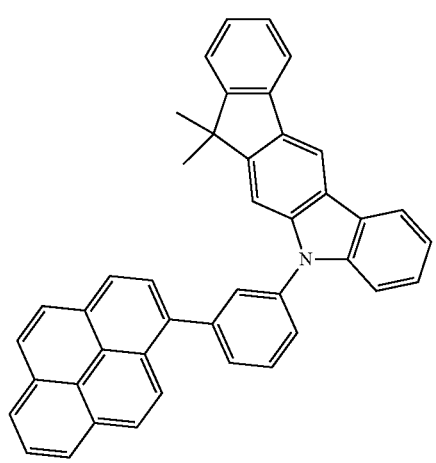
70
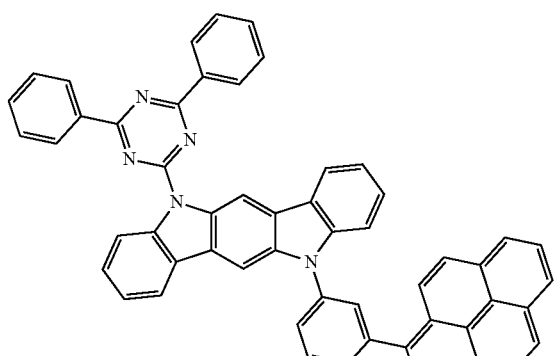
71
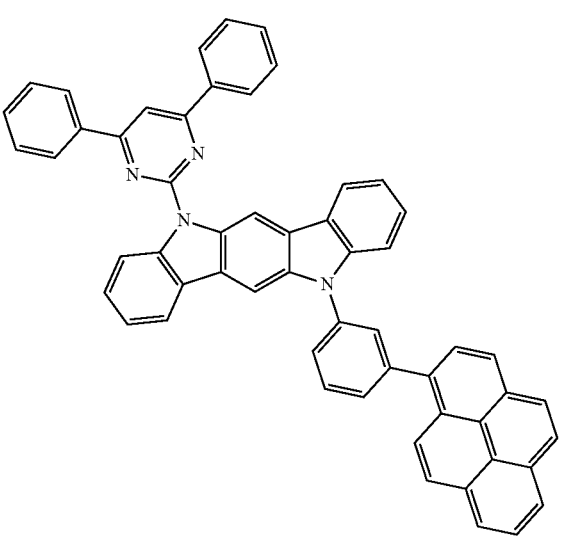
72
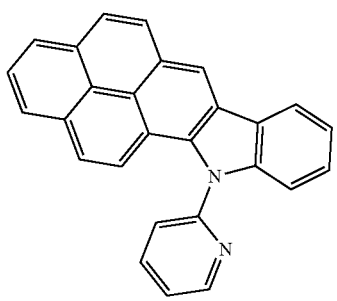
73
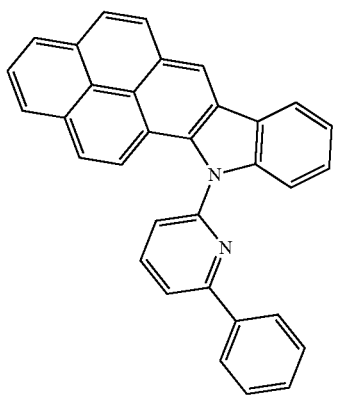

131
-continued
74
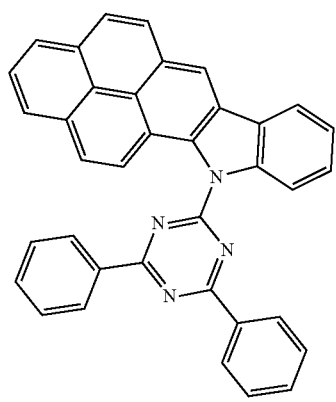
75
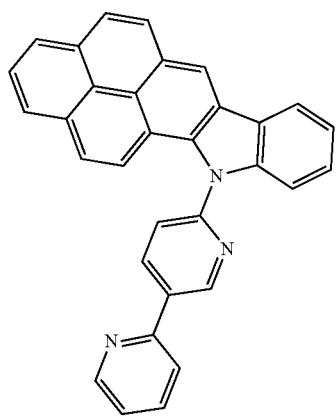
76
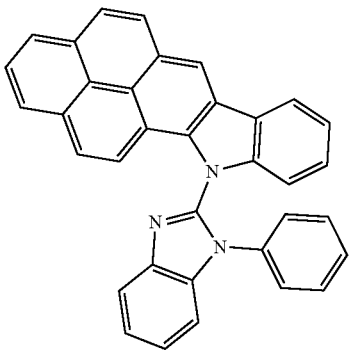
77
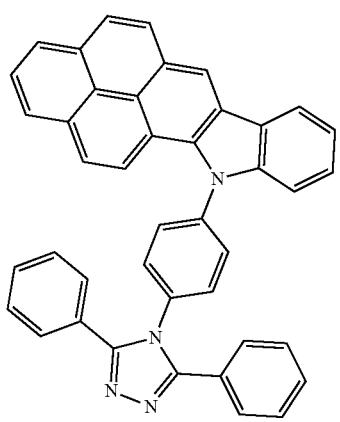
132
-continued
78
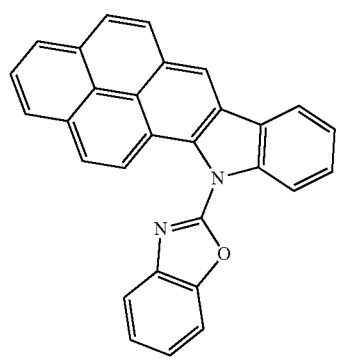
79
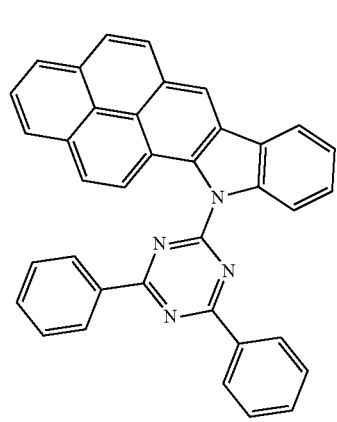
80
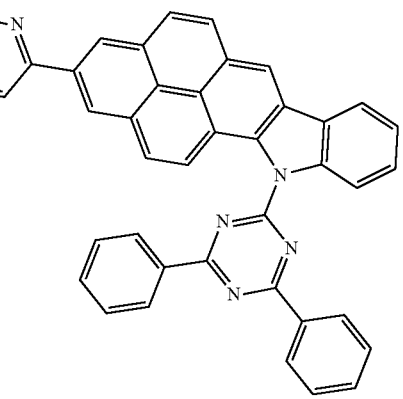
81
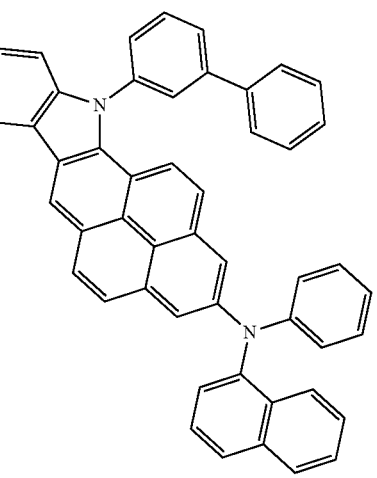

82
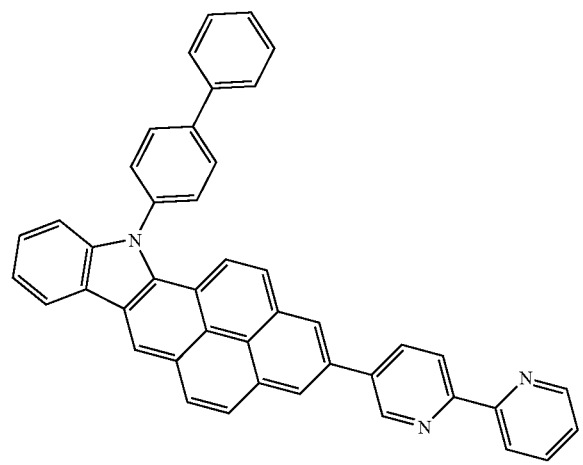
83
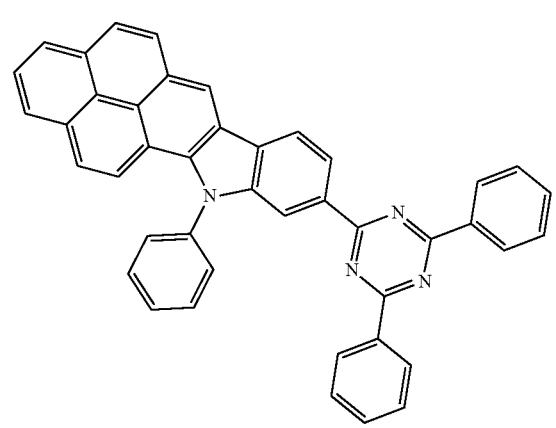
84
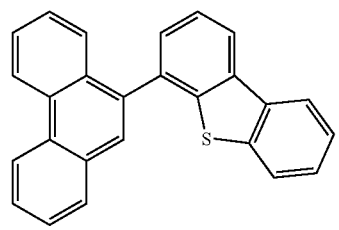
86
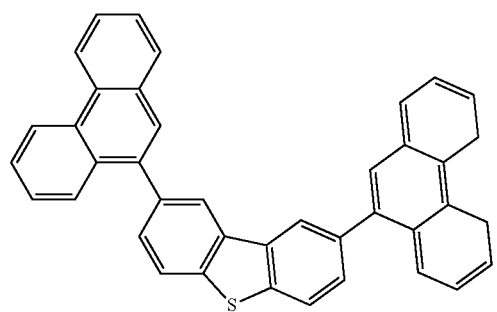
87
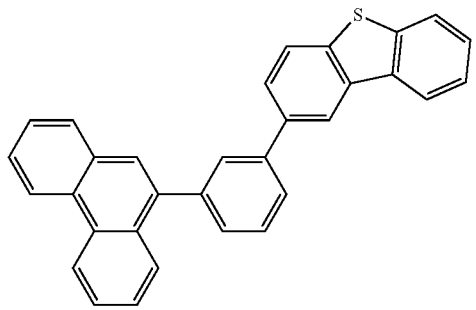
88
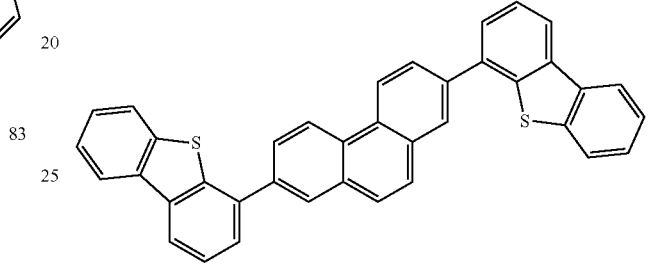
89
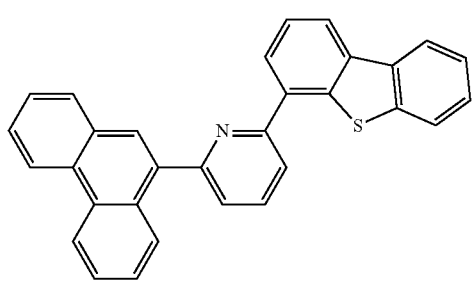
90
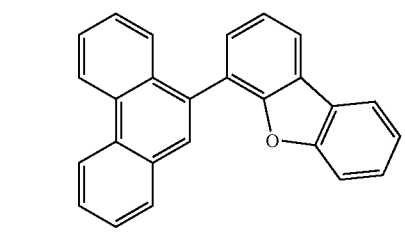
91
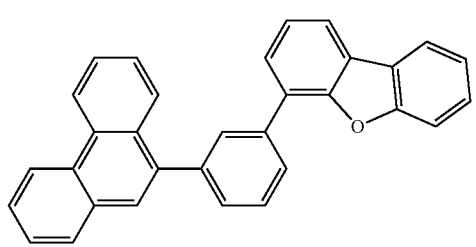

92
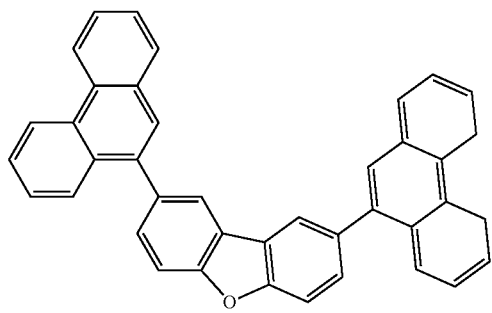
93
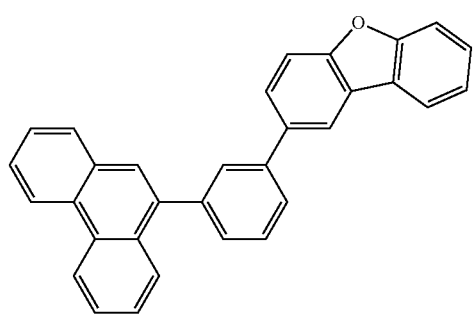
94
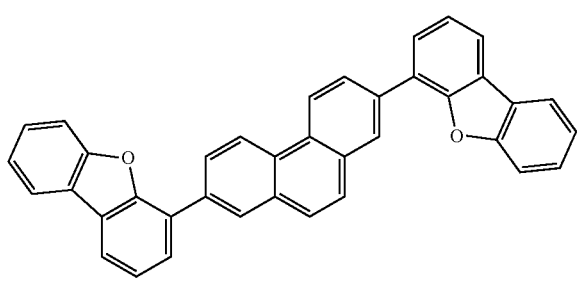
95
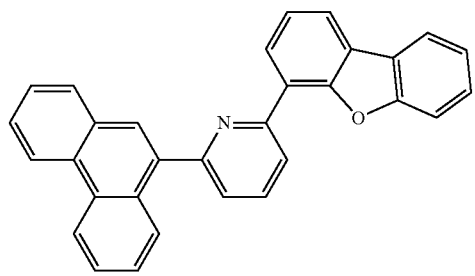
97
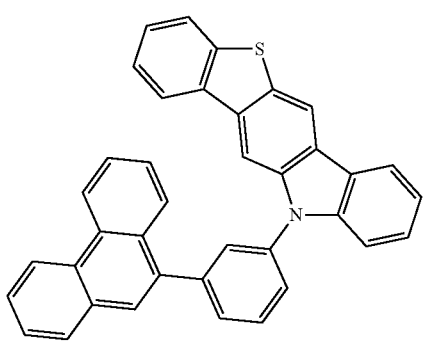
98
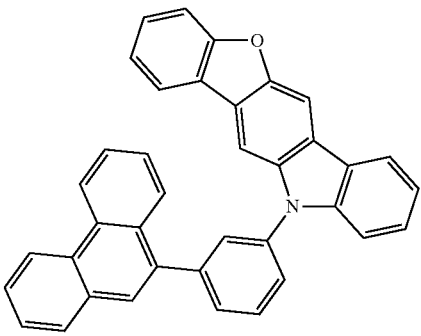
99
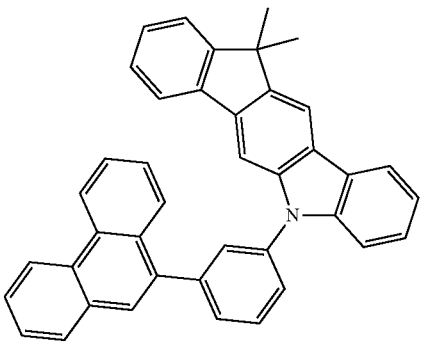
100
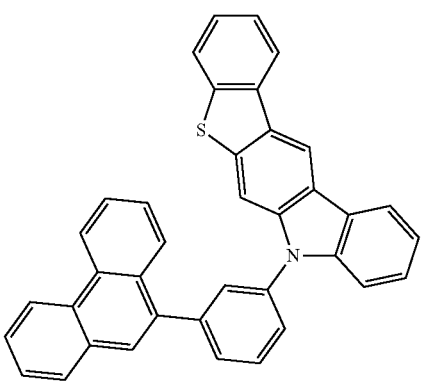
101
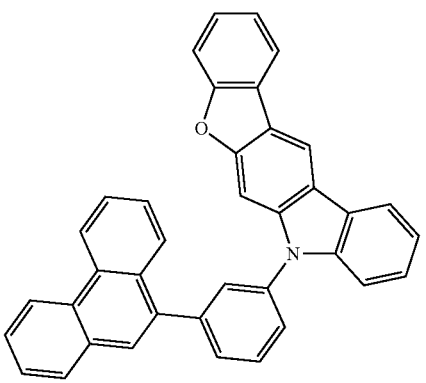

102
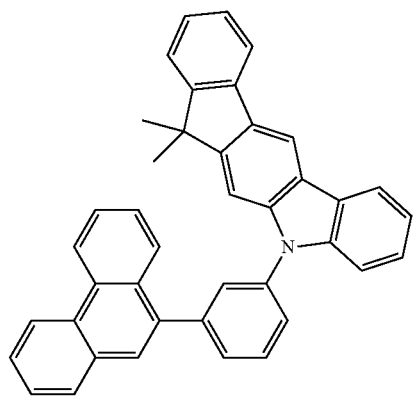
103
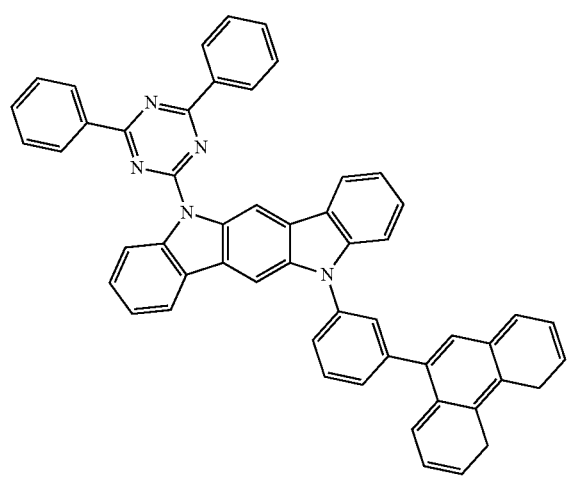
104
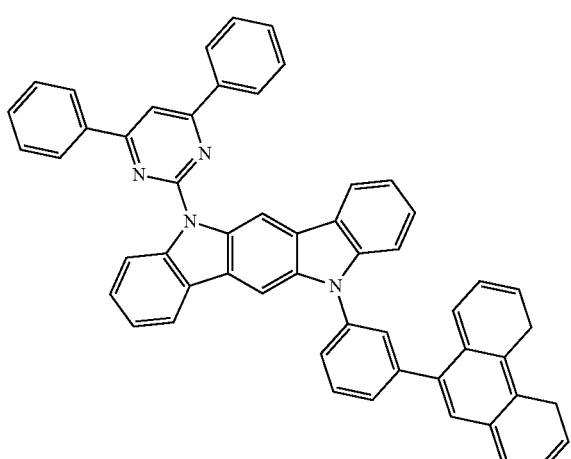
105
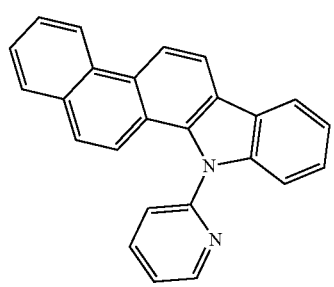
106
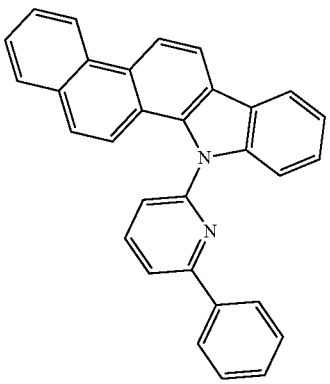
107
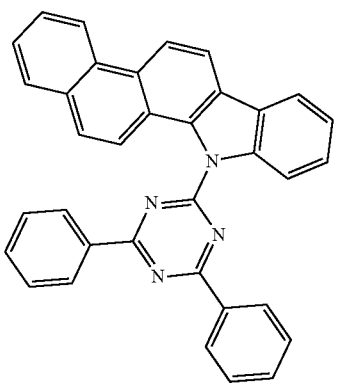
108
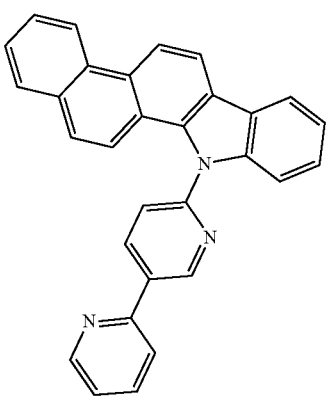
109
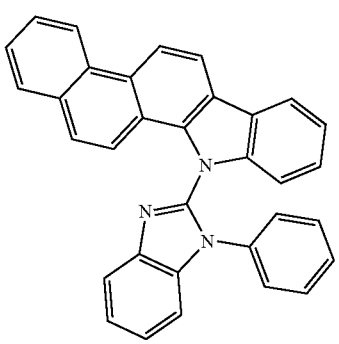

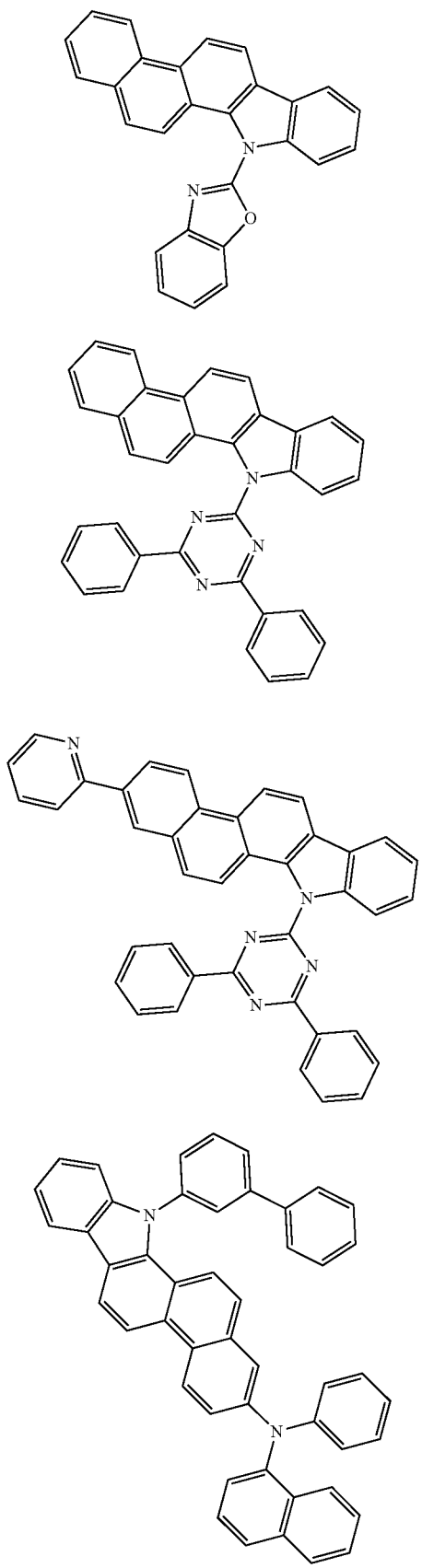
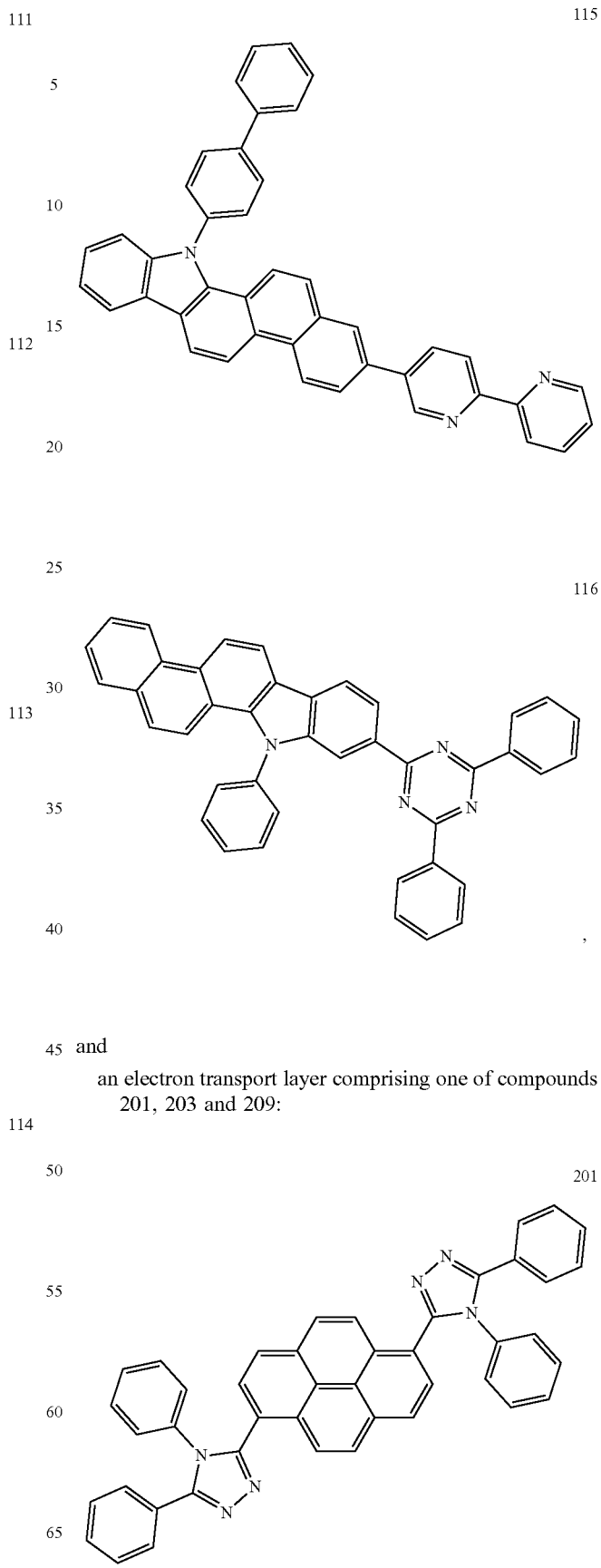
and
an electron transport layer comprising one of compounds 201, 203 and 209:

-continued
203
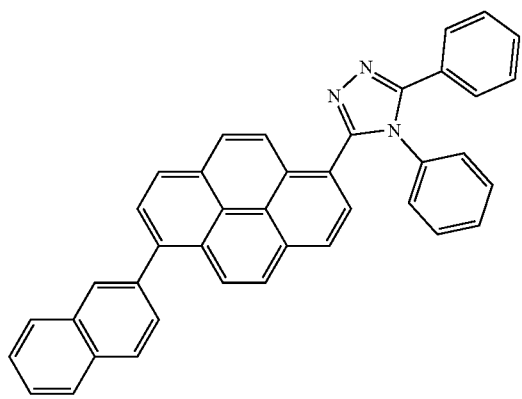
-continued
209
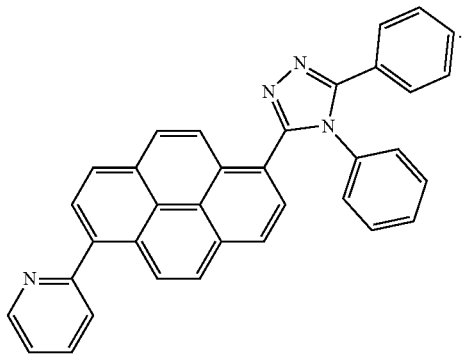
* * * * *